(12) United States Patent
Umebayashi et al.

(10) Patent No.: US 9,917,131 B2
(45) Date of Patent: *Mar. 13, 2018

(54) SEMICONDUCTOR DEVICE, SOLID-STATE IMAGING DEVICE AND ELECTRONIC APPARATUS

(71) Applicant: SONY CORPORATION, Tokyo (JP)

(72) Inventors: Taku Umebayashi, Kanagawa (JP); Keiji Tatani, Kanagawa (JP); Hajime Inoue, Kanagawa (JP); Ryuichi Kanamura, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/403,154

(22) Filed: Jan. 10, 2017

(65) Prior Publication Data

US 2017/0148839 A1    May 25, 2017

Related U.S. Application Data

(63) Continuation of application No. 15/087,894, filed on Mar. 31, 2016, now Pat. No. 9,570,499, which is a
(Continued)

(30) Foreign Application Priority Data

Oct. 18, 2012 (JP) .................................. 2012-230805
Apr. 22, 2013 (JP) .................................. 2013-089580

(51) Int. Cl.
*H01L 27/146* (2006.01)
*H01L 31/024* (2014.01)
*H01L 23/488* (2006.01)

(52) U.S. Cl.
CPC .... *H01L 27/14645* (2013.01); *H01L 27/1464* (2013.01); *H01L 27/1469* (2013.01);
(Continued)

(58) Field of Classification Search
CPC ......... H01L 27/14645; H01L 27/14643; H01L 27/14623; H01L 27/14634;
(Continued)

(56) References Cited

U.S. PATENT DOCUMENTS 9,570,499 B2 * 2/2017 Umebayashi ..... H01L 27/14623
2010/0026865 A1 * 2/2010 Tivarus ............. H01L 27/14641
348/308

(Continued)

FOREIGN PATENT DOCUMENTS

JP   2009-176777   8/2009
JP   2011-096851   5/2011
(Continued)

OTHER PUBLICATIONS

Official Action (no English translation available) for Japanese Patent Application No. 2013-089580 dated Jan. 26, 2017, 18 pages.
(Continued)

*Primary Examiner* — Dao H Nguyen
(74) *Attorney, Agent, or Firm* — Sheridan Ross, P.C.

(57) ABSTRACT

A semiconductor device including a first semiconductor section including a first wiring layer at one side thereof, the first semiconductor section further including a photodiode, a second semiconductor section including a second wiring layer at one side thereof, the first and second semiconductor sections being secured together, a third semiconductor section including a third wiring layer at one side thereof, the second and the third semiconductor sections being secured together such the first semiconductor section, second semiconductor section, and the third semiconductor section are stacked together, and a first conductive material electrically connecting at least two of (i) the first wiring layer, (ii) the
(Continued)

second wiring layer, and (iii) the third wiring layer such that the electrically connected wiring layers are in electrical communication.

26 Claims, 44 Drawing Sheets

Related U.S. Application Data continuation of application No. 14/434,288, filed as application No. PCT/JP2013/006055 on Oct. 10, 2013, now Pat. No. 9,431,450.

(52) U.S. Cl.
CPC .. *H01L 27/14612* (2013.01); *H01L 27/14621* (2013.01); *H01L 27/14623* (2013.01); *H01L 27/14627* (2013.01); *H01L 27/14634* (2013.01); *H01L 27/14636* (2013.01)

(58) Field of Classification Search
CPC ........... H01L 27/14636; H01L 27/1464; H01L 27/14612; H01L 27/14621; H01L 27/14627
USPC ............... 257/292, 432, 443, 446, 459, 460, 257/E27.132, E27.133, E27.134, E27.13, 257/E31.113, E31.127, E31.128, E21.499, 257/E21.521, E21.585; 438/64, 66, 652, 438/666
See application file for complete search history.

(56) References Cited

U.S. PATENT DOCUMENTS

| | | | |
|---|---|---|---|
| 2011/0049336 A1* | 3/2011 | Matsunuma | H01L 27/14609 250/214.1 |
| 2012/0056288 A1* | 3/2012 | Yoshihara | H01L 23/49805 257/431 |
| 2012/0241981 A1* | 9/2012 | Hirano | H01L 23/522 257/777 |

FOREIGN PATENT DOCUMENTS

| | | |
|---|---|---|
| JP | 2012-015278 | 1/2012 |
| JP | 2012-054450 | 3/2012 |
| JP | 2012-064709 | 3/2012 |
| TW | 200803484 | 1/2008 |
| WO | WO 2006/129762 | 12/2006 |

OTHER PUBLICATIONS

Official Action (with English translation) for Chinese Patent Application No. 201380053203.0 dated Jan. 23, 2017, 19 pages.
Official Action (no English translation available) for Japanese Patent Application No. 2013-089580 dated Apr. 4, 2017, 5 pages.
Official Action for European Patent Application No. 13780221.1 dated Nov. 23, 2017, 8 pages.

* cited by examiner

FIG. 41

| ARRANGEMENT POSITION OF ALUMINIUM PAD | ELECTRICAL CONNECTION BETWEEN FIRST SEMICONDUCTOR SUBSTRATE AND SECOND SEMICONDUCTOR SUBSTRATE | ELECTRICAL CONNECTION BETWEEN SECOND SEMICONDUCTOR SUBSTRATE AND THIRD SEMICONDUCTOR SUBSTRATE |
|---|---|---|
| IN MULTILAYER WIRE LAYER OF FIRST SEMICONDUCTOR SUBSTRATE | TWIN CONTACT | TWIN CONTACT |
| | | SHARED CONTACT |
| | | DIRECT BONDING |
| | SHARED CONTACT | SHARED CONTACT |
| | | DIRECT BONDING |
| | DIRECT BONDING | DIRECT BONDING |
| IN MULTILAYER WIRE LAYER OF SECOND SEMICONDUCTOR SUBSTRATE | TWIN CONTACT | TWIN CONTACT |
| | | SHARED CONTACT |
| | | DIRECT BONDING |
| | SHARED CONTACT | SHARED CONTACT |
| | | DIRECT BONDING |
| | DIRECT BONDING | DIRECT BONDING |
| INSULATING FILM LAYER | TWIN CONTACT | TWIN CONTACT |
| | | SHARED CONTACT |
| | | DIRECT BONDING |
| | SHARED CONTACT | SHARED CONTACT |
| | | DIRECT BONDING |
| | DIRECT BONDING | DIRECT BONDING |

SEMICONDUCTOR DEVICE, SOLID-STATE IMAGING DEVICE AND ELECTRONIC APPARATUS

CROSS-REFERENCE TO RELATED APPLICATIONS

This application is a continuation of U.S. patent application Ser. No. 15/087,894, filed Mar. 31, 2016, which is a continuation of U.S. patent application Ser. No. 14/434,288, filed Apr. 8, 2015, now U.S. Pat. No. 9,431,450, which is a national stage application under 35 U.S.C. 371 and claims the benefit of PCT Application No. PCT/JP2013/006055, filed Oct. 10, 2013, which claims priority to Japanese Patent Application Nos. JP 2012-230805 and JP 2013-089580, filed in the Japan Patent Office on Oct. 18, 2012, and Apr. 22, 2013, respectively, the entire disclosures of which are hereby incorporated herein by reference.

TECHNICAL FIELD

The present technology relates to a solid-state imaging device, and particularly to a solid-state imaging device capable of easily providing a high-quality stacked image sensor.

BACKGROUND ART

As solid-state imaging devices, there is an amplification type solid-state imaging device represented by a MOS type image sensor such as a complementary metal oxide semiconductor (CMOS). In addition, there is a charge transfer type solid-state imaging device represented by a charge coupled device (CCD) image sensor.

These solid-state imaging devices are frequently used in digital still cameras, digital video cameras, and the like. In recent years, as solid-state imaging devices have been mounted in mobile apparatuses, such as mobile phones and personal digital assistants (PDAs) with cameras, a MOS type image sensor has been frequently used from the viewpoint of having a low power supply voltage, low power consumption, and the like.

The MOS type solid-state imaging device includes a pixel array (pixel region) in which a plurality of unit pixels are arranged in a two-dimensional array form and a peripheral circuit region, and each of the unit pixels includes a photo diode which is a photoelectric conversion portion and a plurality of pixel transistors. A plurality of pixel transistors are formed of MOS transistors, and generally comprise three transistors including a transfer transistor, a reset transistor, an amplification transistor, or four transistors additionally including a selection transistor.

In addition, in the above-described solid-state imaging device, a stacked structure has been proposed in which a plurality of semiconductor substrates having different functions are stacked in an overlapping manner and are electrically connected to each other.

In the stacked structure, since each circuit can be formed optimally so as to correspond to the function of each semiconductor substrate, it is possible to easily realize high performance of a device.

For example, it is possible to manufacture a high performance solid-state imaging device by optimally forming a sensor circuit and a logical circuit so as to correspond to respective functions of a semiconductor substrate including the sensor circuit and a semiconductor substrate including the logical circuit in which a circuit processing signal is provided. At this time, through electrodes are provided in substrates of the semiconductor substrates, and thereby the plurality of semiconductor substrates are electrically connected to each other.

However, if a semiconductor device is formed by connecting different substrates to each other by using a connection conductor which penetrates through a substrate, it is necessary to form a connection hole while maintaining insulation in the deep substrate, and thus a practical use is difficult from the viewpoint of economic costs of a manufacturing process which is necessary in creating the connection hole and embedding the connection conductor.

On the other hand, for example, if a small contact hole of about 1 micrometer is to be formed, it is necessary to thin an upper substrate to the utmost limit. In this case, complex steps such as, attaching the upper substrate to a support substrate before being thinned and an increase in costs may result. In addition, in order to embed a connection conductor in a connection hole with a high aspect ratio, a CVD film having a good coatability property, such as tungsten (W), is necessarily used as a connection conductor, and thus materials to be used as a connection conductor may be limited.

Therefore, a manufacturing method of a semiconductor device such as a solid-state imaging device has been proposed which achieves a high performance by sufficiently exhibiting each performance, mass productivity, and a reduction in costs (for example, refer to PTL 1).

PTL 1 has proposed a stacked structure in which a support substrate of a rear surface type image sensor is stacked as a logical circuit, and a plurality of connection contacts are provided from the top by using a thinning step of the image sensor.

CITATION LIST

Patent Literature

[PTL 1]
Japanese Unexamined Patent Application Publication No. 2010-245506

SUMMARY OF INVENTION

Technical Problem

It is desirable to easily provide a high-quality stacked image sensor.

Solution to Problem

In accordance with at least one embodiment of the present invention, a semiconductor device is provided, the semiconductor device comprising a first semiconductor section including a first wiring layer at one side thereof, the first semiconductor section further including a photodiode, a second semiconductor section including a second wiring layer at one side thereof, the first and second semiconductor sections being secured together, a third semiconductor section including a third wiring layer at one side thereof, the second and the third semiconductor sections being secured together such the first semiconductor section, second semiconductor section, and the third semiconductor section are stacked together, and a first conductive material electrically connecting at least two of (i) the first wiring layer, (ii) the second wiring layer, and (iii) the third wiring layer such that the electrically connected wiring layers are in electrical communication.

In accordance with at least one embodiment of the present invention, a backside illumination type solid-state imaging device is provided, the solid-state imaging device comprising a first semiconductor section including a first wiring layer at one side thereof, the first semiconductor section further including a circuit region and a pixel region, a second semiconductor section including a second wiring layer at one side thereof, the first and second semiconductor sections being secured together, a third semiconductor section including a third wiring layer at one side thereof, the second and the third semiconductor sections being secured together such the first semiconductor section, second semiconductor section, and the third semiconductor section are stacked together, and a first conductive material electrically connecting at least two of (i) the first wiring layer, (ii) the second wiring layer, and (iii) the third wiring layer such that the electrically connected wiring layers are in electrical communication.

In accordance with at least one embodiment of the present invention, an electronic apparatus is provided, the electronic apparatus comprising an optical unit, and a solid-state imaging device, the solid state image device including a first semiconductor section including a first wiring layer at one side thereof, the first semiconductor section further including a circuit region and a pixel region, a second semiconductor section including a second wiring layer at one side thereof, the first and second semiconductor sections being secured together, a third semiconductor section including a third wiring layer at one side thereof, the second and the third semiconductor sections being secured together such the first semiconductor section, second semiconductor section, and the third semiconductor section are stacked together, and a first conductive material electrically connecting at least two of (i) the first wiring layer, (ii) the second wiring layer, and (iii) the third wiring layer such that the electrically connected wiring layers are in electrical communication.

Other systems, methods, features, and advantages of the present invention will be or will become apparent to one with skill in the art upon examination of the following figures and detailed description. It is intended that all such additional systems, methods, features, and advantages be within this description, be within the scope of the invention, and be protected by the accompanying claims.

Advantageous Effects of the Invention

According to the present technology, it is possible to easily provide a high-quality stacked image sensor.

BRIEF DESCRIPTION OF DRAWINGS

FIG. 41 is a diagram illustrating a combination of configurations which may be employed as an embodiment of a solid-state imaging device to which the present technology is applied.

DESCRIPTION OF EMBODIMENTS

Hereinafter, embodiments of the technology disclosed herein will be described with reference to the drawings.

First, problems of the related art will be described.

As solid-state imaging devices, there is an amplification type solid-state imaging device represented by a MOS type image sensor such as a complementary metal oxide semiconductor (CMOS). In addition, there is a charge transfer type solid-state imaging device represented by a charge coupled device (CCD).

These solid-state imaging devices are frequently used in digital still cameras, digital video cameras, and the like. In recent years, as solid-state imaging devices have been mounted in mobile apparatuses such as, mobile phones and personal digital assistants (PDAs) with cameras, a MOS type image sensor has been frequently used from the viewpoint of a low power supply voltage, power consumption, and the like.

The MOS type solid-state imaging device includes a pixel array (pixel region) in which a plurality of unit pixels are arranged in a two-dimensional array and a peripheral circuit region, and each of the unit pixels includes a photo diode which is a photoelectric conversion portion and a plurality of pixel transistors. A plurality of pixel transistors are formed of MOS transistors, and generally comprise three transistors including a transfer transistor, a reset transistor, an amplification transistor, or four transistors additionally including a selection transistor.

In addition, in the above-described solid-state imaging device, a stacked structure has been proposed in which a plurality of semiconductor substrates having different functions are stacked in an overlapping manner and are electrically connected to each other.

In the stacked structure, since each circuit can be formed optimally so as to correspond to the function of each semiconductor substrate, it is possible to easily realize high performance of a device.

For example, it is possible to manufacture a high performance solid-state imaging device by optimally forming a sensor circuit and a logical circuit so as to correspond to respective functions of a semiconductor substrate including the sensor circuit and a semiconductor substrate including the logical circuit in which a circuit processing signals is provided. At this time, through electrodes are provided in substrates of the semiconductor substrates, and thereby the plurality of semiconductor substrates are electrically connected to each other.

Figure 1:
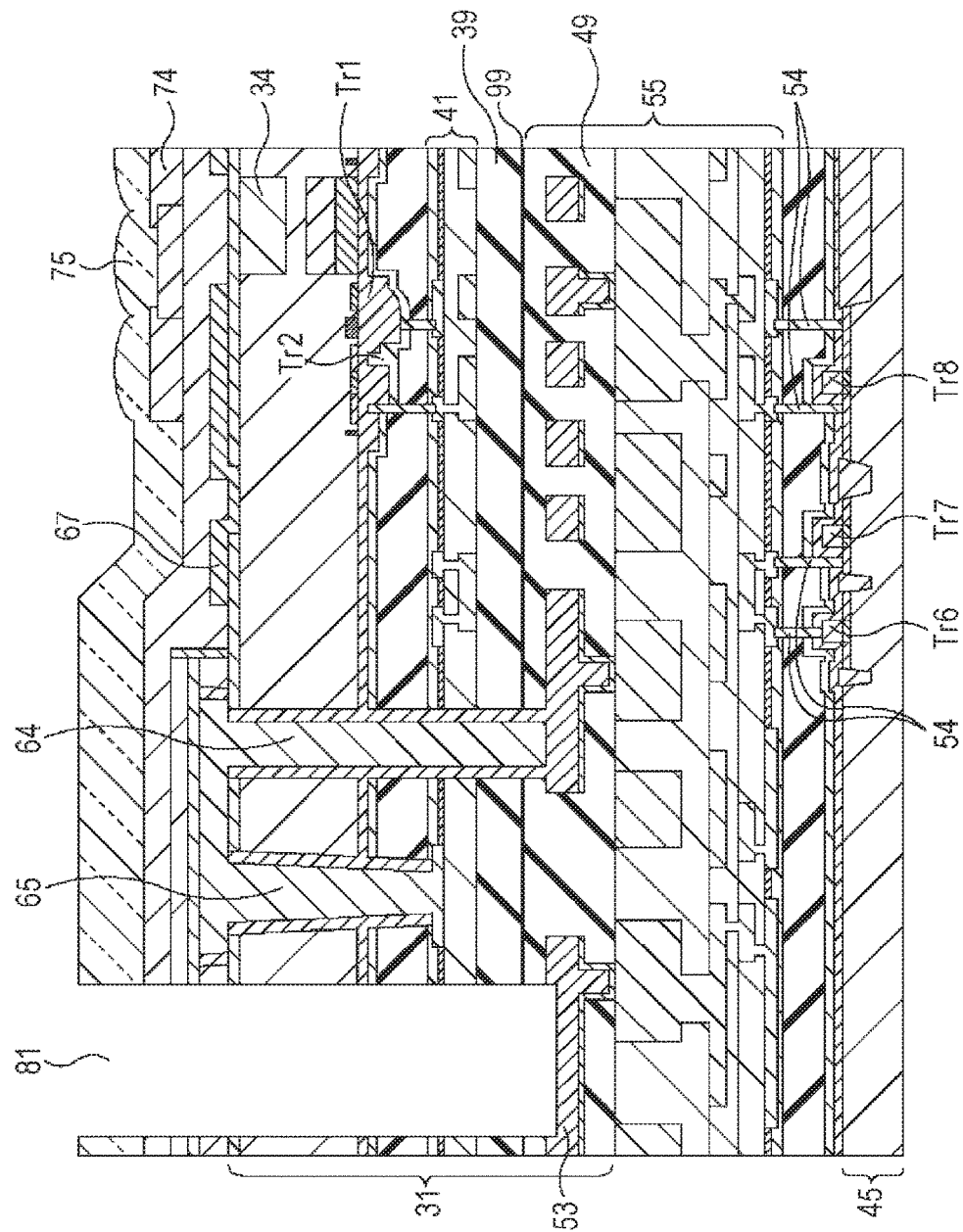
FIG. 1 is a cross-sectional view illustrating a configuration of a pixel portion of a stacked solid-state imaging device in the related art.

FIG. 1 is a cross-sectional view illustrating a configuration of a pixel portion of a stacked solid-state imaging device in the related art.

A solid-state imaging device related to this pixel portion includes a rear surface irradiation type CMOS image sensor which is formed by stacking a first semiconductor substrate and a second semiconductor substrate. In other words, the solid-state imaging device shown in FIG. 1 has a two-layer stacked structure.

As shown in FIG. 1, an image sensor, that is, a pixel array (hereinafter, referred to as a pixel region) and a control region is formed in each region of the first semiconductor substrate 31.

That is, a photodiode (PD) 34 which is a photoelectric conversion portion of each pixel is formed in each region of the semiconductor substrate (for example, a silicon substrate) 31, and a source/drain region of each pixel transistor is formed in a semiconductor well region thereof.

A gate electrode is formed on a substrate surface forming the pixel via a gate insulating film, and a pixel transistor Tr1 and a pixel transistor Tr2 are formed by the gate electrode and the source/drain region corresponding thereto.

The pixel transistor Tr1 adjacent to the photodiode (PD) 34 corresponds to a transfer transistor, and the source/drain region corresponds to a floating diffusion (FD).

Next, an interlayer insulating film 39 of the first layer is formed on the surface of the first semiconductor substrate 31, then a connection hole is formed in the interlayer insulating film 39, and connection conductors which are connected to necessary transistors are formed therein.

Successively, a metal wire of a plurality of layers (in this example, two layers) is formed via the interlayer insulating film 39 so as to be connected to each connection conductor, thereby forming a multilayer wire layer 41. The metal wire is formed of a copper (Cu) wire. Generally, each copper wire (meal wire) is covered with a barrier metal film for preventing diffusion of Cu. For this reason, a protective film which is a cap film of the copper wire is formed on the multilayer wire layer 41.

The first semiconductor substrate 31 having the pixel region and the control region is formed through the steps hitherto.

On the other hand, for example, a logical circuit having a signal processing circuit which controls the pixel region or controls communication with an external device and is related to signal processing is formed in each region of the second semiconductor substrate 45. In other words, a plurality of MOS transistor Tr6, MOS transistor Tr7, and MOS transistor Tr8 which form the logical circuit so as to be separated by element separation regions are formed in a p type semiconductor well region on the front surface side of the semiconductor substrate (for example, a silicon substrate) 45.

Next, an interlayer insulating film 49 of the first layer is formed on the surface of the second semiconductor substrate 45, then a connection hole is formed in the interlayer insulating film 49, and connection conductors 54 which are connected to necessary transistors are formed therein.

Successively, a metal wire of a plurality of layers, in this example, four layers, is formed via the interlayer insulating film 49 so as to be connected to each connection conductor 54, thereby forming a multilayer wire layer 55.

The metal wire is formed of a copper (Cu) wire. A protective film which is a cap film of the copper wire (metal wire) is formed on the multilayer wire layer 55. However, the uppermost layer of the multilayer wire layer 55 is formed of an aluminum pad which may be an electrode.

The second semiconductor substrate 45 having the logical circuit is formed through the steps hitherto.

In addition, the first semiconductor substrate 31 and the second semiconductor substrate 45 are joined to each other such that the multilayer wire layer 41 and the multilayer wire layer 55 face each other at a bonding surface 99. The joining is performed using, for example, plasma bonding and adhesive bonding.

In addition, grinding and polishing are performed from a rear surface 31b side of the first semiconductor substrate 31 so as to thin the first semiconductor substrate 31, and the rear surface of the first semiconductor substrate 31 is a light incident surface in a rear surface irradiation type solid-state imaging device.

Through connection holes, which penetrate through the first semiconductor substrate 31 from the rear surface side and reach the aluminum pad of the uppermost layer of the multilayer wire layer 55 of the second semiconductor substrate 45, are formed at necessary positions of the thinned first semiconductor substrate 31. In addition, a connection hole, which reaches the wire of the first layer of the first semiconductor substrate 31 side from the rear surface side, is formed in the first semiconductor substrate 31 around the through connection hole.

Next, a through connection conductor 64 and a connection conductor 65 are embedded in the through connection holes. The through connection conductor 64 and the connection conductor 65 may use, for example, a metal such as copper (Cu) or tungsten (w).

As described above, since the logical circuit performing signal processing is formed in the second semiconductor substrate 45, it is necessary to input and output signals by connecting electrodes of the respective transistors to signal lines. That is, the logical circuit is operated based on input and output of signals with an external device. Therefore, the aluminum pad 53 of the second semiconductor substrate 45 is an electrode for external connection.

For this reason, a pad hole 81 which penetrates through the first semiconductor substrate 31 is formed so as to be wire-bonded to the aluminum pad 53 of the second semiconductor substrate, thereby exposing the aluminum pad 53.

Next, an insulating protective film is formed on the entire rear surface of the first semiconductor substrate 31 such that a light blocking film 67 is formed in a region which it is necessary to block light from reaching. For example, a metal film such as tungsten may be used as the light blocking film 67.

Successively, a planarized film is formed on the light blocking film 67, on-chip color filters 74 of, for example, red (R), green (G), and blue (B) corresponding to the respective pixels are formed on the planarized film, and an on-chip micro lens 75 is formed thereon.

In addition, the pad hole 81 is formed in the first semiconductor substrate 31 so as to reach the aluminum pad 53 which is an electrode used for transmission, reception, and the like of signals with an external apparatus or circuit, from the rear surface side (light receiving surface side) of the first semiconductor substrate 31.

Thus, the process for the stacked semiconductor structure is completed. In other words, the pixel region and the control region are formed in the first semiconductor substrate 31, and the logical circuit is formed in the second semiconductor substrate 45.

Subsequently, the stacked semiconductor structure is divided into substrates which correspond to a substrate of the rear surface irradiation type solid-state imaging device.

In addition, in the solid-state imaging device with the stacked structure, it is also necessary to take into consideration the influence of noise and the like due to hot carriers. The hot carriers may be high-speed electrons having high kinetic energy that come out of a transistor and generate light when the high-speed electrons impact silicon atoms.

In the solid-state imaging device with the stacked structure, transistors are provided in the second semiconductor substrate separately from the first semiconductor substrate in which the PD is provided. For this reason, light generated by hot carriers coming out of the transistors of the second semiconductor substrate penetrates from the rear side (the opposite side to the light receiving surface) of the PD of the first semiconductor substrate, thereby causing noise.

For this reason, in the solid-state imaging device with the stacked structure, in order to block light caused by the hot carriers for example, a preventative measure, such as providing a light blocking body is performed.

Figure 2:
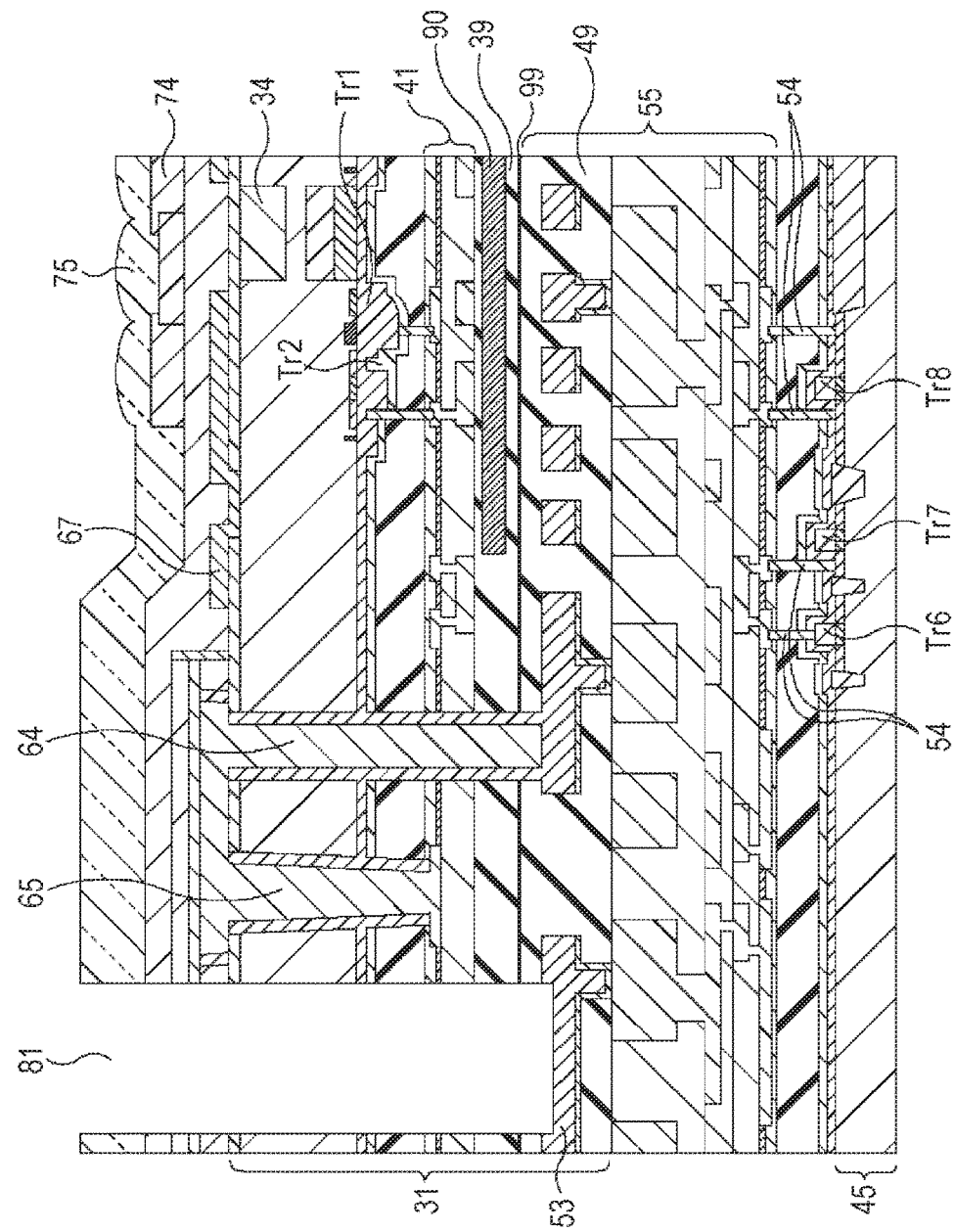
FIG. 2 is a cross-sectional view illustrating another configuration of the pixel portion of the stacked solid-state imaging device in the related art.

FIG. 2 is a cross-sectional view illustrating another configuration of the pixel portion of the stacked solid-state imaging device in the related art.

In the example shown in FIG. 2, a light blocking body 90 is formed under the PD 34 in the first semiconductor substrate 31. Thus, light caused by hot carriers coming out of the MOS transistor Tr6, the MOS transistor Tr7, and the MOS transistor Tr8 of the second semiconductor substrate 45 is blocked.

Alternatively, a shape of the copper wire of the multilayer wire layer 55 may be changed, or the like, so as to block light caused by hot carriers coming out of the MOS transistor Tr6, the MOS transistor Tr7, and the MOS transistor Tr8.

As described above with reference to FIGS. 1 and 2, in the solid-state imaging device with the two-layer stacked structure, the pad hole 81 is provided so as to be electrically connected to an external device, and light caused by the hot carriers is blocked using the light blocking body 90 or a shape of the copper wire of the multilayer wire layer 55.

A three-layer stacked solid-state imaging device has been developed. The three-layer stacked solid-state imaging device includes, for example, a third semiconductor substrate in which a memory circuit is formed in addition to the first semiconductor substrate in which the pixel region and the control region (hereinafter, referred to as a sensor circuit) and the second semiconductor substrate in which the logical circuit is formed.

Figure 3:
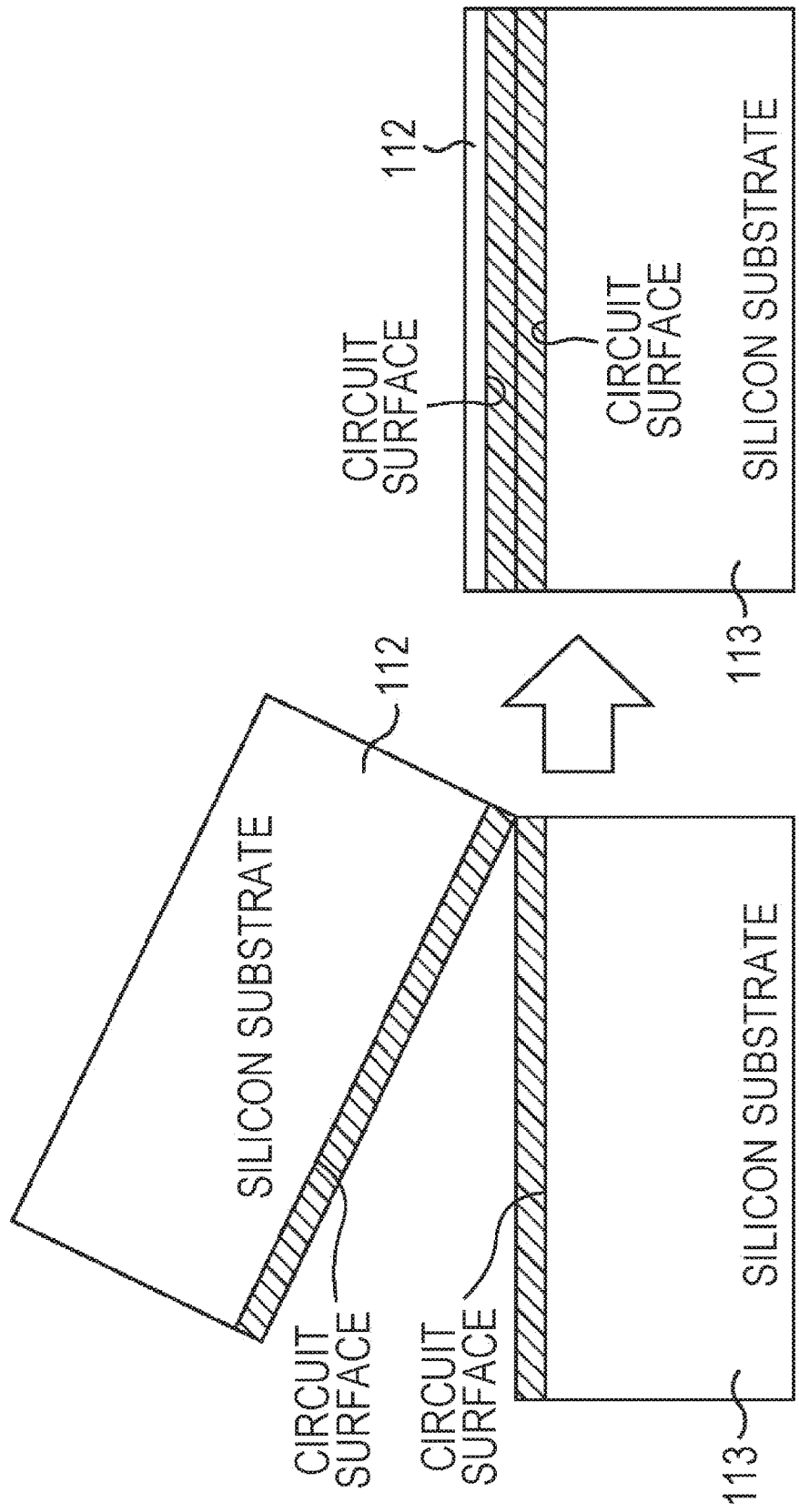
FIG. 3 is a diagram illustrating a manufacturing method of a three-layer stacked solid-state imaging device.
Figure 4:
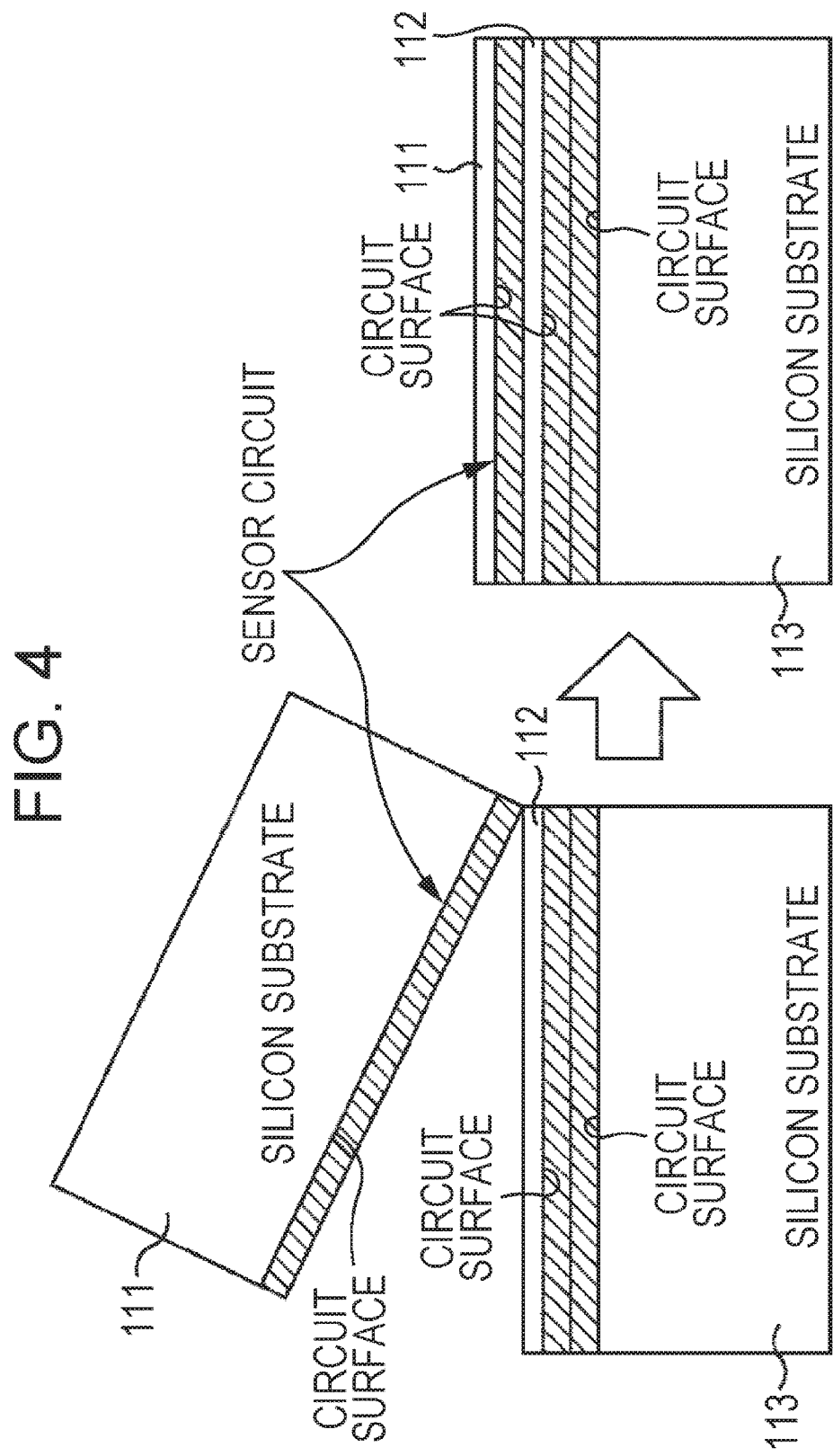
FIG. 4 is a diagram illustrating a manufacturing method of the three-layer stacked solid-state imaging device.

The three-layer stacked solid-state imaging device is manufactured, for example, as shown in FIGS. 3 and 4.

First, as shown in FIG. 3, a second semiconductor substrate 112 and a third semiconductor substrate 113 are joined together such that circuit surfaces thereof face each other. In addition, interlayer films of the two semiconductor substrates are joined to each other. Further, the second semiconductor substrate 112 is thinned.

Next, as shown in FIG. 4, a first semiconductor substrate 111 is joined onto the thinned second semiconductor substrate 112 in a state where the rear surface thereof face upward. In addition, interlayer films of the two semiconductor substrates are joined to each other. Further, the first semiconductor substrate 111 is thinned.

As above, in a case where a stacked image sensor is formed using the three-layer stacked structure, it is necessary for the sensor circuit having a light receiving portion to incorporate light, and thus the sensor circuit is disposed in the uppermost part, and the two logical circuit and memory circuit are stacked in lower layers thereof.

In addition, when the circuits are stacked, it is preferable that a support substrate for thinning a silicon substrate not be used. For this reason, in manufacturing circuits, first, the circuit surfaces of two semiconductor substrates of the lower layers are joined together so as to face each other, and the semiconductor substrate (the second semiconductor substrate 112) of the second layer is thinned. Thereafter, the semiconductor substrate (the first semiconductor substrate 111) of the uppermost layer is joined thereto so as to be stacked thereon as a rear surface type, and is further thinned.

However, in this way, the inventors have found that the following problems occur in the three-layer stacked structure.

Figure 5:
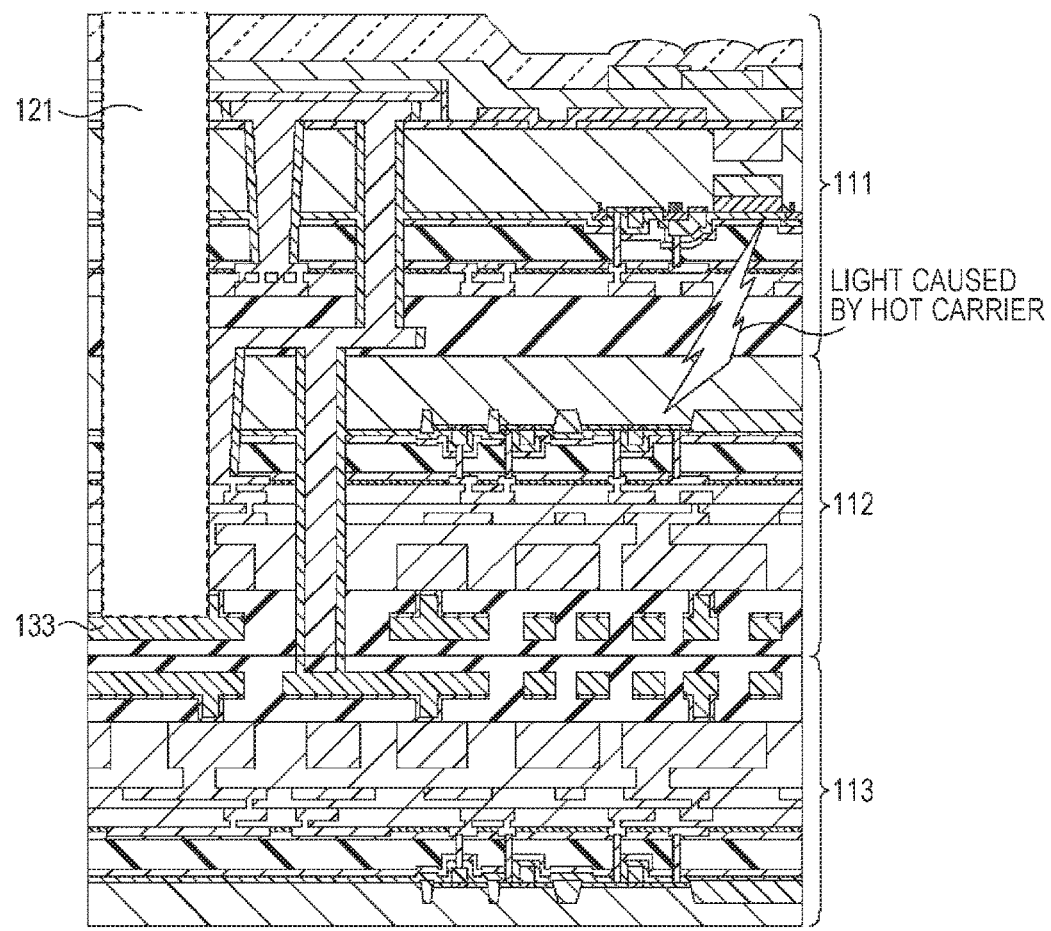
FIG. 5 is a cross-sectional view illustrating a configuration of a pixel portion of a solid-state imaging device with a three-layer stacked structure manufactured according to FIGS. 3 and 4.

FIG. 5 is a cross-sectional view illustrating a configuration of a pixel portion of a three-layer stacked solid-state imaging device manufactured according to FIGS. 3 and 4.

A first problem in the three-layer stacked structure in FIG. 5 is that a pad hole is too deep. In FIG. 5, a pad hole 121 which is deeper than the pad hole 81 of FIG. 1 is formed.

In other words, in the three-layer stacked structure, as described with reference to FIGS. 3 and 4, the circuit surface of the second semiconductor substrate 112 is joined to the circuit surface of the third semiconductor substrate so as to face each other. For this reason, an aluminum pad of the uppermost layer of the multilayer wire layer of the second semiconductor substrate is distant from the light receiving surface of the first semiconductor substrate 111, and thus the aluminum pad 133 (an electrode for external connection) of the second semiconductor substrate is not exposed unless an opening is formed so as to penetrate through the first semiconductor substrate and, further, substantially penetrate through the second semiconductor substrate.

In order to open the deep pad hole 121, thickening of a resist is necessary. If the resist is thickened in order to open the deep pad hole 121, curing of the resist after dry etching is problematic.

For example, since an on-chip micro lens using an organic material has already been formed on the first semiconductor substrate when the opening is formed, the resist is removed using a solution, but the cured resist tends to remain in a residual state and thus impedes light incidence to the lens.

In addition, in a case where the deep pad hole 121 is opened, a deposited substance occurring as a result of the dry etching is also problematic.

Particularly, a deposited substance which is attached to the surface of the aluminum pad 133 or the sidewall of the pad hole 121 and is not removed, for example, absorbs humidity so as to generate fluorine ions after the three-layer stacked structure is completed, and thus causes a defect (corrosion) in which the aluminum pad metal melts.

As above, in FIGS. 3 and 4, it is difficult to perform a manufacturing process of a solid-state imaging device due to the deep pad hole.

A second problem in the three-layer stacked structure in FIG. 5 is that it is difficult to block light caused by hot carriers.

In other words, in using the three-layer stacked structure, as described with reference to FIGS. 3 and 4, the circuit surface of the second semiconductor substrate 112 is joined to the circuit surface of the third semiconductor substrate so as to face each other. For this reason, a transistor of the second semiconductor substrate faces the first semiconductor substrate without using the multilayer wire layer. Therefore, for example, in the same manner as a case of the two-layer stacked structure, light caused by hot carriers is unable to be blocked by the copper wire of the multilayer wire layer of the second semiconductor substrate.

Therefore, in the present technology, it is not necessary to provide a deep pad hole; therefore, light caused by hot carriers can be easily blocked.

Figure 6:
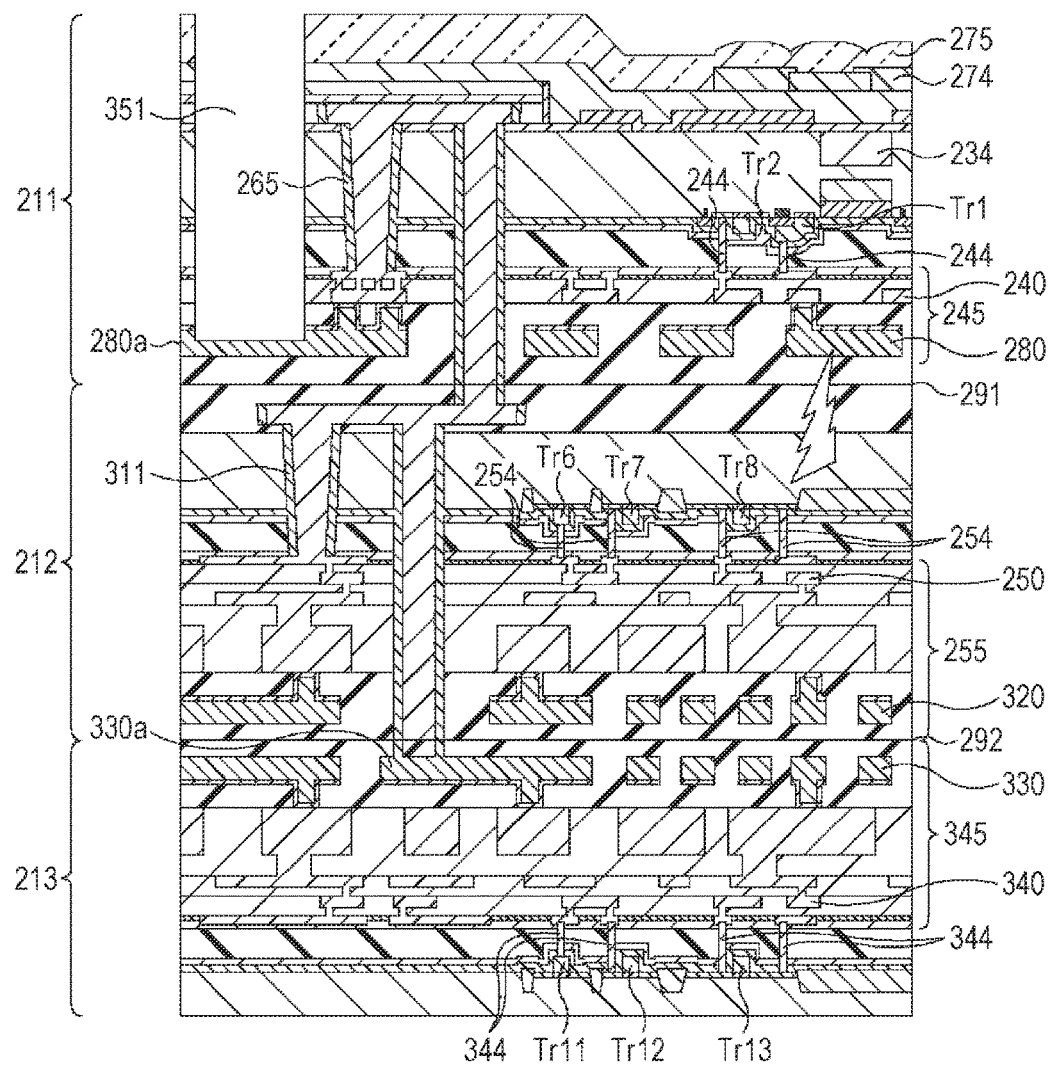
FIG. 6 is a cross-sectional view illustrating a configuration according to an embodiment of a pixel portion of a solid-state imaging device to which the present technology is applied.

FIG. 6 is a cross-sectional view illustrating a configuration according to an embodiment of a pixel portion of a solid-state imaging device to which the present technology is applied. A solid-state imaging device related to this pixel portion includes a rear surface irradiation type CMOS image sensor formed by stacking a first semiconductor substrate, a second semiconductor substrate, and a third semiconductor substrate. In other words, the solid-state imaging device related to the pixel portion shown in FIG. 6 has a three-layer stacked structure.

In addition, the solid-state imaging device includes, for example, a first semiconductor substrate provided with a sensor circuit, a second semiconductor substrate provided with a logical circuit, and a third semiconductor substrate provided with a memory circuit. The logical circuit and the memory circuit are respectively operated based on input and output of signals with an external device.

As shown in FIG. 6, a photodiode (PD) 234 which is a photoelectric conversion portion of each pixel is formed in the semiconductor substrate (for example, a silicon substrate) 211, and a source/drain region of each pixel transistor is formed in a semiconductor well region thereof.

A gate electrode is formed on a substrate surface forming the pixel via a gate insulating film, and a pixel transistor Tr1 and a pixel transistor Tr2 are formed by the gate electrode and the source/drain region corresponding thereto.

The pixel transistor Tr1 adjacent to the photodiode (PD) 234 corresponds to a transfer transistor, and the source/drain region corresponds to a floating diffusion (FD).

In addition, an interlayer insulating film is formed in the first semiconductor substrate 211, connection hole are formed in the interlayer insulating film, and connection conductors 244 connected to the pixel transistor Tr1 and the pixel transistor Tr2 are formed therein.

In addition, in order to be connected to each connection conductor 244, a metal wire 240 of a plurality of layers is formed so as to form a multilayer wire layer 245. The metal wire 240 is formed of a copper (Cu) wire. Generally, each copper wire is covered with a barrier metal film for preventing diffusion of Cu. For this reason, a protective film which is a cap film of the copper wire is formed on the multilayer wire layer 245.

In addition, an aluminum pad 280 which is an electrode for external connection is formed in the lowermost layer of the multilayer wire layer 245 of the first semiconductor substrate 211. In other words, the aluminum pad 280 is formed at a position closer to an adhesive surface 291 with the second semiconductor substrate 212 than the copper wire 240. This electrode for external connection is used as one end of a wire related to input and output of a signal with an external device. In addition, although the electrode has been described as being made of aluminum, the electrode may be made of other metals.

In addition, a contact 265 which is used for electrical connection to the second semiconductor substrate 212 is formed in the first semiconductor substrate 211. The contact 265 is connected to a contact 311 of the second semiconductor substrate 212, described later, and is also connected to an aluminum pad 280a of the first semiconductor substrate 211.

In addition, a pad hole 351 is formed in the first semiconductor substrate 211 so as to reach the aluminum pad 280a from the rear surface side (the light receiving surface side) of the first semiconductor substrate 211.

Figure 7A:
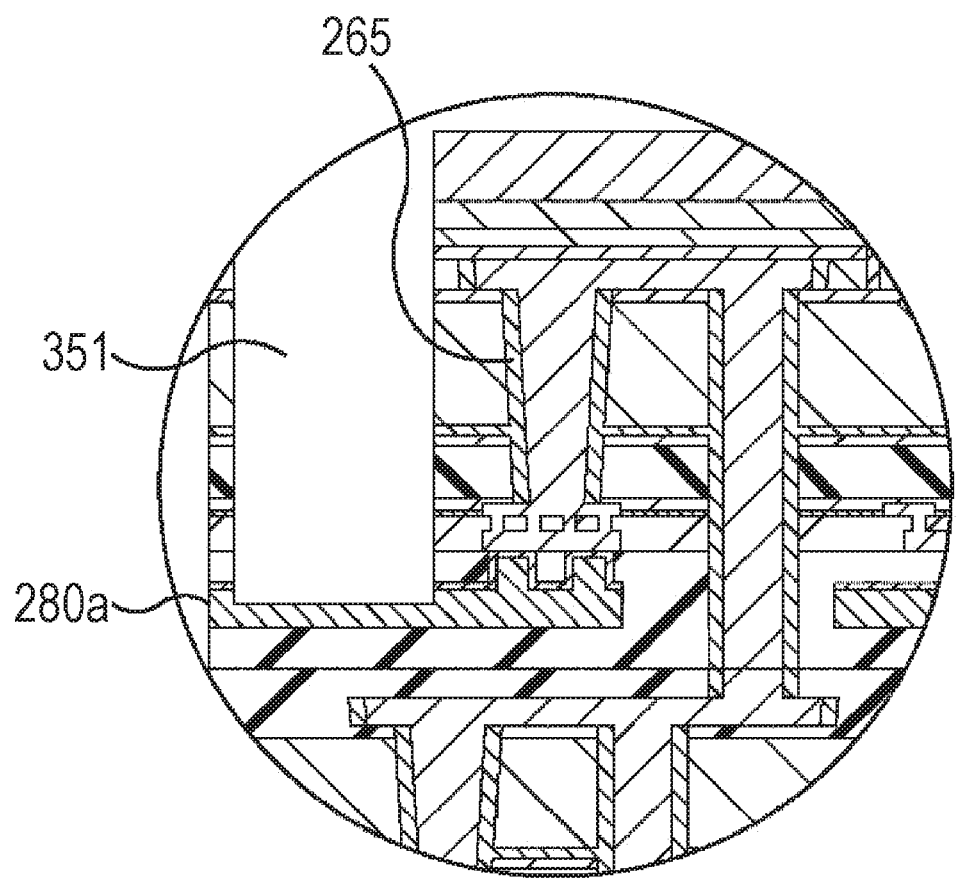
FIG. 7A is an enlarged view in the vicinity of the pad hole.
Figure 7B:
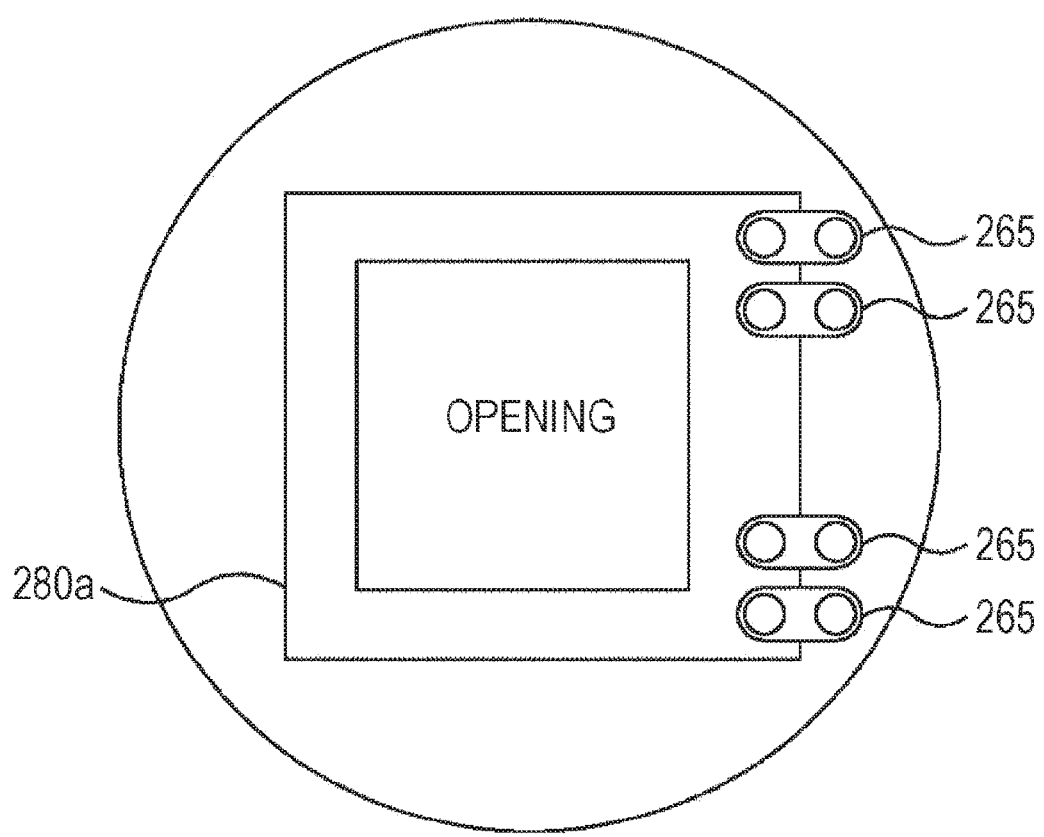
FIG. 7B is a diagram in which the aluminum pad is viewed from the top of the pad hole.

FIGS. 7A and 7B are diagrams illustrating a configuration of the pad hole 351 and the aluminum pad 280a. FIG. 7A is an enlarged view of the vicinity of the pad hole 351, and FIG. 7B is a diagram in which the aluminum pad 280a is viewed from the top of the pad hole 351.

As shown in FIG. 7B, a plurality of contacts 265 are arranged and are connected to an end of the aluminum pad 280a so as to reduce contact resistance.

Returning to FIG. 6, in the same manner as the case described with reference to FIG. 1, an insulating protective film is formed on the entire rear surface in the first semiconductor substrate 211 so as to form a light block film in a region which it is necessary to block light from reaching. Further, on-chip color filters 274 which correspond to the respective pixels are formed on the planarized film, and an on-chip micro lens 275 is formed thereon.

Meanwhile, a logical circuit is formed in the second semiconductor substrate 212. In other words, a MOS transistor Tr6, a MOS transistor Tr7, and a MOS transistor Tr8 which comprise a plurality of transistors forming the logical circuit, are formed in a p type semiconductor well region of the semiconductor substrate (for example, a silicon substrate) 212.

In addition, connection conductors 254 which are connected to the MOS transistor Tr6, the MOS transistor Tr7, and the MOS transistor Tr8 are formed in the second semiconductor substrate 212.

In addition, a metal wire 250 of a plurality of layers is formed, and a multilayer wire layer 255 is formed so as to be connected to the respective connection conductors 254.

The metal wire is formed of a copper (Cu) wire. A protective film which is a cap film of the copper wire (metal wire) 250 is formed on the multilayer wire layer 255.

In addition, an aluminum pad 320 which is an electrode is formed in the lowermost layer of the multilayer wire layer 255 of the second semiconductor substrate 212.

Further, a contact 311 which is used for electrical connection to the first semiconductor substrate 211 and the third semiconductor substrate 213 is formed in the second semiconductor substrate 212. The contact 311 is connected to the contact 265 of the first semiconductor substrate 211 and is also connected to an aluminum pad 330a of the third semiconductor substrate 213.

In addition, a memory circuit is formed in the third semiconductor substrate 213. In other words, a MOS transistor Tr11, a MOS transistor Tr12, and a MOS transistor Tr13 which are a plurality of transistors forming the memory circuit are formed in a p type semiconductor well region of the semiconductor substrate (for example, a silicon substrate) 213.

In addition, connection conductors 344 which are connected to the MOS transistor Tr11, the MOS transistor Tr12, and the MOS transistor Tr13 are formed in the third semiconductor substrate 213.

In addition, a metal wire 340 of a plurality of layers is formed, and a multilayer wire layer 345 is formed so as to be connected to the respective connection conductors 344.

The metal wire is formed of a copper (Cu) wire. A protective film which is a cap film of the copper wire (metal wire) 340 is formed on the multilayer wire layer 345.

In addition, an aluminum pad 330 which is an electrode is formed in the uppermost layer of the multilayer wire layer 345.

In the solid-state imaging device shown in FIG. 6, the contact 265 and the contact 311 are provided, and thus input and output of signals can be performed between the first semiconductor substrate 211 to the third semiconductor substrate 213 via the aluminum pad 280a.

Also in the solid-state imaging device shown in FIG. 6, as described with reference to FIGS. 3 and 4, interlayer films of the second semiconductor substrate 212 and the third semiconductor substrate 213 are joined to each other at an adhesive surface 292. In addition, the interlayer films of the second semiconductor substrate 212 and the first semiconductor substrate 211 are joined to each other at the adhesive surface 291.

In other words, as described with reference to FIGS. 3 and 4, first, the two semiconductor substrates of the lower layers are joined together such that the circuit surfaces thereof face each other, and the semiconductor substrate (the second semiconductor substrate 212) of the second layer is thinned. Next, the semiconductor substrate (the first semiconductor substrate 211) of the uppermost layer is joined thereto so as to be stacked thereon as a rear surface type, and is further thinned. At this time, after the upper layer of the contact 311 is planarized, the first semiconductor substrate 211 is joined to the second semiconductor substrate 212 as a rear surface type.

In this way, when the circuits are stacked, a support substrate for thinning the silicon substrate is not used.

In the present technology, the aluminum pad 280 is also provided in the first semiconductor substrate 211. In addition, an electrode for an external electrode is not provided in the second semiconductor substrate 212 having the logical circuit in which input and output of signals to and from an external device are necessary, or the third semiconductor substrate 213 having the memory circuit, and an electrode (the aluminum pad 280a) for an external connection is provided in the first semiconductor substrate 211 having the sensor circuit.

In this way, it is possible to expose the electrode for external connection without deepening the pad hole 351.

In addition, in the present technology, since the aluminum pad 280 is also provided in the first semiconductor substrate 211, it is possible to block light caused by hot carriers coming out of each transistor of the second semiconductor substrate 212 by the aluminum pad 280.

As above, in the present technology, it is not necessary to provide a deep pad hole, and it is possible to easily prevent the influence of noise and the like due to hot carriers by blocking the light caused by hot carriers.

In addition, and with respect to FIG. 6, although the aluminum pad 320 is provided in the second semiconductor substrate and the aluminum pad 330 is provided in the third semiconductor substrate 213, the aluminum pad 320 and the aluminum pad 330 may not be provided. For example, if the contact 311 is to be directly connected to the copper wire 340 of the third semiconductor substrate 213, it is unnecessary to provide the aluminum pad 320 and the aluminum pad 330.

In addition, a shape of the contact which electrically connects the semiconductor substrates to each other is not limited to the shapes of the contact 265 and the contact 311. In addition, since a hole for forming a contact can be formed before an on-chip micro lens is formed, even the problem associated with a deep pad hole is not an issue. For example, a contact may be provided which penetrates through the second semiconductor substrate so as to connect the copper wire of the first semiconductor substrate to the copper wire of the third semiconductor substrate.

Alternatively, a light blocking body which blocks light caused by hot carriers may be formed.

Figure 8:
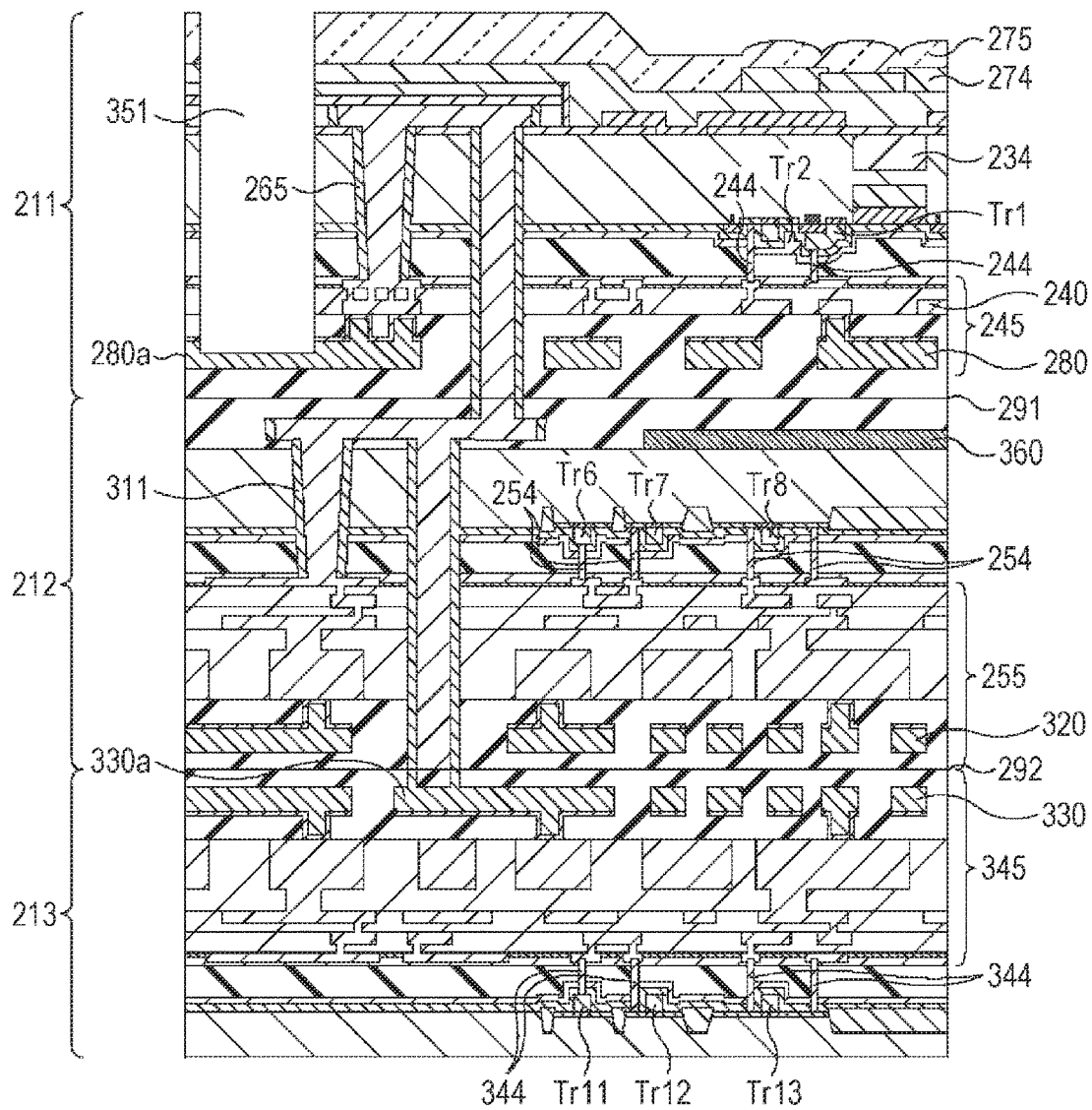
FIG. 8 is a cross-sectional view illustrating a configuration according to another embodiment of the pixel portion of the solid-state imaging device to which the present technology is applied.

FIG. 8 is a cross-sectional view illustrating a configuration according to another embodiment of the pixel portion of the solid-state imaging device to which the present technology is applied. In the same manner as in FIG. 6, a solid-state imaging device related to this pixel portion includes a rear surface type CMOS image sensor formed by stacking a first semiconductor substrate, a second semiconductor substrate, and a third semiconductor substrate. In other words, the solid-state imaging device related to the pixel portion shown in FIG. 8 also has a three-layer stacked structure.

In the example shown in FIG. 8, a light blocking body 360 is disposed in an interlayer film which is the uppermost layer of the second semiconductor substrate 212 in FIG. 8. Thus, it is possible to more reliably block light caused by hot carriers coming out of each transistor of the second semiconductor substrate 212.

In addition, since the aluminum pad 280 is formed in the first semiconductor substrate 211, the light blocking body 360 is not disposed in the first semiconductor substrate 211 and is disposed in the interlayer film of the second semiconductor substrate 212.

The other constituent elements in FIG. 8 are the same as in the case described with reference to FIG. 6, and thus detailed description thereof will be omitted.

Alternatively, a copper wire may be formed in the interlayer film which is the uppermost layer of the second semiconductor substrate 212 in FIG. 8, and light caused by hot carriers may be blocked by a combination of the aluminum pad and the copper wire.

Figure 9:
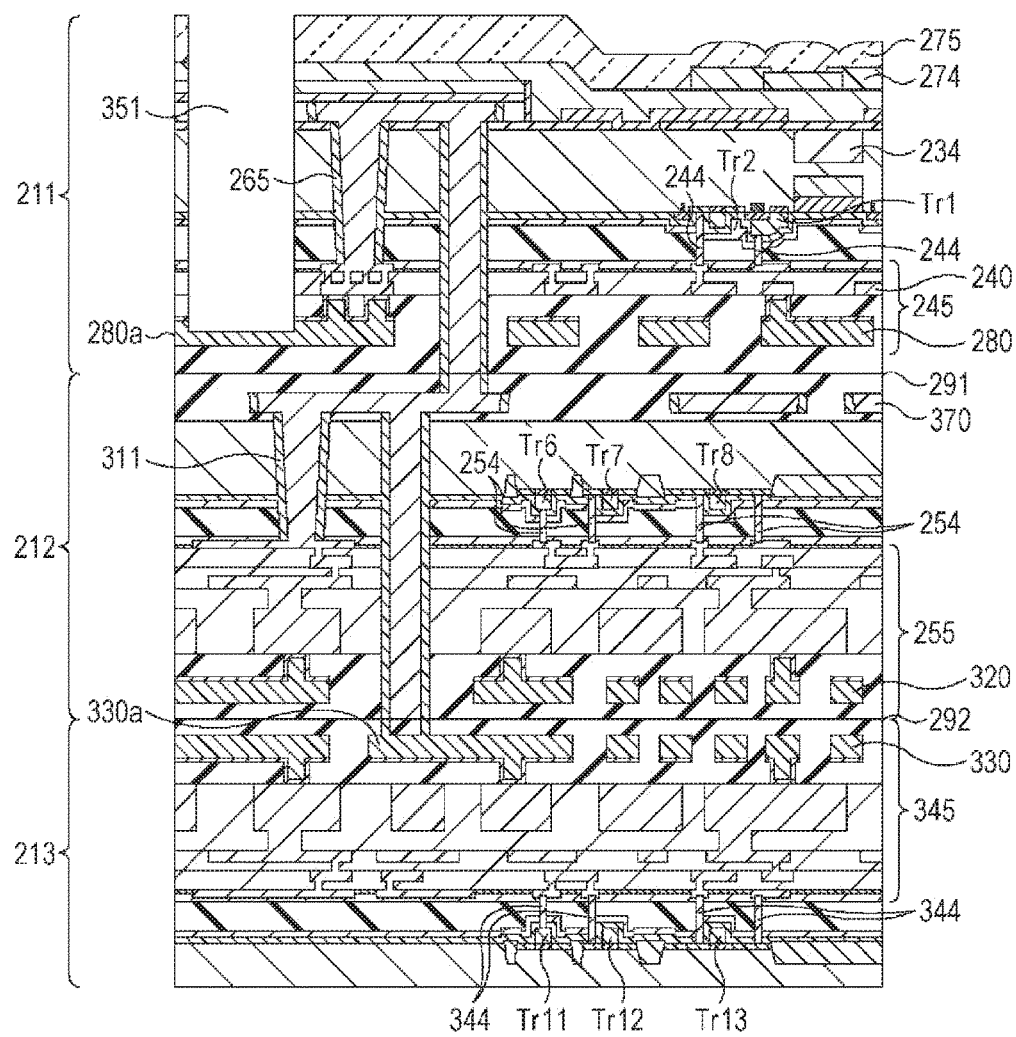
FIG. 9 is a cross-sectional view illustrating a configuration according to still another embodiment of the pixel portion of the solid-state imaging device to which the present technology is applied.

FIG. 9 is a cross-sectional view illustrating a configuration according to still another embodiment of the pixel portion of the solid-state imaging device to which the present technology is applied. In the same manner as in FIG. 6, a solid-state imaging device related to this pixel portion includes a rear surface irradiation type CMOS image sensor formed by stacking a first semiconductor substrate, a second semiconductor substrate, and a third semiconductor substrate. In other words, the solid-state imaging device related to the pixel portion shown in FIG. 9 also has a three-layer stacked structure.

In the example shown in FIG. 9, a copper wire 370 is disposed in an interlayer film which is the uppermost layer of the second semiconductor substrate 212 in FIG. 9.

A part of the contact 311 is formed in the interlayer film which is the uppermost layer of the second semiconductor substrate 212 in FIG. 9. For example, if the copper wire 370 is further formed in the interlayer film when the contact 311 is formed, a solid-state imaging device with the configuration shown in FIG. 9 can be obtained.

When light is blocked by a combination of the copper wire 370 and the aluminum pad 280, it is possible to more reliably block light caused by hot carriers coming out of each transistor of the second semiconductor substrate 212. In addition, in an embodiment of the configuration shown in FIG. 9, additional freedom in designing wires related to the aluminum pad 280 may be utilized, as compared with a case of blocking light only by the aluminum pad 280, for example, as shown in FIG. 6.

The other constituent elements in FIG. 9 are the same as in the case described with reference to FIG. 6, and thus detailed description thereof will be omitted.

Figure 10:
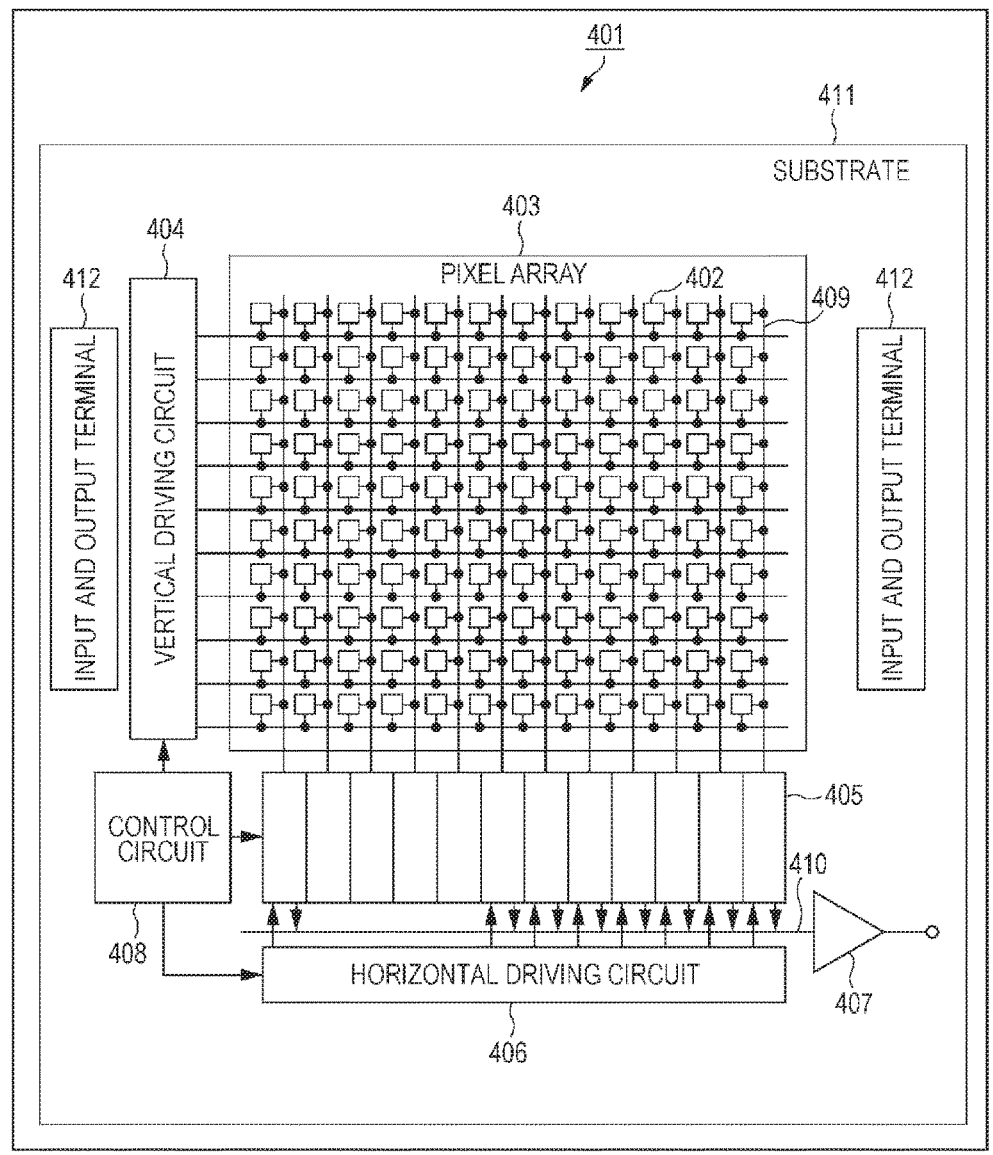
FIG. 10 is a diagram illustrating a schematic configuration of a solid-state imaging device to which the present technology is applied.

FIG. 10 is a diagram illustrating a schematic configuration of a solid-state imaging device to which the present technology is applied. This solid-state imaging device 401 includes, for example, a CMOS image sensor.

The solid-state imaging device 401 of FIG. 10 includes a pixel region (a so-called pixel array) 403 in which pixels 402 including a plurality of photoelectric conversion portions are regularly arranged in a two-dimensional array on the semiconductor substrate 411 and a peripheral circuit portion.

Each of the pixels 402 includes, for example, a photodiode which is the photoelectric conversion portion and a plurality of pixel transistors (so-called MOS transistors).

In addition, the pixels 402 may have a shared pixel structure. This pixel shared structure is formed by a plurality of photodiodes, a plurality of transfer transistors, a single shared floating diffusion, and another shared transistor.

The peripheral circuit portion includes a vertical driving circuit 404, a column signal processing circuit 405, a horizontal driving circuit 406, an output circuit 407, a control circuit 408, and the like.

The control circuit 408 receives an input clock and data for commanding an operation mode and the like, and outputs data such as internal information of the solid-state imaging device. In other words, the control circuit 408 generates a clock signal used as a reference of operations of the vertical driving circuit 404, the column signal processing circuit 405, the horizontal driving circuit 406, and the like, and control signals on the basis of a vertical synchronization signal, a horizontal synchronization signal, and a master clock. In addition, these signals are input to the vertical driving circuit 404, the column signal processing circuit 405, the horizontal driving circuit 406, and the like.

The vertical driving circuit 404 including, for example, shift registers, selects a pixel driving line, and supplies a pulse for driving the pixels to the selected pixel driving line so as to drive the pixels in the unit of a row. In other words, the vertical driving circuit 404 sequentially selectively scans the respective pixels 402 of the pixel region 403 in the vertical direction in the unit of a row, and supplies a pixel signal based on signal charge which is generated according to a light receiving amount in, for example, the photodiode which is a photoelectric conversion portion of each pixel 402, to the column signal processing circuit 405 via a vertical signal line 409.

The column signal processing circuit 405 is disposed, for example, for each column of the pixels 402, and performs a signal process such as noise removal on signals output from the pixels 402 of one row for each pixel column. In other words, the column signal processing circuit 405 performs signal processes such as CDS for removing fixed pattern noise unique to the pixels 402, signal amplification, and AD conversion. In an output end of the column signal processing circuit 405, a horizontal selection switch (not shown) is provided so as to be connected to a horizontal signal line 410.

The horizontal driving circuit 406 includes, for example, shift registers, sequentially outputs horizontal scanning pulses so as to sequentially select the respective column signal processing circuits 405, thereby outputting a pixel signal from each of the column signal processing circuits 405 to the horizontal signal line 410.

The output circuit 407 performs a signal process on the signals which are sequentially supplied from the respective column signal processing circuits 405 via the horizontal signal line 410 so as to be output. For example, only buffering may be performed, or black level adjustment, column disparity correction, a variety of digital signal processes, and the like may be performed. An input and output terminal 412 sends and receives signals to and from an external device.

The solid-state imaging device 401 shown in FIG. 10 includes a rear surface irradiation type CMOS image sensor with a three-layer stacked structure. For example, the pixels 402 shown in FIG. 10 are sensor circuits formed in the first semiconductor substrate, and the peripheral circuits are logical circuits formed in the second semiconductor substrate or memory circuits formed in the third semiconductor substrate.

In the above-described embodiment, and as previously described, the aluminum pad 280 is formed in the lowermost layer of the multilayer wire layer 245 of the first semiconductor substrate 211. However, for example, in a case where the aluminum pad 280 is disposed in the first semiconductor substrate 211, it is necessary to provide an electro-static discharge (ESD) circuit which is a circuit for protecting circuits of the first semiconductor substrate 211 from over-current, and this increases the number of steps.

In addition, in the above example described with reference to FIG. 6, it is possible to achieve an effect in which light caused by hot carriers is blocked by the aluminum pad 280 disposed in the first semiconductor substrate 211. However, since the multilayer wire layer 245 of the first semiconductor substrate 211 includes three wire layers, it is difficult to dispose the aluminum pad 280 so as to block light caused by hot carriers without restricting a shape of the copper wire 240.

For example, since the multilayer wire layer 255 of the second semiconductor substrate 212 includes six wire layers, if the aluminum pad 280 is disposed in the second semiconductor substrate 212, it is easy to dispose the aluminum pad 280 so as to block light caused by hot carriers without restricting a shape of the metal wire 250.

In addition, in the above-described embodiment, the contact 265 used for electrical connection between the first semiconductor substrate 211 and the second semiconductor substrate 212 has a configuration in which conductors embedded in two through holes which penetrate through the first semiconductor substrate 211 in the vertical direction are connected to each other on the light receiving surface (the uppermost surface in FIG. 9) of the first semiconductor substrate 211. This contact is also referred to as a twin contact. The contact 311 used for electrical connection between the second semiconductor substrate 212 and the third semiconductor substrate 213 is also a twin contact.

However, since it is necessary to provide two through holes for the twin contact, the number of manufacturing steps increases, and the area occupying the substrate also increases.

For example, when a contact is formed which penetrates through the first semiconductor substrate 211 from the uppermost side of the first semiconductor substrate 211 in FIG. 9 and reaches the wire inside the multilayer wire layer 255 of the second semiconductor substrate, apart of which reaches the wire inside the multilayer wire layer 245 of the first semiconductor substrate 211, only a single through hole is provided and thereby the first semiconductor substrate 211 can be electrically connected to the second semiconductor substrate 212. This contact is also referred to as a shared contact.

When the shared contact is used for electrical connection between the semiconductor substrates, manufacturing steps can be simplified and thus the area occupying the substrate can be reduced as compared with a case of using the twin contact.

In addition, when semiconductor substrates are joined together, a method in which the copper wires of the multilayer wire layers are directly bonded to each other has been utilized. If the copper wires of the multilayer wire layers are directly bonded to each other, it is unnecessary to provide a contact for electrical connection between semiconductor substrates, manufacturing steps can be further simplified, and thus the area occupying the substrate can be reduced. In addition, the method of directly bonding the copper wires to each other is also referred to as direct bonding.

Figure 11:
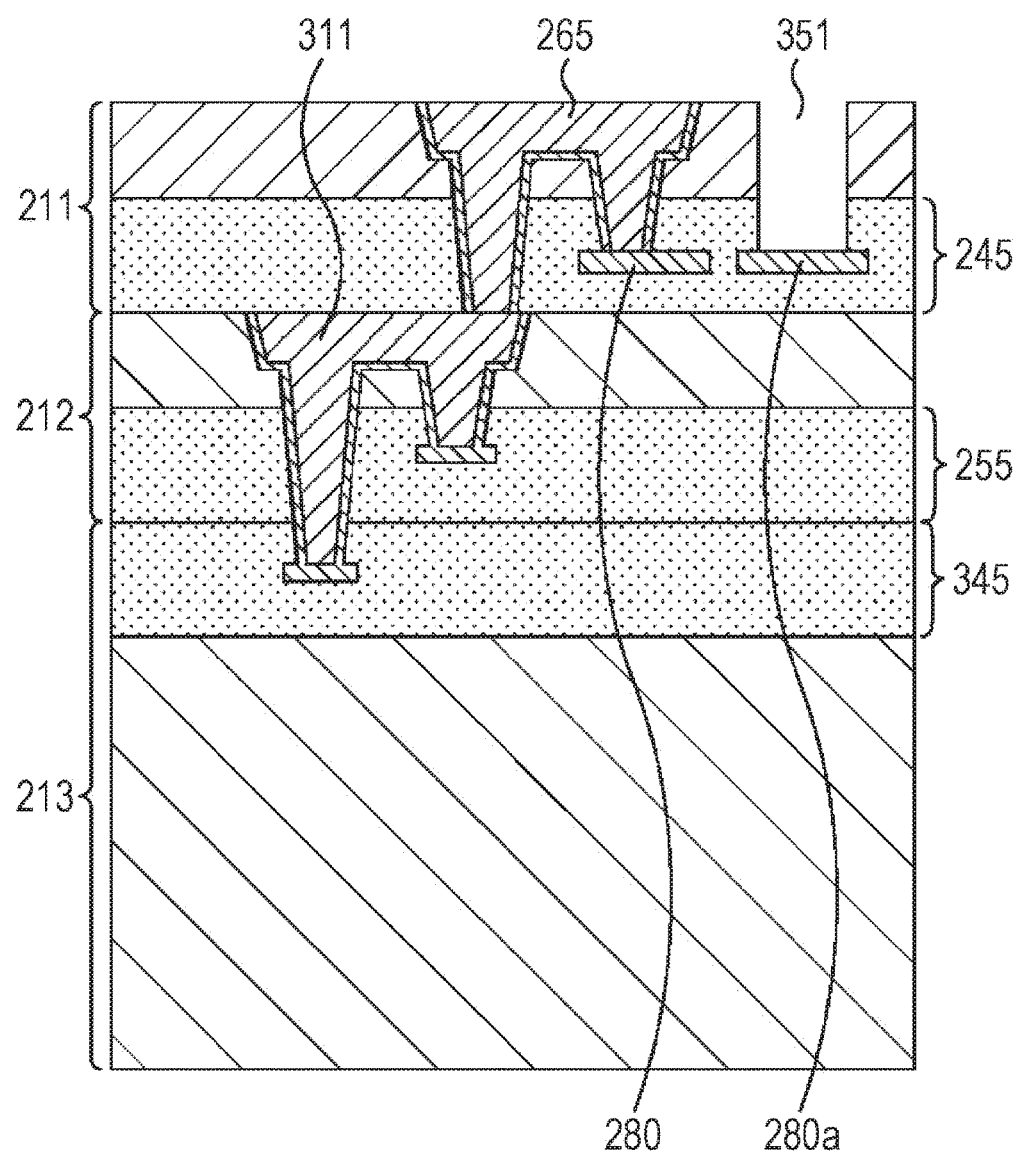
FIG. 11 is a schematic diagram of the cross-sectional view related to the configuration of the pixel portion of the solid-state imaging device shown in FIG. 6.

FIG. 11 is a schematic diagram of the cross-sectional view related to the configuration of the pixel portion of the solid-state imaging device shown in FIG. 6. As shown in FIG. 11, the pad hole 351 is formed in the first semiconductor substrate 211 so as to reach the aluminum pad 280a from the rear surface side (light receiving surface side) of the first semiconductor substrate 211. In addition, the aluminum pad 280 is formed in the multilayer wire layer 245 of the first semiconductor substrate 211.

Further, in the configuration shown in FIG. 11, the multilayer wire layer 255 of the second semiconductor substrate faces the third semiconductor substrate 213 side (the lower side of FIG. 11), and the first semiconductor substrate 211 is joined to the second semiconductor substrate 212.

In addition, in the configuration shown in FIG. 11, the contact 265 used for electrical connection between the first semiconductor substrate 211 and the second semiconductor substrate 212 and the contact 311 used for electrical connection between the second semiconductor substrate 212 and the third semiconductor substrate 213 are provided. The contact 265 and the contact 311 are respectively formed by a twin contact.

Figure 12:
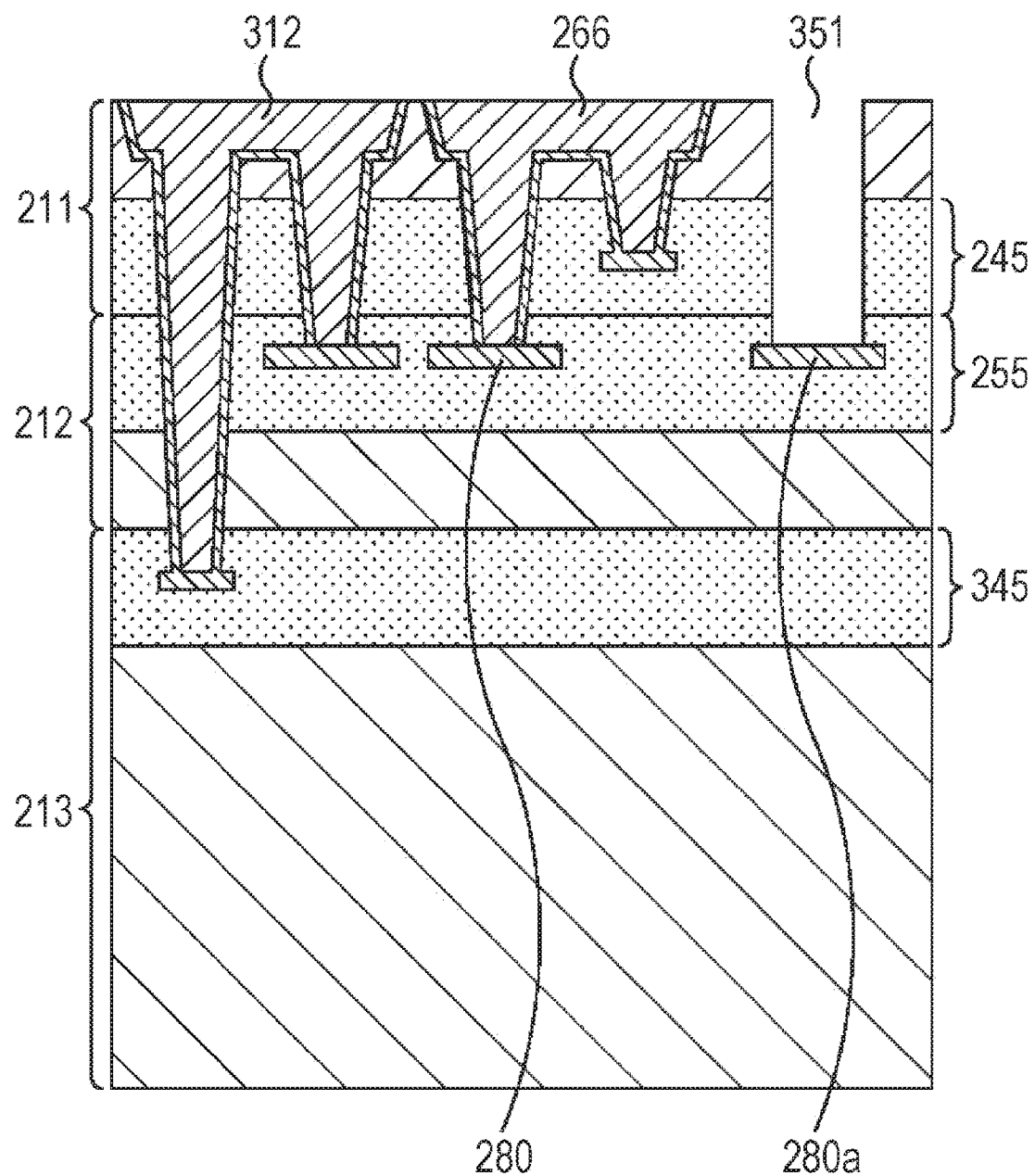
FIG. 12 is a schematic diagram of the cross-sectional view illustrating the configuration according to still another embodiment of the pixel portion of the solid-state imaging device to which the present technology is applied.

FIG. 12 is a schematic diagram of the cross-sectional view illustrating the configuration according to still another embodiment of the pixel portion of the solid-state imaging device to which the present technology is applied.

In the configuration shown in FIG. 12, unlike in the case of FIG. 11, the multilayer wire layer 255 of the second semiconductor substrate faces the first semiconductor substrate 211 side (the upper side in FIG. 12), and the first semiconductor substrate 211 is joined to the second semiconductor substrate 212.

In addition, in the configuration shown in FIG. 12, unlike in the case of FIG. 11, the aluminum pad 280 is provided in the multilayer wire layer 255 of the second semiconductor substrate 212. Further, the pad hole 351 is formed in the first semiconductor substrate 211 so as to reach the aluminum pad 280a from the rear surface side (light receiving surface side) of the first semiconductor substrate 211.

As shown in FIG. 12, the multilayer wire layer 255 of the second semiconductor substrate 212 faces the first semiconductor substrate side, and thus light caused by hot carriers can be blocked by the multilayer wire layer 255. In addition, the aluminum pad 280 is disposed in the multilayer wire layer 255 including the six wire layers, and thus it is easy to dispose the aluminum pad 280 so as to block light caused by hot carriers without restricting a shape of the metal wire 250.

In addition, since the aluminum pad 280 is provided in the multilayer wire layer 255 of the second semiconductor substrate 212, it is unnecessary to provide an ESD circuit in the first semiconductor substrate 211 (because an ESD circuit is preferably formed in the second semiconductor substrate), and thus it is possible to manufacture a solid-state imaging device at a low cost.

In addition, in the configuration shown in FIG. 12, the contact 266 used for electrical connection between the first semiconductor substrate 211 and the second semiconductor substrate 212 and the contact 312 used for electrical connection between the second semiconductor substrate 212 and the third semiconductor substrate 213 are provided. The contact 266 and the contact 312 are respectively formed by a twin contact.

In a case of the configuration shown in FIG. 12, unlike in the case of FIG. 11, the contact 312 penetrates through the first semiconductor substrate 211 and the second semiconductor substrate 212 and reaches the multilayer wire layer 345 of the third semiconductor substrate 213.

Next, a manufacturing process of the solid-state imaging device shown in FIG. 12 will be described.

Figure 13:
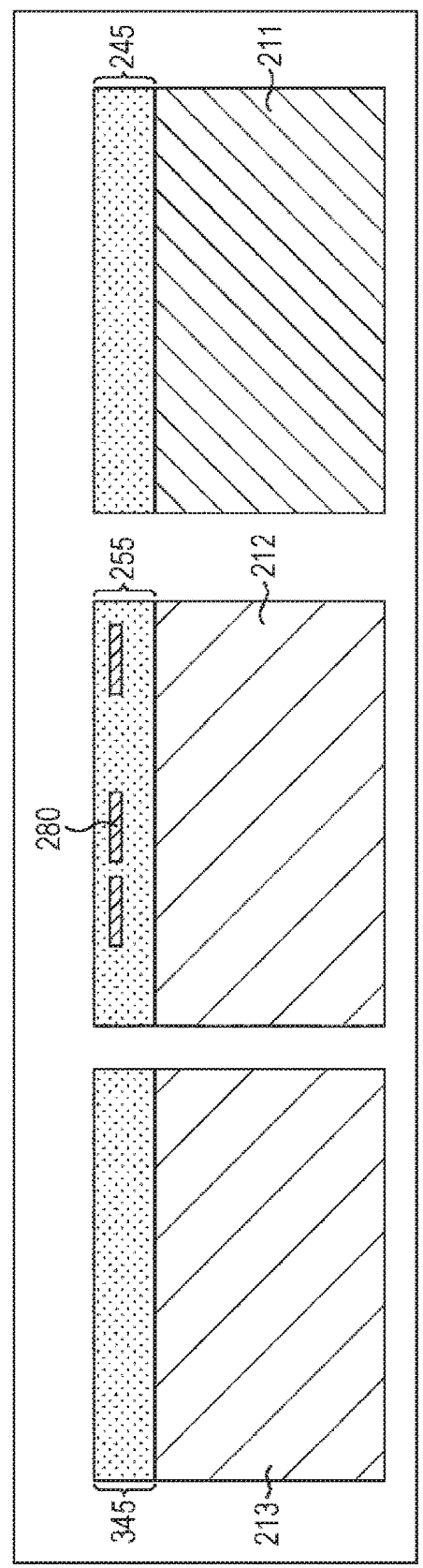
FIG. 13 is a diagram illustrating a manufacturing process of the solid-state imaging device shown in FIG. 12.

First, as shown in FIG. 13, the first semiconductor substrate 211, the second semiconductor substrate 212, and the third semiconductor substrate 213 are prepared which are respectively provided with the multilayer wire layers. As shown in FIG. 13, the first semiconductor substrate 211 is provided with the multilayer wire layer 245, the second semiconductor substrate 212 is provided with the multilayer wire layer 255, and the third semiconductor substrate 213 is provided with the multilayer wire layer 345.

In addition, as shown in FIG. 13, the aluminum pad 280 is formed in the multilayer wire layer 255 of the second semiconductor substrate 212.

Figure 14:
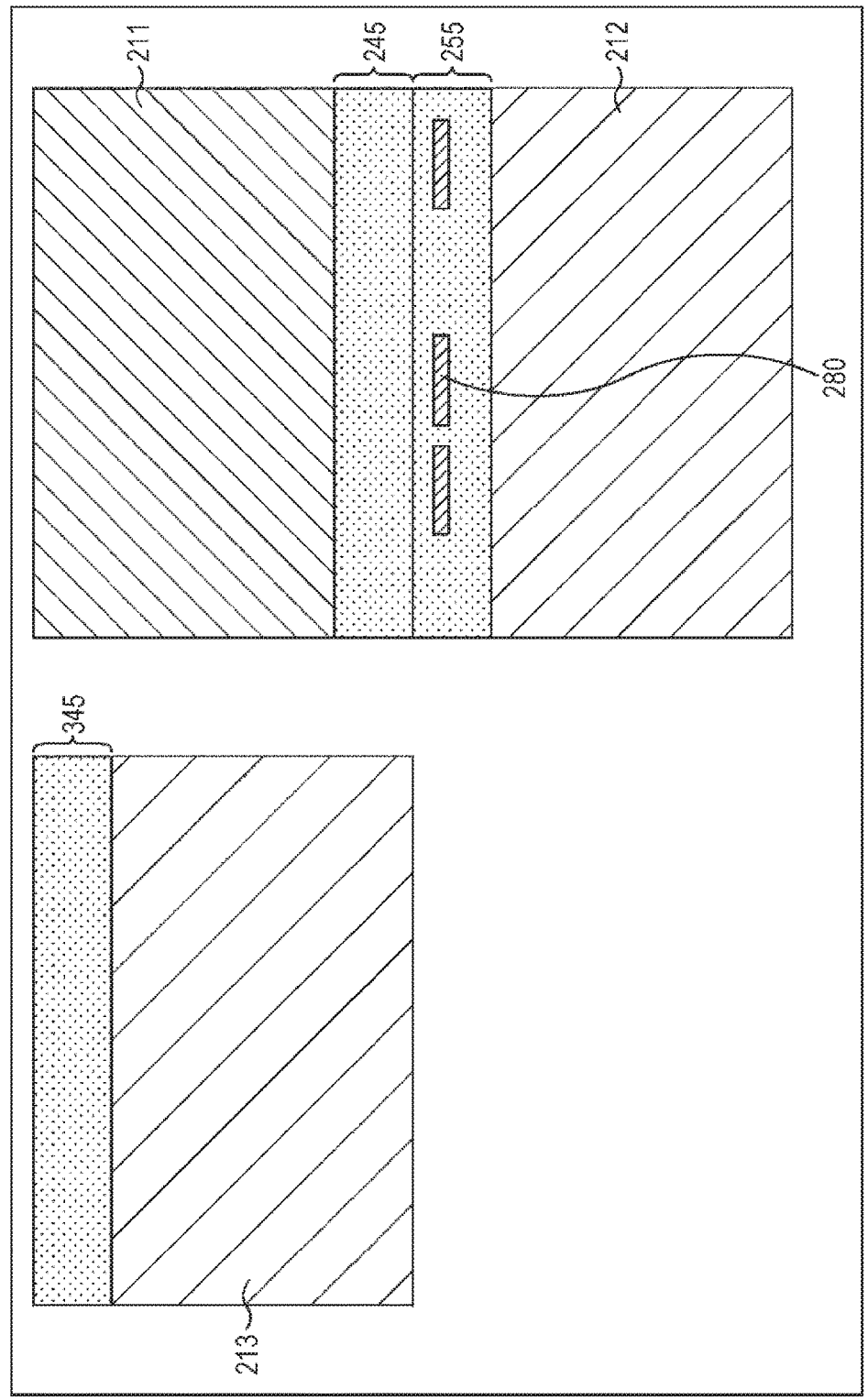
FIG. 14 is a diagram illustrating a manufacturing process of the solid-state imaging device shown in FIG. 12.

Next, as shown in FIG. 14, the first semiconductor substrate 211 is joined to the second semiconductor substrate 212. At this time, the first semiconductor substrate 211 is joined to the second semiconductor substrate 212 such that the multilayer wire layer 245 and the multilayer wire layer 255 face each other.

Figure 15:
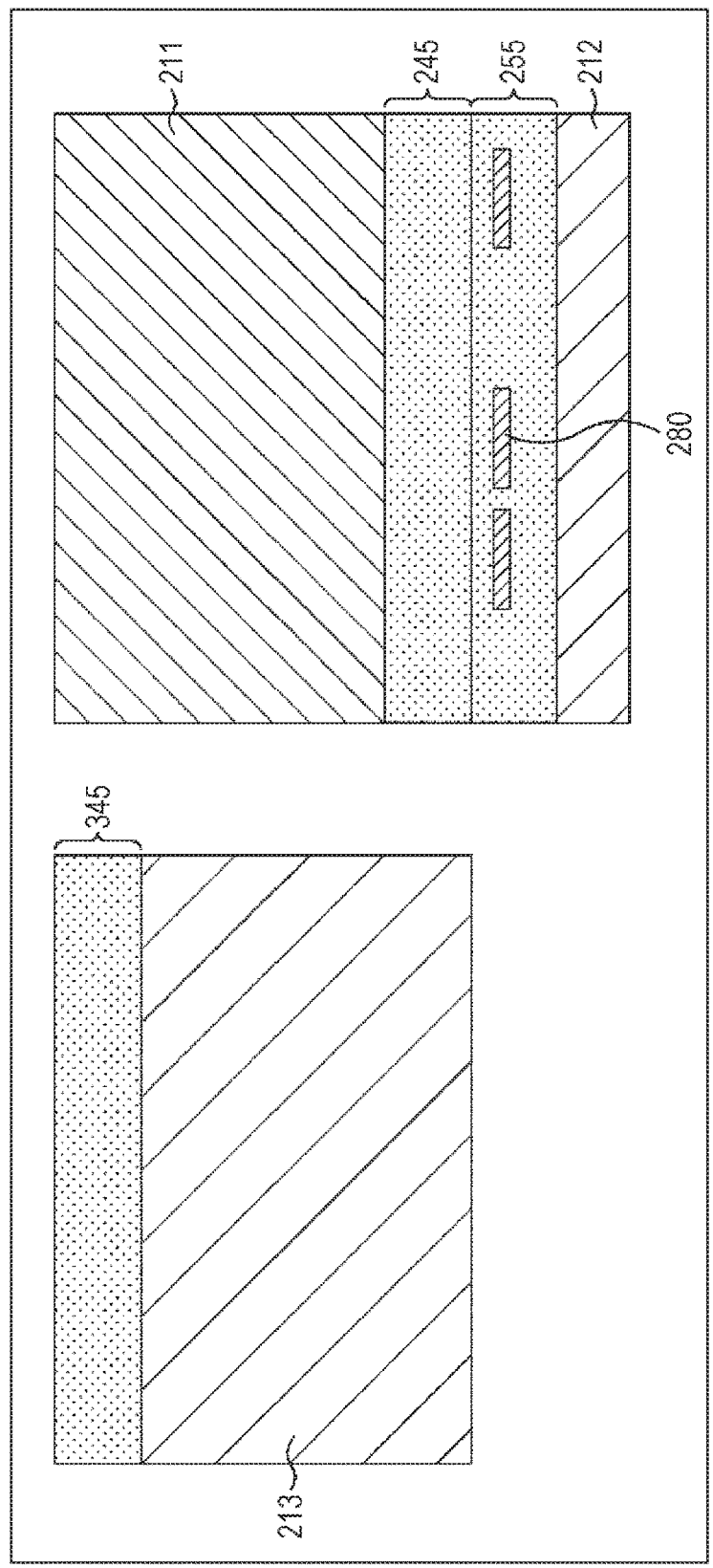
FIG. 15 is a diagram illustrating a manufacturing process of the solid-state imaging device shown in FIG. 12.

In addition, as shown in FIG. 15, the second semiconductor substrate 212 is thinned. In FIG. 15, the width of the second semiconductor substrate 212 in the vertical direction of FIG. 15 is reduced.

Figure 16:
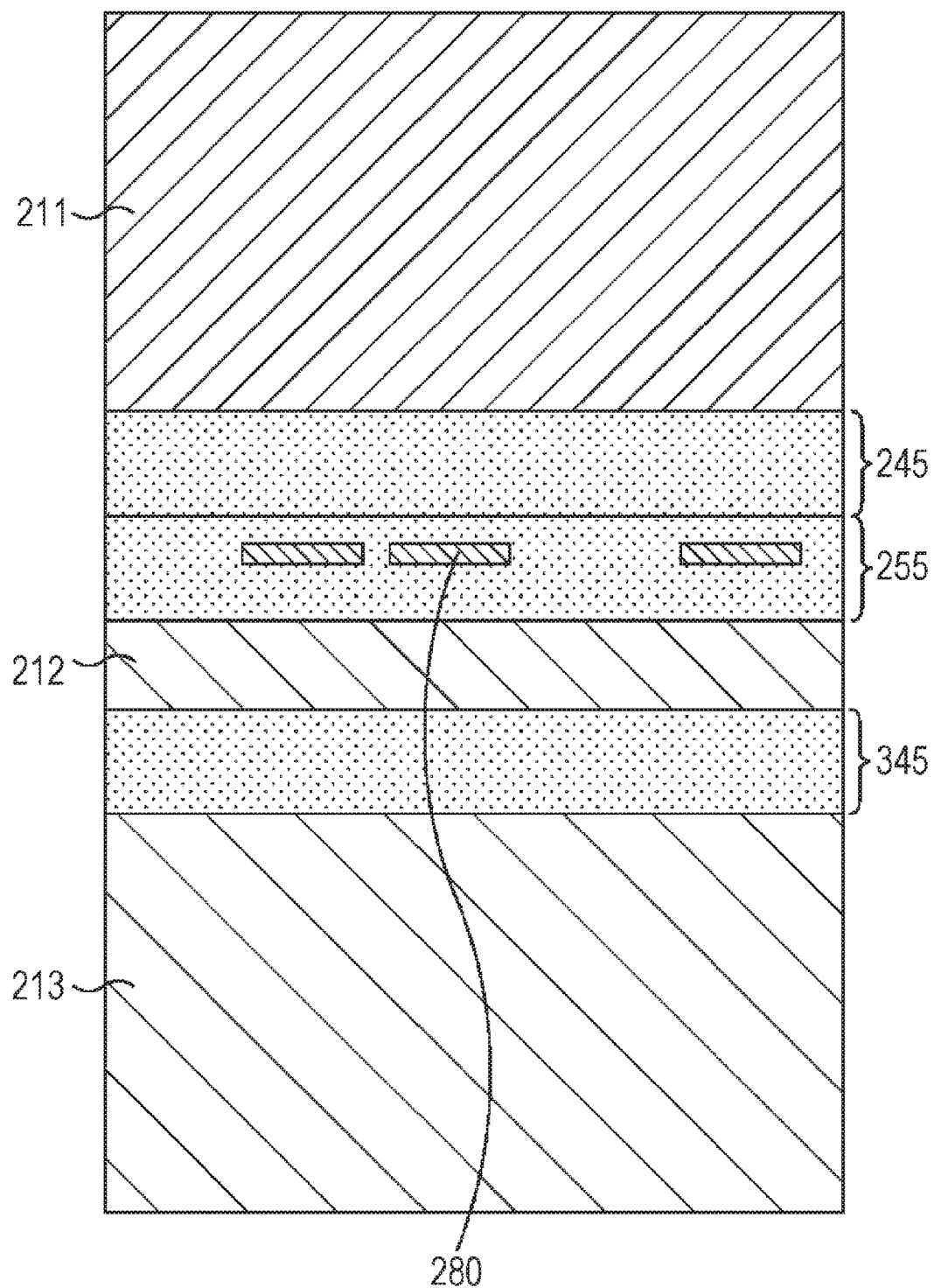
FIG. 16 is a diagram illustrating a manufacturing process of the solid-state imaging device shown in FIG. 12.

Next, as shown in FIG. 16, the third semiconductor substrate 213 is joined to the second semiconductor substrate 212. At this time, the second semiconductor substrate 212 is joined to the third semiconductor substrate 213 such that the multilayer wire layer 345 of the third semiconductor substrate faces upward in FIG. 16.

Figure 17:
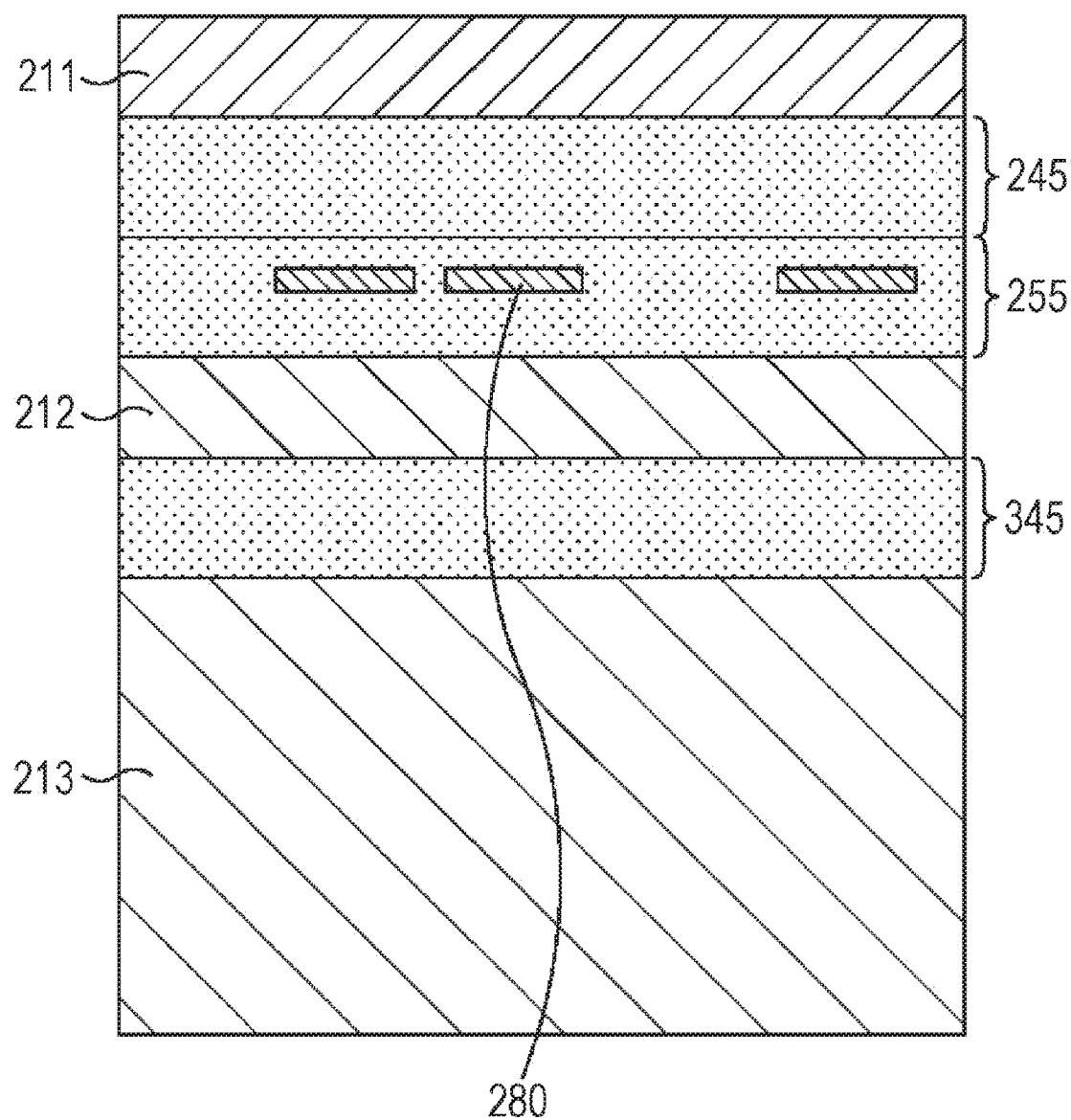
FIG. 17 is a diagram illustrating a manufacturing process of the solid-state imaging device shown in FIG. 12.

In addition, as shown in FIG. 17, the first semiconductor substrate 211 is thinned. In FIG. 17, the width of the first semiconductor substrate 211 in the vertical direction of FIG. 17 is reduced.

Figure 18:
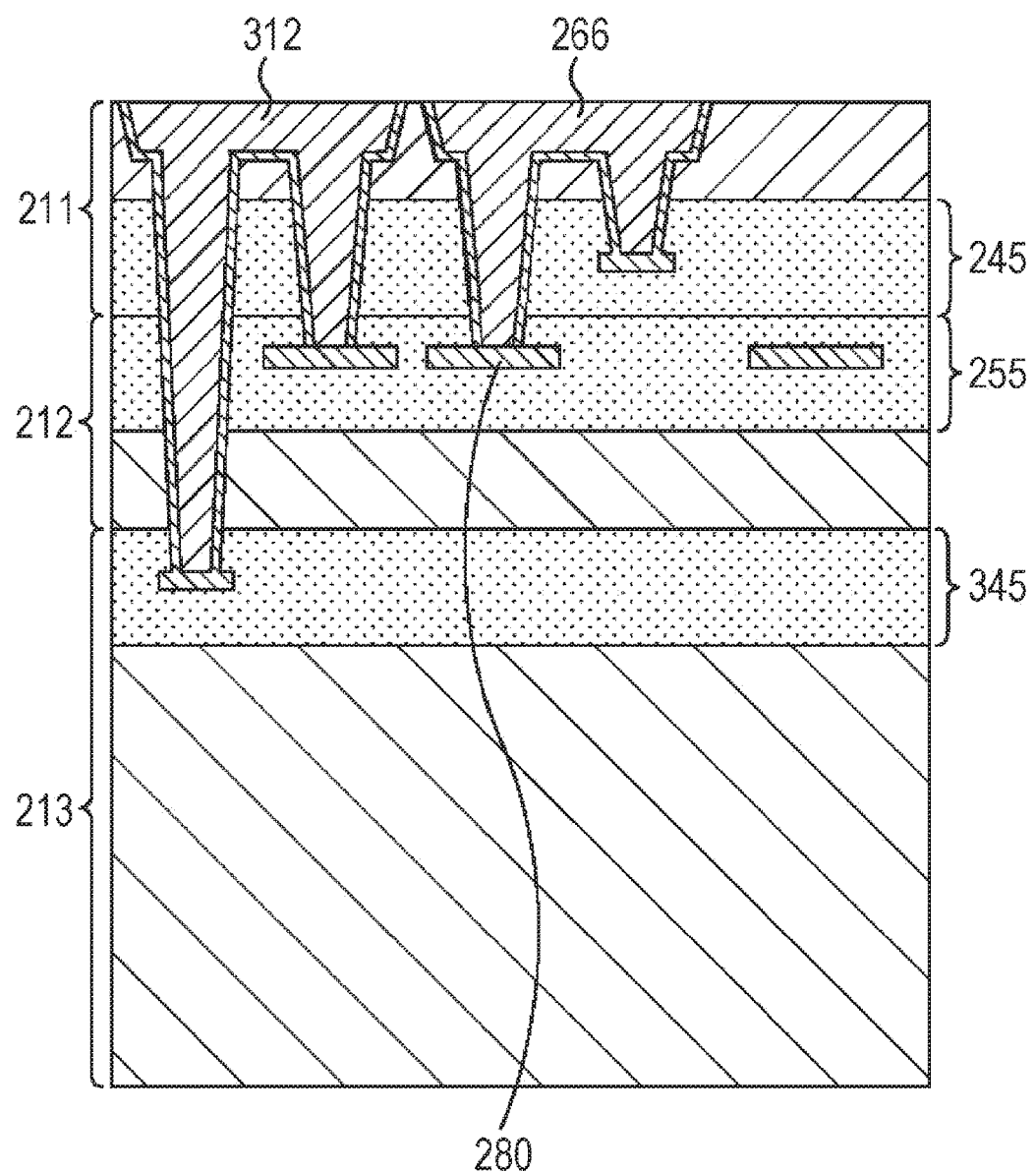
FIG. 18 is a diagram illustrating a manufacturing process of the solid-state imaging device shown in FIG. 12.

Next, as shown in FIG. 18, the contact 312 and the contact 266 are formed. At this time, a hole is provided which reaches the multilayer wire layer 245 from the light receiving surface of the first semiconductor substrate 211, and a hole is provided which reaches the aluminum pad 280 of the multilayer wire layer 255 from the light receiving surface, thereby forming the contact 266. In addition, a hole is provided which reaches the aluminum pad 280 of the multilayer wire layer 255 from the light receiving surface of the first semiconductor substrate 211, and a hole is provided which reaches the multilayer wire layer 345 from the light receiving surface, thereby forming the contact 312.

Figure 19:
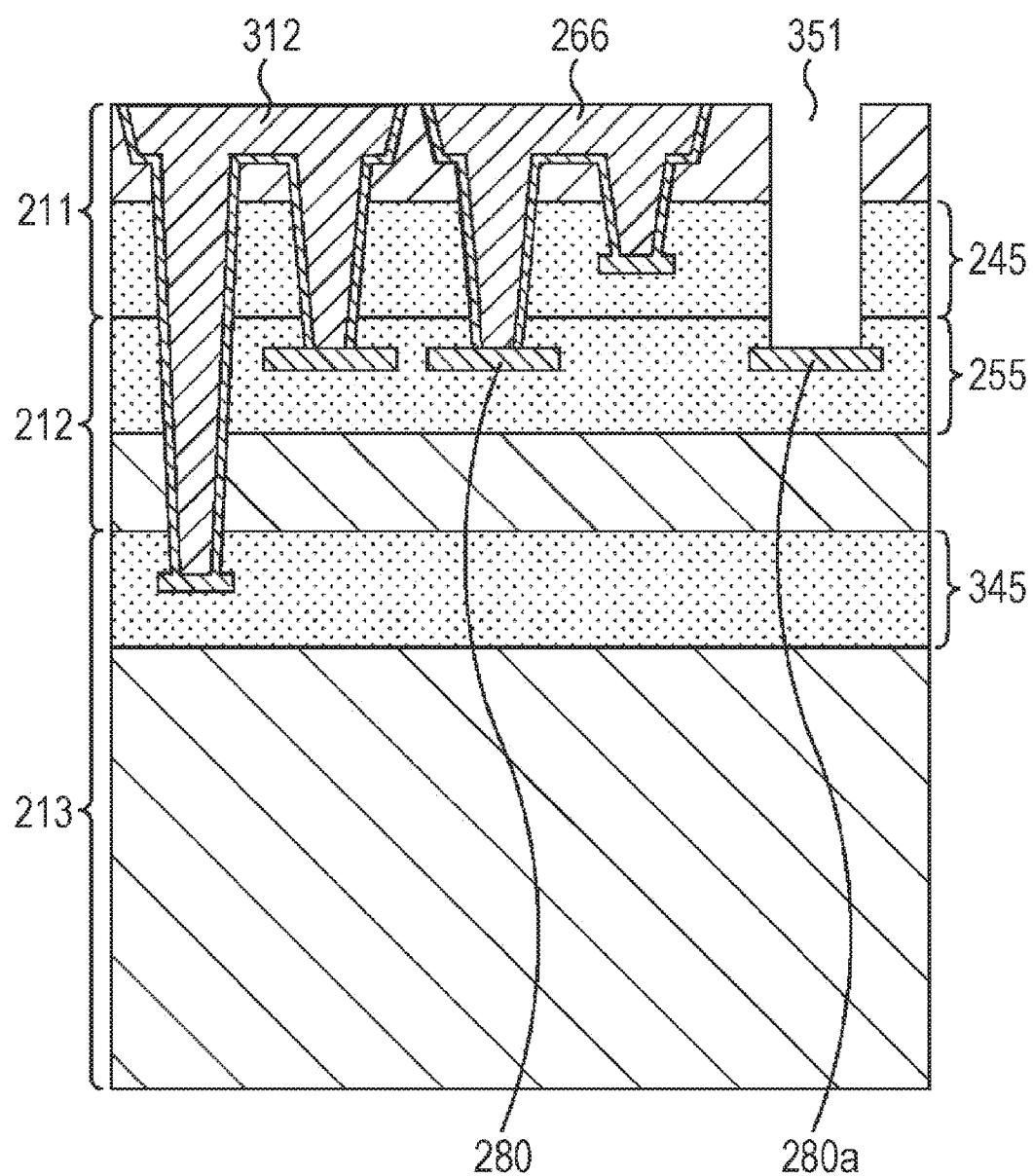
FIG. 19 is a diagram illustrating a manufacturing process of the solid-state imaging device shown in FIG. 12.

In addition, as shown in FIG. 19, the pad hole 351 is formed so as to reach the aluminum pad 280a from the rear surface side (light receiving surface side) of the first semiconductor substrate 211.

In this way, the solid-state imaging device described with reference to FIG. 12 is manufactured. Thus, it is possible to block light caused by hot carriers by the multilayer wire layer 255. In addition, the aluminum pad 280 is disposed in the multilayer wire layer 255 including the six wire layers, and thus it is easy to locate the aluminum pad 280 so as to block light caused by hot carriers without restricting a shape of the metal wire 250. Further, since the aluminum pad 280 is provided in the multilayer wire layer 255 of the second semiconductor substrate 212, it is unnecessary to provide an ESD circuit in the first semiconductor substrate 211 (because an ESD circuit is preferably formed in the second semiconductor substrate), and thus it is possible to manufacture a solid-state imaging device at a low cost.

Figure 20:
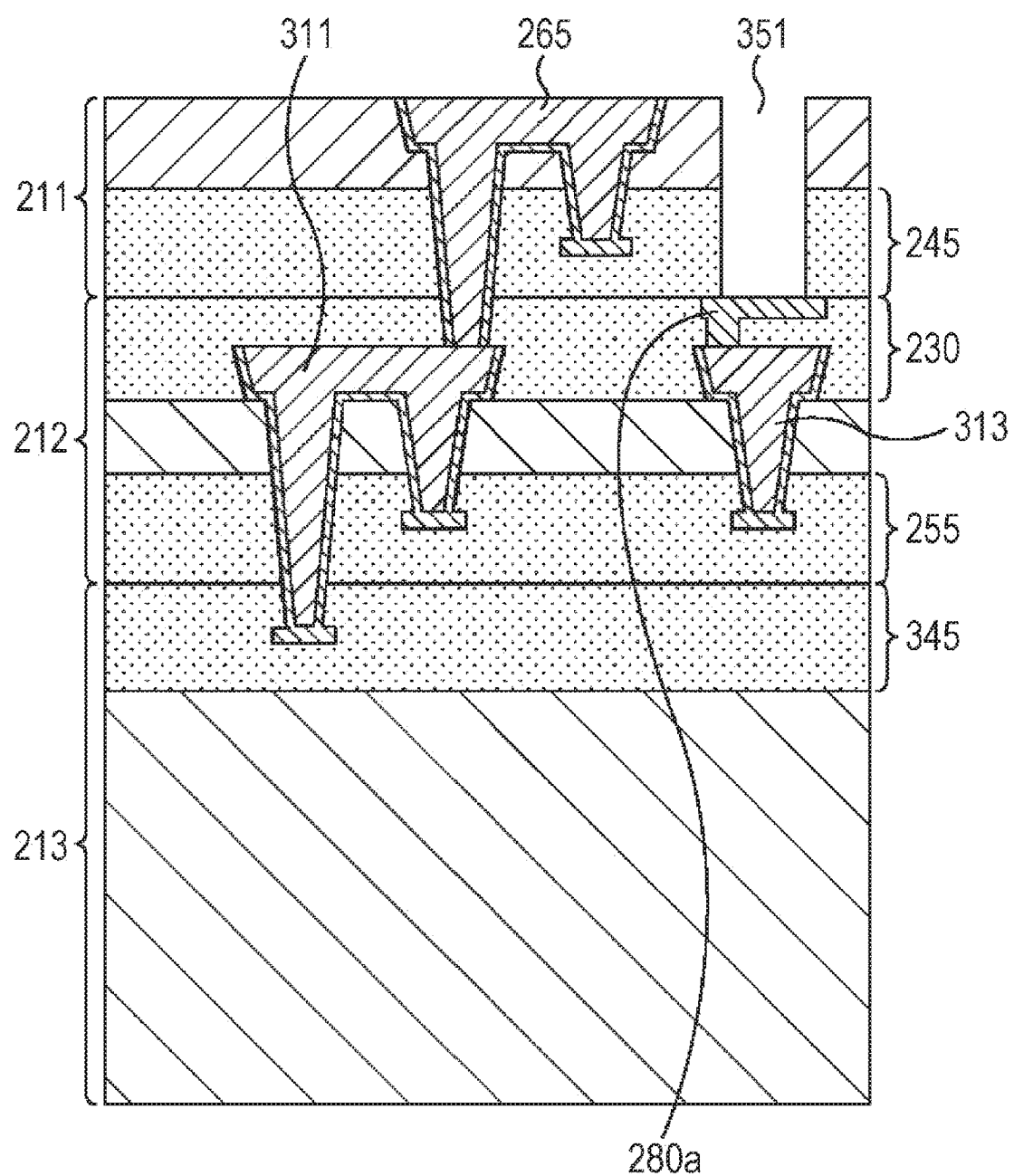
FIG. 20 is a schematic diagram of the cross-sectional view illustrating the configuration according to still another embodiment of the pixel portion of the solid-state imaging device to which the present technology is applied.

FIG. 20 is a schematic diagram of the cross-sectional view illustrating the configuration according to still another embodiment of the pixel portion of the solid-state imaging device to which the present technology is applied.

In the configuration shown in FIG. 20, in the same manner as in the case of FIG. 11, the multilayer wire layer 255 of the second semiconductor substrate faces the third semiconductor substrate 213 side (the lower side of FIG. 20), and the first semiconductor substrate 211 is joined to the second semiconductor substrate 212.

In addition, in the configuration shown in FIG. 20, in the same manner as in the case of FIG. 11, the contact 265 used for electrical connection between the first semiconductor substrate 211 and the second semiconductor substrate 212 and the contact 311 used for electrical connection between the second semiconductor substrate 212 and the third semiconductor substrate 213 are provided. The contact 265 and the contact 311 are respectively formed by a twin contact.

In addition, in the configuration shown in FIG. 20, unlike in the case of FIG. 11, an insulating film layer 230 is formed between the first semiconductor substrate 211 and the second semiconductor substrate 212. Further, the aluminum pad 280a is disposed in the insulating film layer 230, and the aluminum pad 280a is connected to a contact 313 which is connected to the multilayer wire layer 255 of the second semiconductor substrate 212.

Furthermore, in the configuration shown in FIG. 20, the pad hole 351 is formed in the first semiconductor substrate 211 so as to reach the aluminum pad 280a inside the insulating film layer 230 from the rear surface side (light receiving surface side) of the first semiconductor substrate 211.

In a case of the configuration shown in FIG. 20, since the aluminum pad 280 is provided in the insulating film layer 230, it is unnecessary to provide an ESD circuit in the first semiconductor substrate 211 (because an ESD circuit is preferably formed in the second semiconductor substrate), and thus it is possible to manufacture a solid-state imaging device at a low cost.

Next, a manufacturing process of the solid-state imaging device shown in FIG. 20 will be described.

Figure 21:
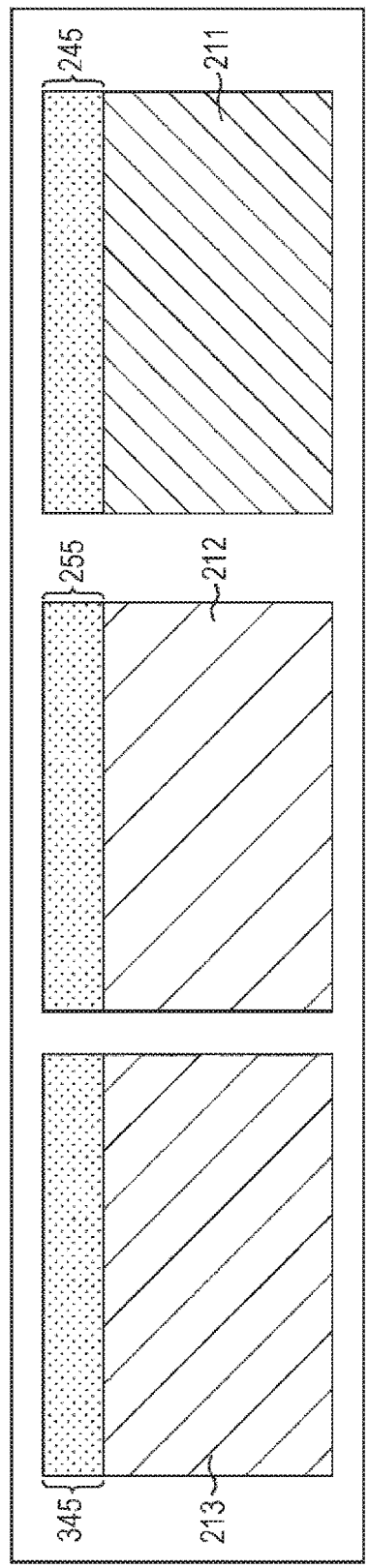
FIG. 21 is a diagram illustrating a manufacturing process of the solid-state imaging device shown in FIG. 20.

First, as shown in FIG. 21, the first semiconductor substrate 211, the second semiconductor substrate 212, and the third semiconductor substrate 213 are prepared which are respectively provided with the multilayer wire layers. As shown in FIG. 21, the first semiconductor substrate 211 is provided with the multilayer wire layer 245, the second semiconductor substrate 212 is provided with the multilayer wire layer 255, and the third semiconductor substrate 213 is provided with the multilayer wire layer 345.

In addition, as shown in FIG. 21, the aluminum pad 280 is not formed in the multilayer wire layer 255 of the second semiconductor substrate 212.

Figure 22:
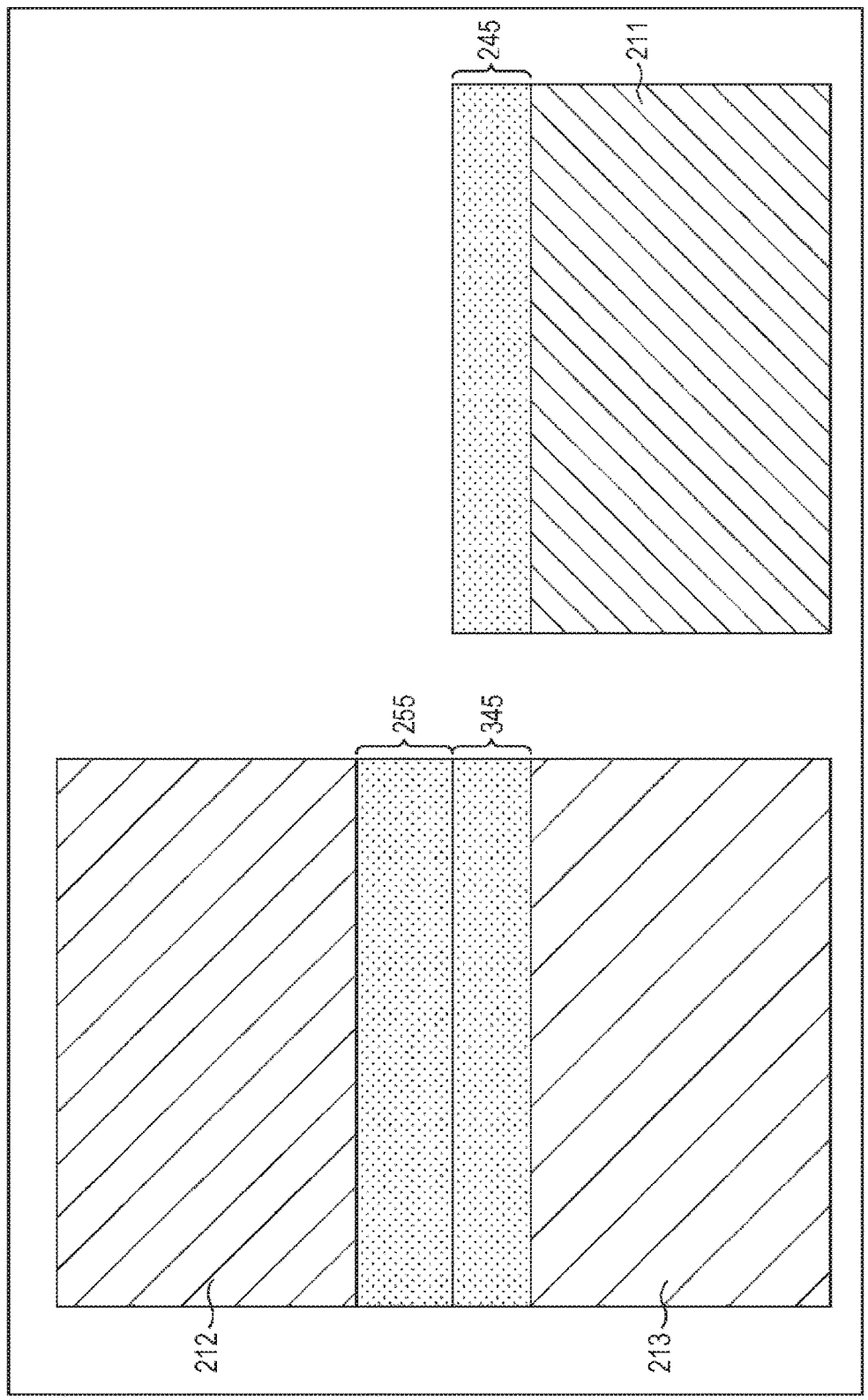
FIG. 22 is a diagram illustrating a manufacturing process of the solid-state imaging device shown in FIG. 20.

Next, as shown in FIG. 22, the second semiconductor substrate 212 is joined to the third semiconductor substrate 213. At this time, the second semiconductor substrate 212 is joined to the third semiconductor substrate 213 such that the multilayer wire layer 255 and the multilayer wire layer 345 face each other.

Figure 23:
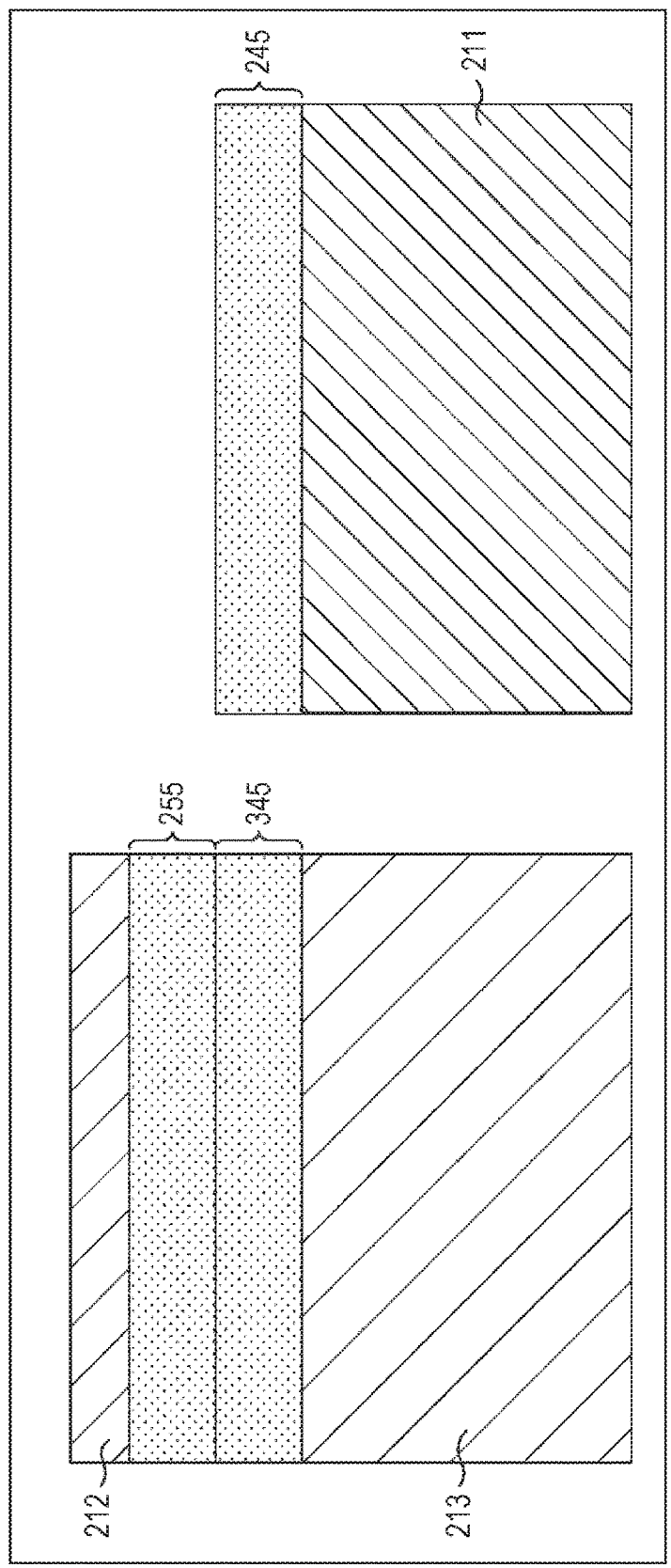
FIG. 23 is a diagram illustrating a manufacturing process of the solid-state imaging device shown in FIG. 20.

In addition, as shown in FIG. 23, the second semiconductor substrate 212 is thinned. In FIG. 23, the width of the second semiconductor substrate 212 in the vertical direction of FIG. 23 is reduced.

Figure 24:
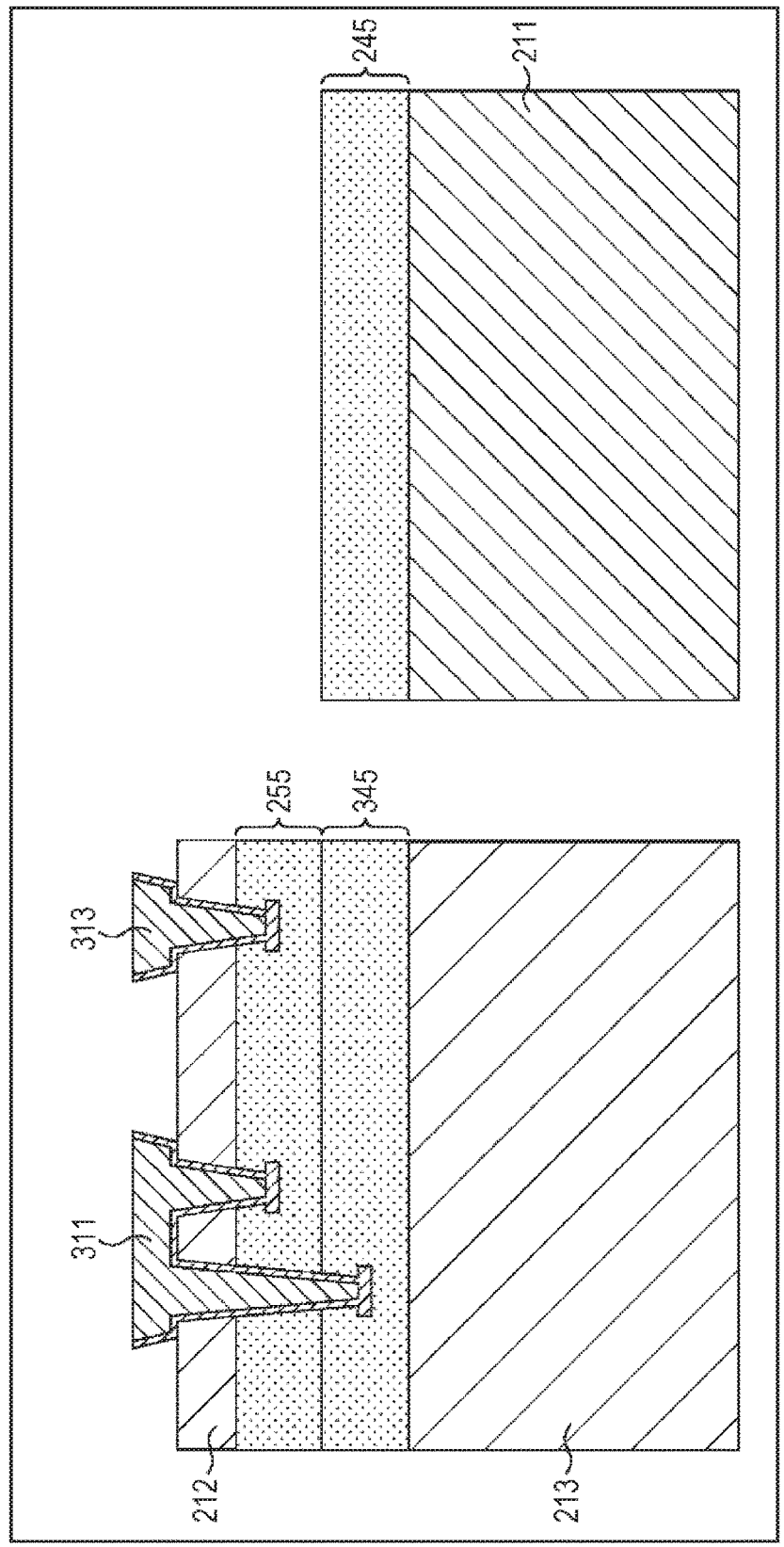
FIG. 24 is a diagram illustrating a manufacturing process of the solid-state imaging device shown in FIG. 20.

Next, as shown in FIG. 24, the contact 311 and the contact 313 are formed. At this time, a hole is provided which reaches the multilayer wire layer 345 from the upper surface of the second semiconductor substrate 212 in FIG. 24, and a hole is provided which reaches the multilayer wire layer 255 from the upper surface of the second semiconductor substrate 212 in FIG. 24, thereby forming the contact 311. In addition, a hole is provided which reaches the multilayer wire layer 255 from the upper surface of the second semiconductor substrate 212 in FIG. 24, thereby forming the contact 313.

Figure 25:
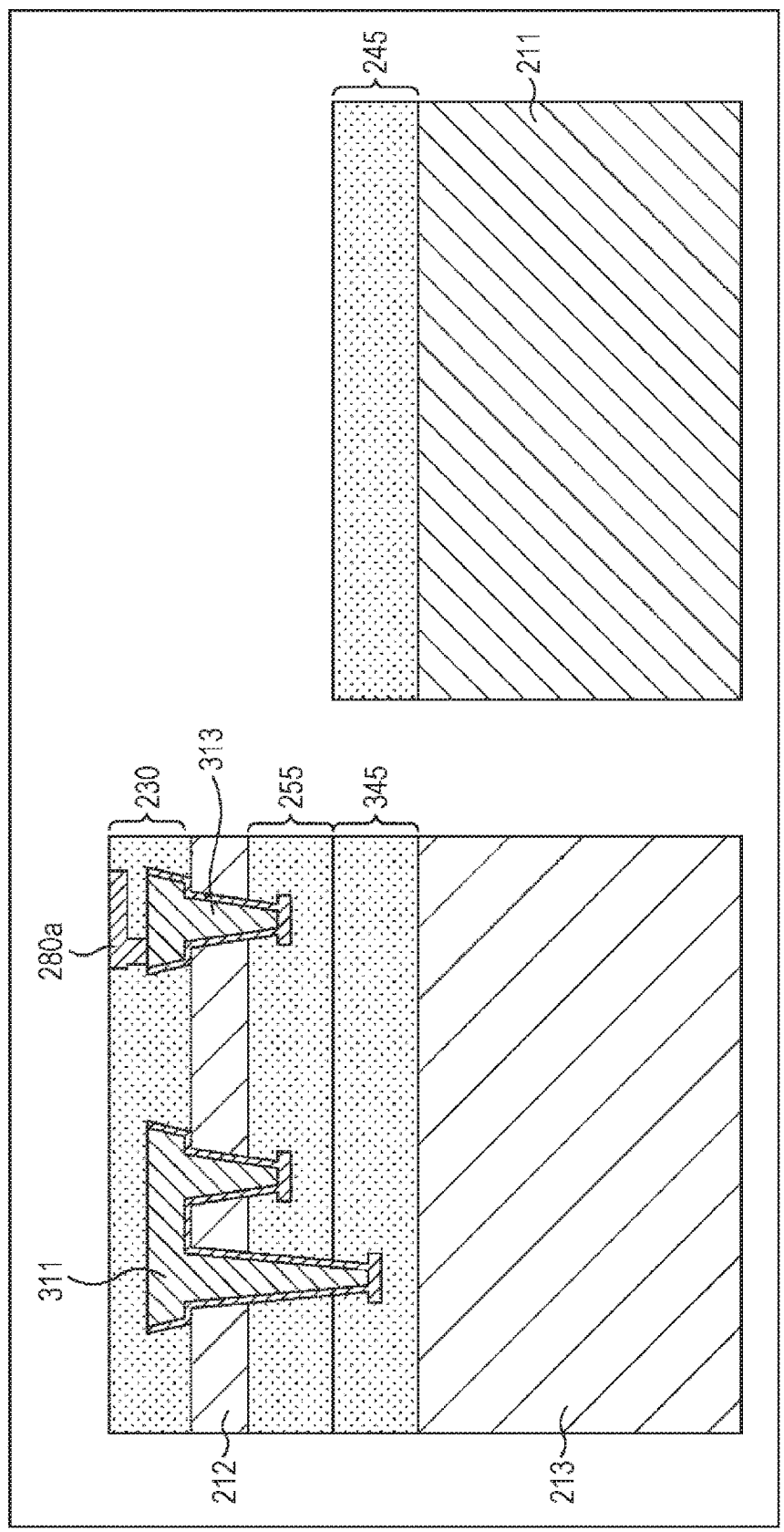
FIG. 25 is a diagram illustrating a manufacturing process of the solid-state imaging device shown in FIG. 20.

In addition, as shown in FIG. 25, the aluminum pad 280a is formed, and the insulating film layer 230 is formed. As shown in FIG. 25, the aluminum pad 280a is formed so as to be connected to the upper end of the contact 313 in FIG. 25. In addition, the insulating film layer 230 is formed around the aluminum pad 280a in the upper surface of the second semiconductor substrate 212 in FIG. 25.

Figure 26:
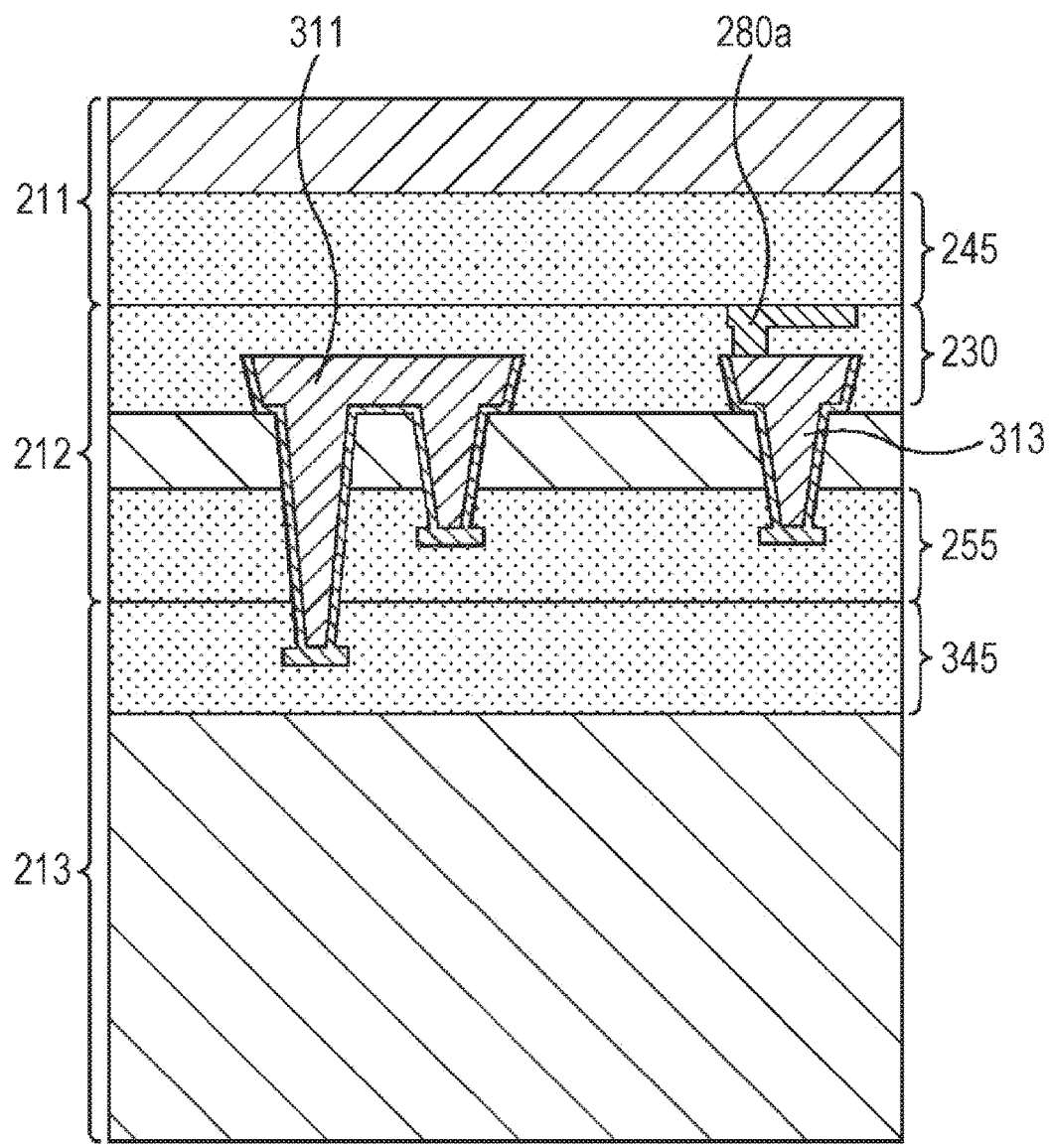
FIG. 26 is a diagram illustrating a manufacturing process of the solid-state imaging device shown in FIG. 20.

Next, as shown in FIG. 26, the first semiconductor substrate 211 is joined to the second semiconductor substrate 212 (more accurately, the insulating film layer 230). At this time, the first semiconductor substrate 211 is joined to the second semiconductor substrate 212 such that the multilayer wire layer 245 comes into contact with the insulating film layer 230.

In addition, the first semiconductor substrate 211 is thinned. In FIG. 26, the width of the first semiconductor substrate 211 in the vertical direction of FIG. 26 is reduced.

Figure 27:
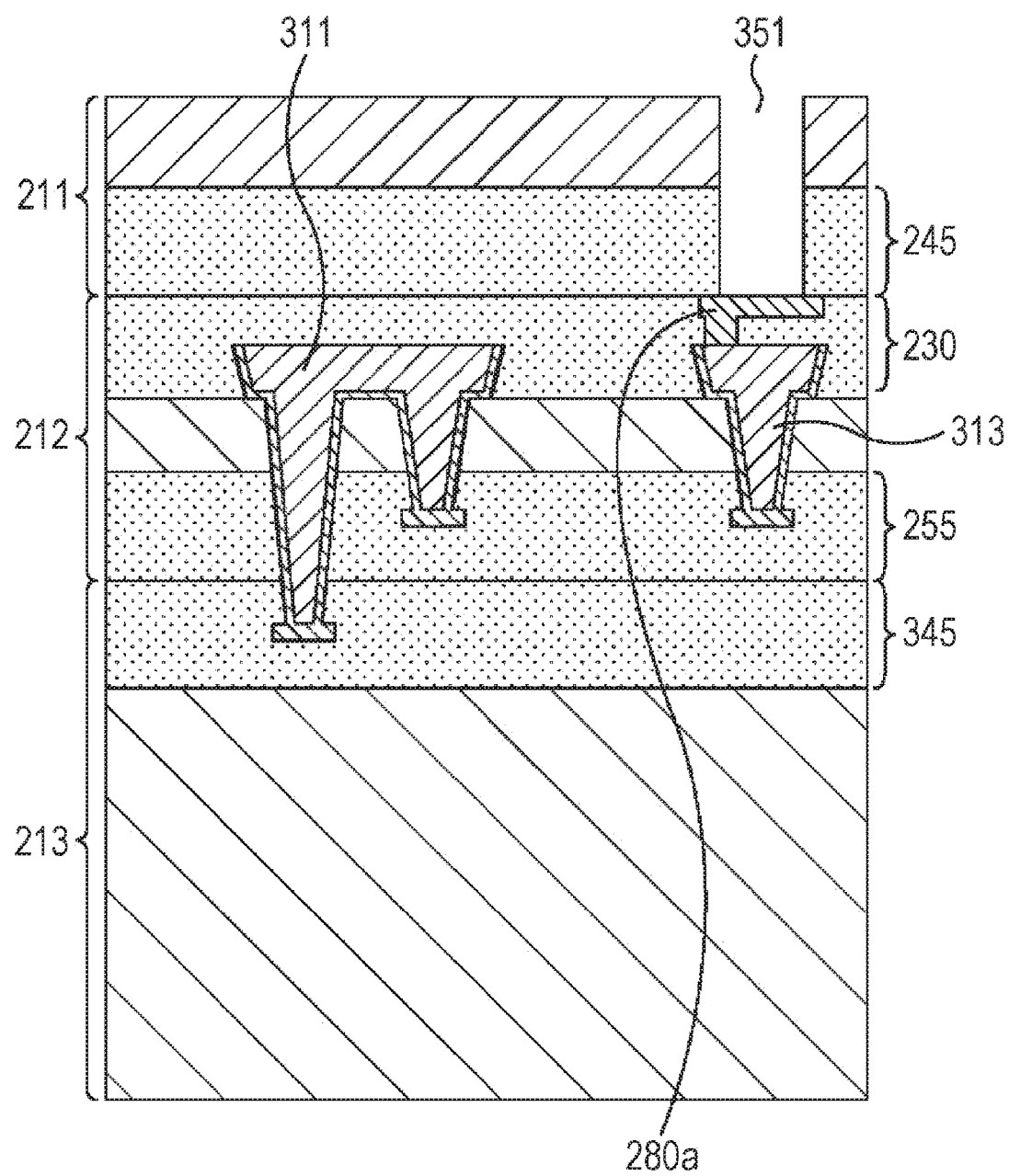
FIG. 27 is a diagram illustrating a manufacturing process of the solid-state imaging device shown in FIG. 20.

In addition, as shown in FIG. 27, the pad hole 351 is formed so as to reach the aluminum pad 280a from the rear surface side (light receiving surface side) of the first semiconductor substrate 211. Successively, a hole is provided which reaches the multilayer wire layer 245 from the light receiving surface of the first semiconductor substrate 211, and a hole is provided which reaches the contact 311 from the light receiving surface, thereby forming the contact 265.

In this way, the solid-state imaging device described with reference to FIG. 20 is manufactured. Further, since the aluminum pad 280 is provided in the insulating film layer 230, it is unnecessary to provide an ESD circuit in the first semiconductor substrate 211 (because an ESD circuit is preferably formed in the second semiconductor substrate), and thus it is possible to manufacture a solid-state imaging device at a low cost.

Figure 28:
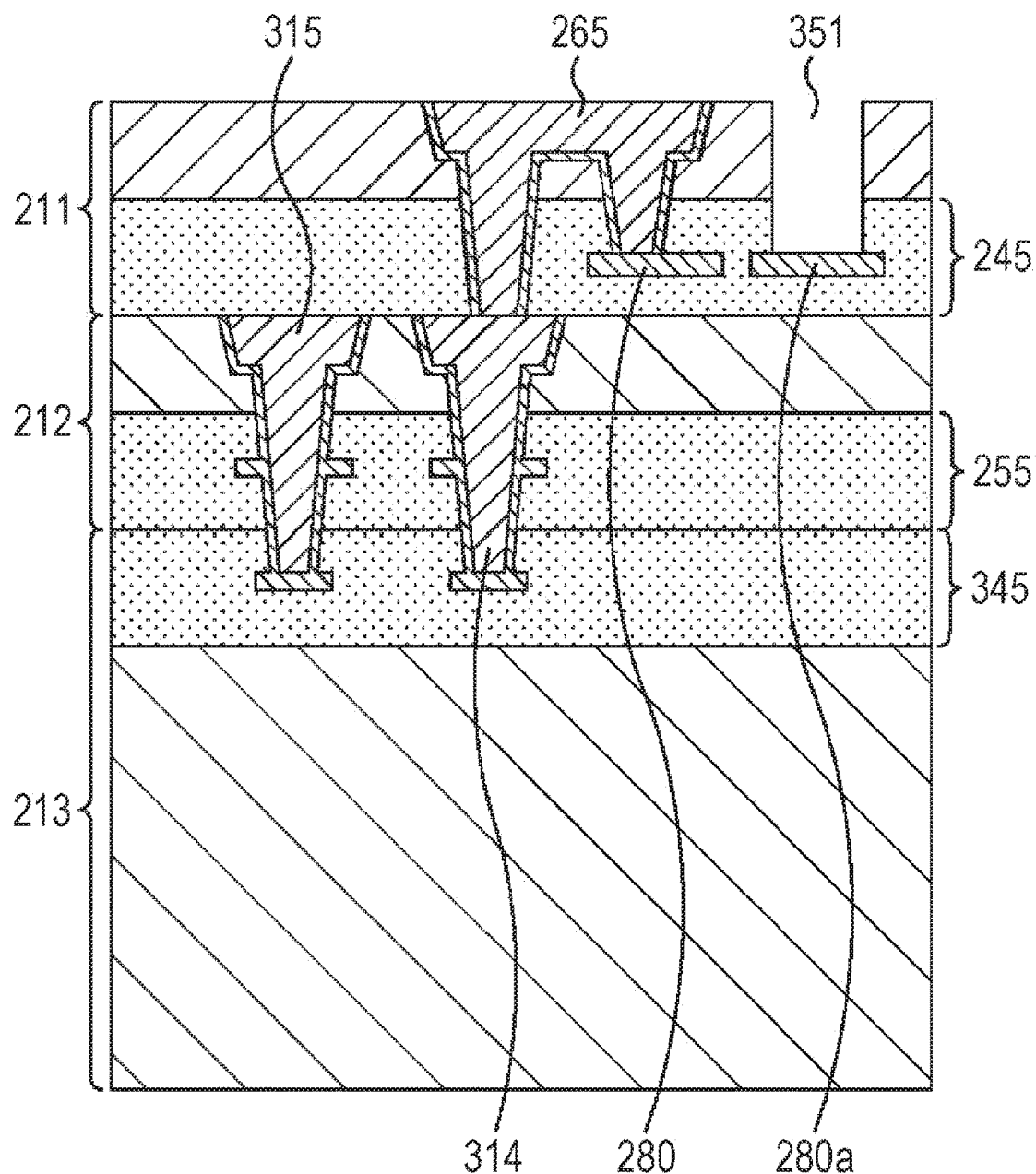
FIG. 28 is a schematic diagram of the cross-sectional view illustrating the configuration according to still another embodiment of the pixel portion of the solid-state imaging device to which the present technology is applied.

FIG. 28 is a schematic diagram of the cross-sectional view illustrating the configuration according to still another embodiment of the pixel portion of the solid-state imaging device to which the present technology is applied.

In the configuration shown in FIG. 28, in the same manner as in the case of FIG. 11, the pad hole 351 is formed in the first semiconductor substrate 211 so as to reach the aluminum pad 280a from the rear surface side (light receiving surface side) of the first semiconductor substrate 211. In addition, the aluminum pad 280 is formed in the multilayer wire layer 245 of the first semiconductor substrate 211.

In the configuration shown in FIG. 28, in the same manner as in the case of FIG. 11, the multilayer wire layer 255 of the second semiconductor substrate faces the third semiconductor substrate 213 side (the lower side of FIG. 28), and the first semiconductor substrate 211 is joined to the second semiconductor substrate 212.

In addition, in the configuration shown in FIG. 28, in the same manner as in the case of FIG. 11, the contact 265 used for electrical connection between the first semiconductor substrate 211 and the second semiconductor substrate 212 is provided. The contact 265 is formed by a twin contact.

In the configuration shown in FIG. 28, unlike in the case of FIG. 11, the contact 311 used for electrical connection between the second semiconductor substrate 212 and the third semiconductor substrate 213 is not provided. On the other hand, the contact 314 and the contact 315 used for electrical connection between the second semiconductor substrate 212 and the third semiconductor substrate 213 are provided.

Each of the contact 314 and the contact 315 is formed by providing a through hole which penetrates through the second semiconductor substrate 212 and reaches the multilayer wire layer 345 of the third semiconductor substrate 213 and embedding a conductor therein. In other words, each of the contact 314 and the contact 315 connects the multilayer wire layer 255 of the second semiconductor substrate 212 to the multilayer wire layer 345 of the third semiconductor substrate 213 by providing only a single through hole.

In other words, each of the contact 314 and the contact 315 is formed by a shared contact.

In the configuration shown in FIG. 28, it is possible to simplify manufacturing steps and to reduce the area occupying the substrate by using the shared contact.

Although the description has been provided here of a case where the shared contact is used for electrical connection between the second semiconductor substrate 212 and the third semiconductor substrate 213, the shared contact may be used for electrical connection between the first semiconductor substrate 211 and the second semiconductor substrate 212.

In addition, similarly, in the solid-state imaging device with the configuration described with reference to FIG. 11, 12 or 20, the shared contact may also be used for electrical connection between the first semiconductor substrate 211 and the second semiconductor substrate 212, or electrical connection between the second semiconductor substrate 212 and the third semiconductor substrate 213.

In other words, in the configuration (FIG. 11) in which the aluminum pad 280 is provided in the multilayer wire layer 245 of the first semiconductor substrate 211, the shared contact may be used for electrical connections between the respective semiconductor substrates. In addition, in the configuration (FIG. 12) in which the aluminum pad 280 is provided in the multilayer wire layer 255 of the second semiconductor substrate 212, the shared contact may be used for electrical connections between the respective semiconductor substrates. Further, in the configuration (FIG. 20) in which the aluminum pad 280 is provided in the insulating film layer 230, the shared contact may be used for electrical connections between the respective semiconductor substrates.

Figure 29:
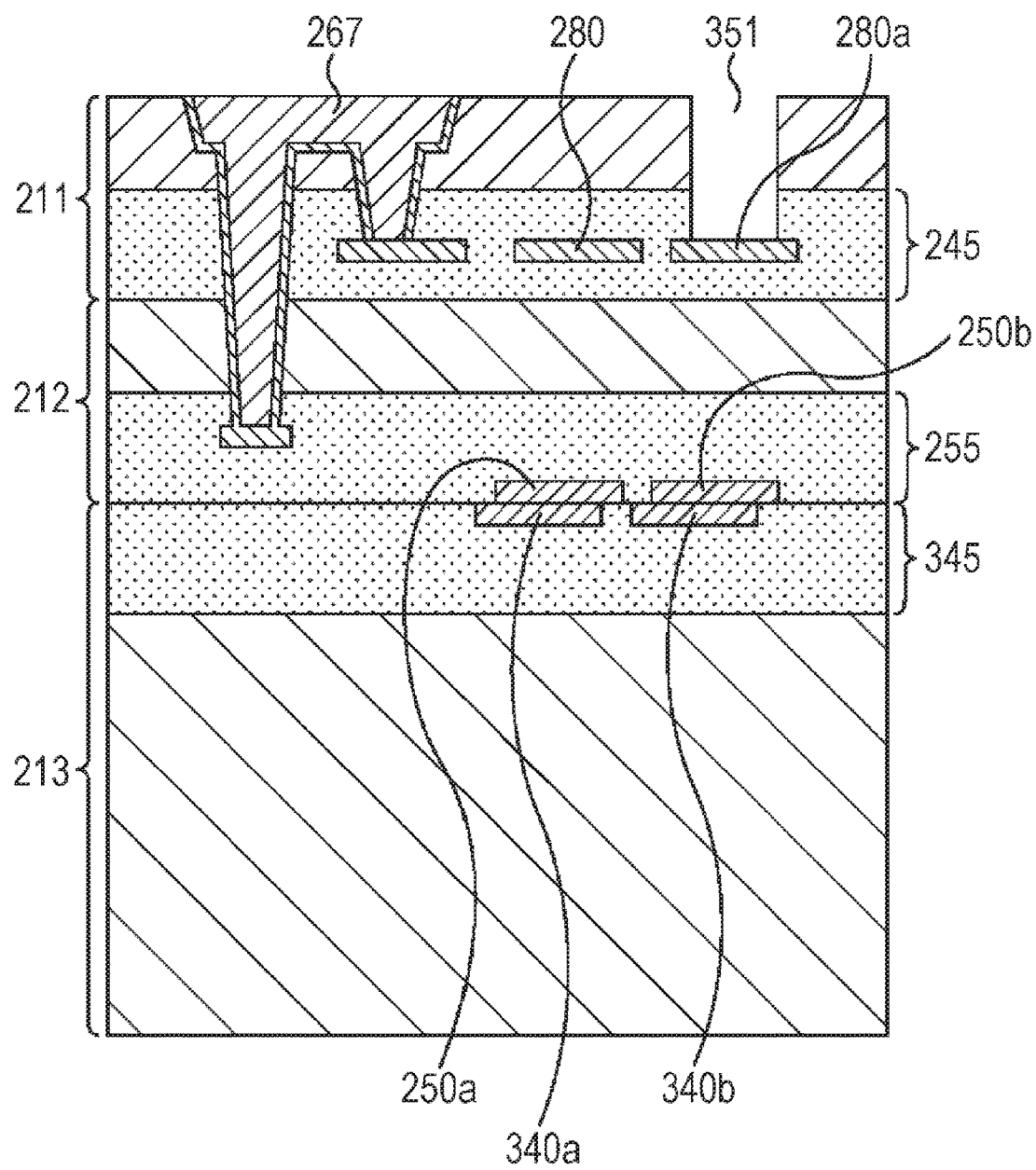
FIG. 29 is a schematic diagram of the cross-sectional view illustrating the configuration according to still another embodiment of the pixel portion of the solid-state imaging device to which the present technology is applied.

FIG. 29 is a schematic diagram of the cross-sectional view illustrating the configuration according to still another embodiment of the pixel portion of the solid-state imaging device to which the present technology is applied.

In the configuration shown in FIG. 29, in the same manner as in the case of FIG. 11, the pad hole 351 is formed in the first semiconductor substrate 211 so as to reach the aluminum pad 280a from the rear surface side (light receiving surface side) of the first semiconductor substrate 211. In addition, the aluminum pad 280 is formed in the multilayer wire layer 245 of the first semiconductor substrate 211.

In the configuration shown in FIG. 29, in the same manner as in the case of FIG. 11, the multilayer wire layer 255 of the second semiconductor substrate faces the third semiconductor substrate 213 side (the lower side of FIG. 29), and the first semiconductor substrate 211 is joined to the second semiconductor substrate 212.

In addition, in the configuration shown in FIG. 29, a contact 267 used for an electrical connection between the second semiconductor substrate 212 and the third semiconductor substrate 213 is provided. The contact 267 is formed by a twin contact.

Further, in the configuration shown in FIG. 29, a metal wire 250a in the multilayer wire layer 255 of the second semiconductor substrate 212 is directly bonded to a metal wire 340a in the multilayer wire layer 345 of the third semiconductor substrate 213. Furthermore, a metal wire 250b in the multilayer wire layer 255 is directly bonded to a metal wire 340b in the multilayer wire layer 345. Thus, the second semiconductor substrate 212 is electrically connected to the third semiconductor substrate 213.

In other words, in a case of the configuration shown in FIG. 29, not a contact but direct bonding is used for electrical connection between the second semiconductor substrate 212 and the third semiconductor substrate 213. Therefore, it is possible to simplify manufacturing steps and to reduce the area occupying the substrate.

In addition, the direct bonding is disclosed in detail in, for example, Japanese Unexamined Patent Application Publication No. 2013-033900 which is hereby incorporated herein by reference in its entirety for all that it teaches and for all purposes.

Next, a manufacturing process of the solid-state imaging device shown in FIG. 29 will be described.

Figure 30:
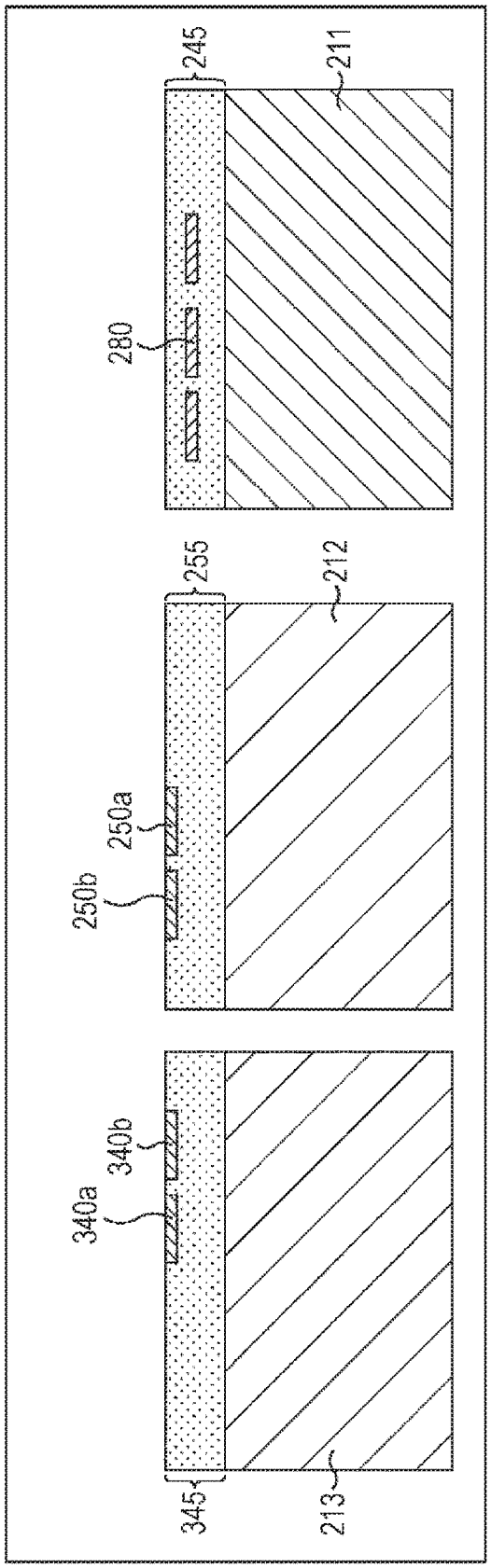
FIG. 30 is a diagram illustrating a manufacturing process of the solid-state imaging device shown in FIG. 29.

First, as shown in FIG. 30, the first semiconductor substrate 211, the second semiconductor substrate 212, and the third semiconductor substrate 213 are prepared which are respectively provided with the multilayer wire layers. As shown in FIG. 30, the first semiconductor substrate 211 is provided with the multilayer wire layer 245, the second semiconductor substrate 212 is provided with the multilayer wire layer 255, and the third semiconductor substrate 213 is provided with the multilayer wire layer 345.

In addition, as shown in FIG. 30, the aluminum pad 280 is formed in the multilayer wire layer 245 of the first semiconductor substrate 211. Further, the metal wire 250 and the metal wire 250b are formed in the multilayer wire layer 255 of the second semiconductor substrate, and the metal wire 340a and the metal wire 340b are formed in the multilayer wire layer 345 of the third semiconductor substrate.

Figure 31:
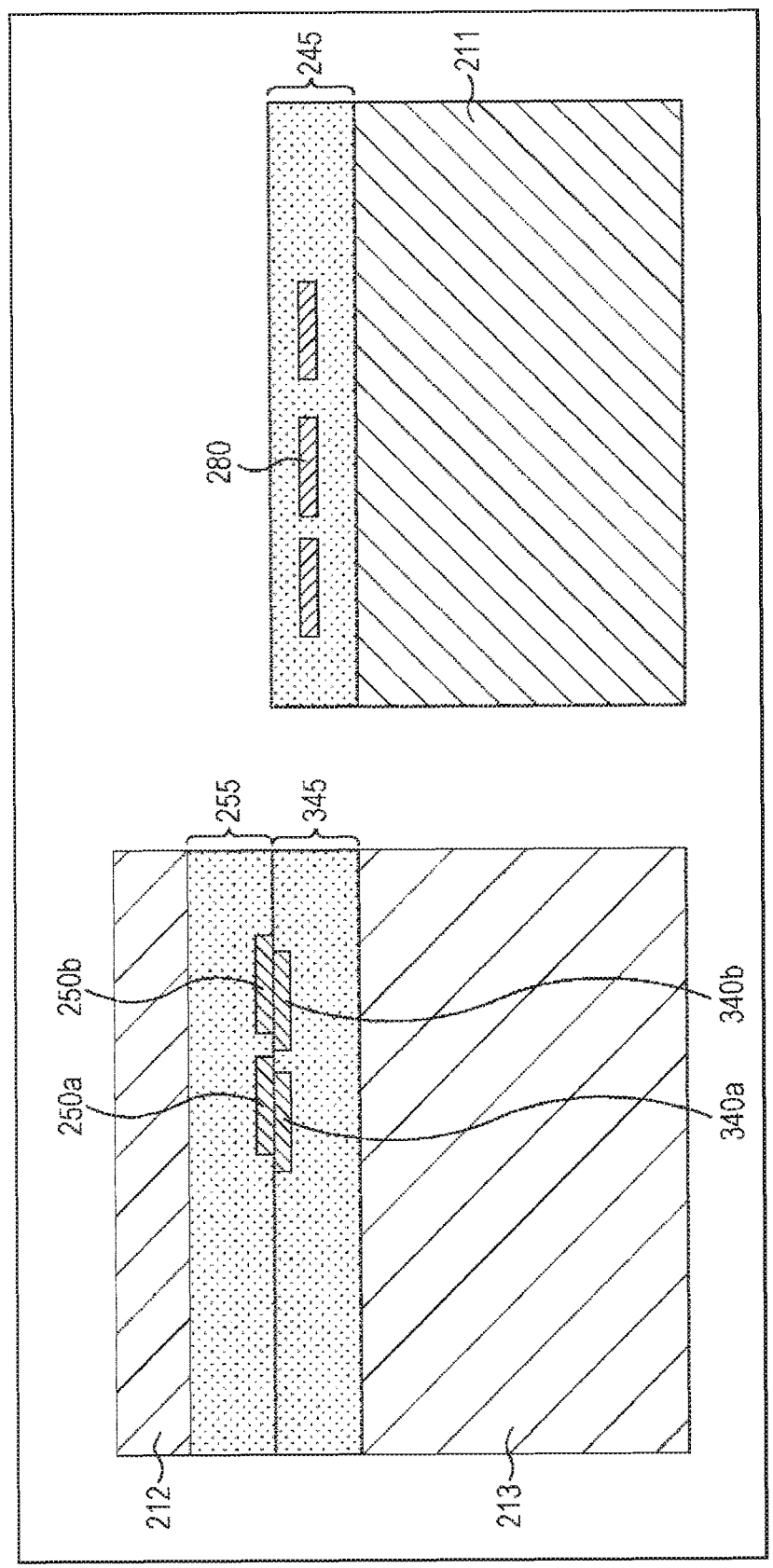
FIG. 31 is a diagram illustrating a manufacturing process of the solid-state imaging device shown in FIG. 29.

Next, as shown in FIG. 31, the second semiconductor substrate 212 is joined to the third semiconductor substrate 213. At this time, the second semiconductor substrate 212 is joined to the third semiconductor substrate 213 such that the multilayer wire layer 255 and the multilayer wire layer 345 face each other. In addition, the metal wire 250a is directly bonded to the metal wire 340a, and the metal wire 250b is directly bonded to the metal wire 340b.

In addition, the second semiconductor substrate 212 is thinned. In FIG. 31, the width of the second semiconductor substrate 212 in the vertical direction of FIG. 31 is reduced.

Figure 32:
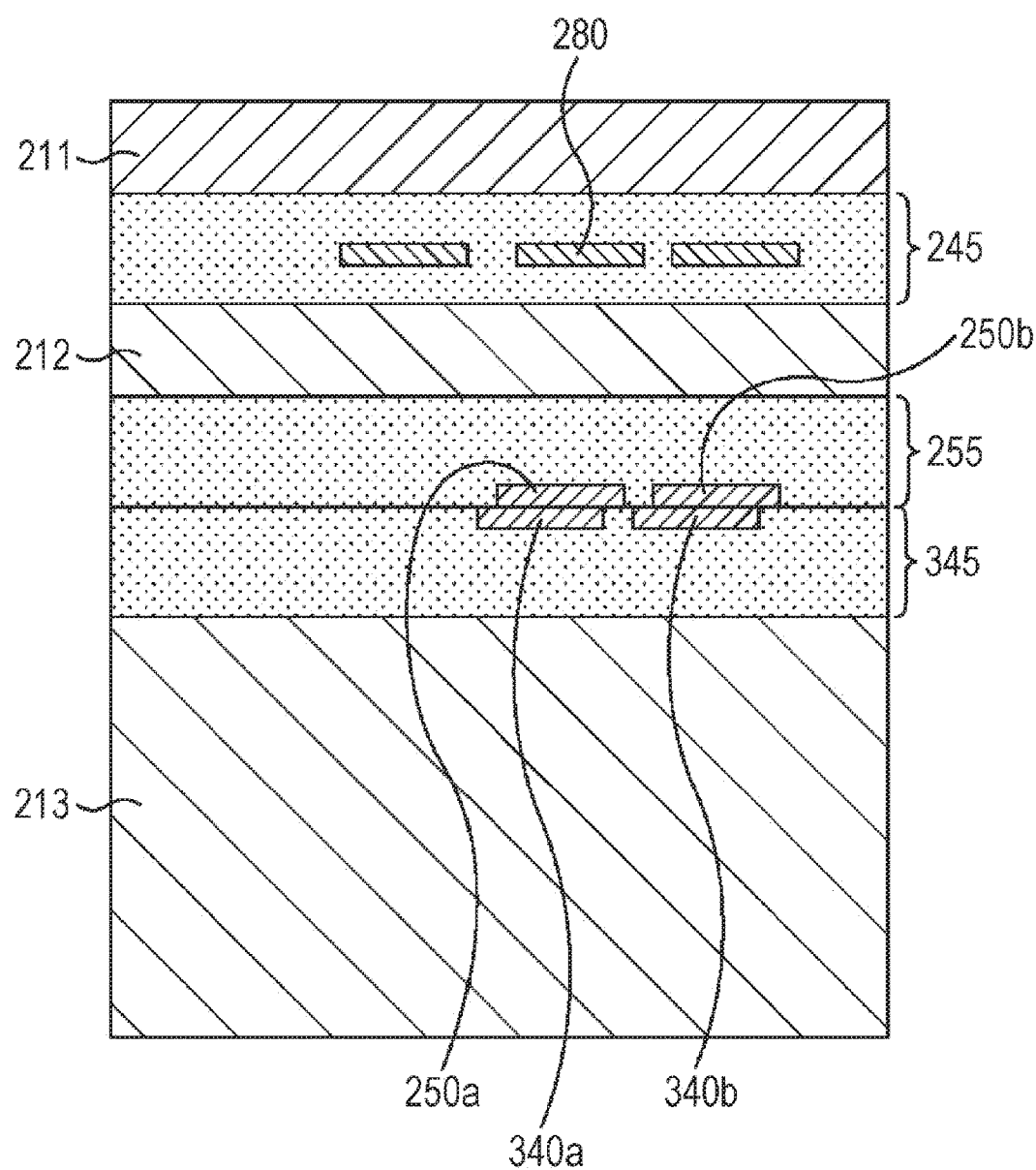
FIG. 32 is a diagram illustrating a manufacturing process of the solid-state imaging device shown in FIG. 29.

Next, as shown in FIG. 32, the first semiconductor substrate 211 is joined to the second semiconductor substrate 212. At this time, the multilayer wire layer 255 of the second semiconductor substrate faces the third semiconductor substrate 213 side (the lower side of FIG. 32), and the first semiconductor substrate 211 is joined to the second semiconductor substrate 212.

In addition, the first semiconductor substrate 211 is thinned. In FIG. 32, the width of the first semiconductor substrate 211 in the vertical direction of FIG. 32 is reduced.

Figure 33:
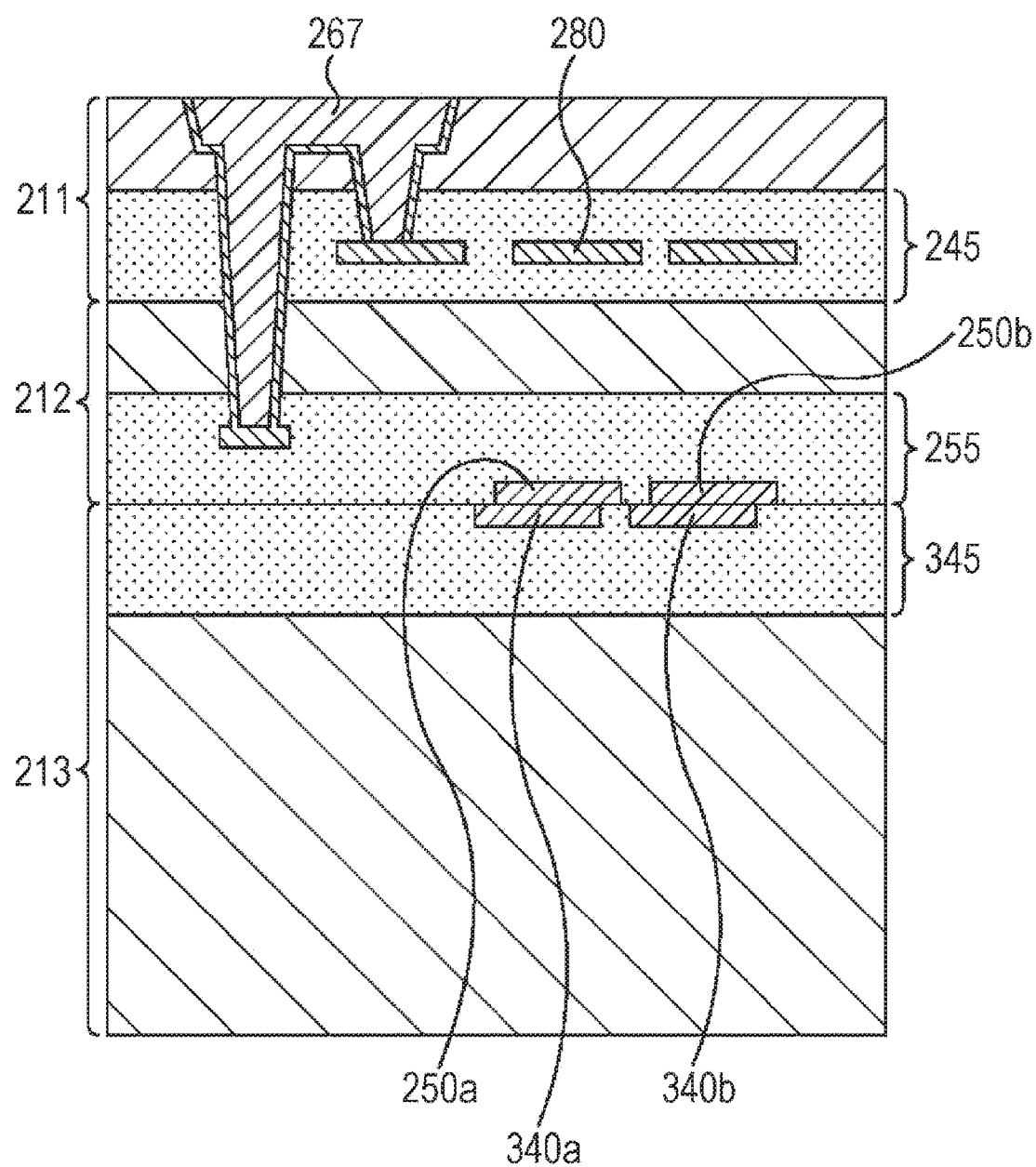
FIG. 33 is a diagram illustrating a manufacturing process of the solid-state imaging device shown in FIG. 29.

Next, the contact 267 is formed as shown in FIG. 33. At this time, a hole is provided which reaches the multilayer wire layer 245 from the light receiving surface of the first semiconductor substrate 211, and a hole is provided which reaches the multilayer wire layer 255 from the light receiving surface, thereby forming the contact 267.

Figure 34:
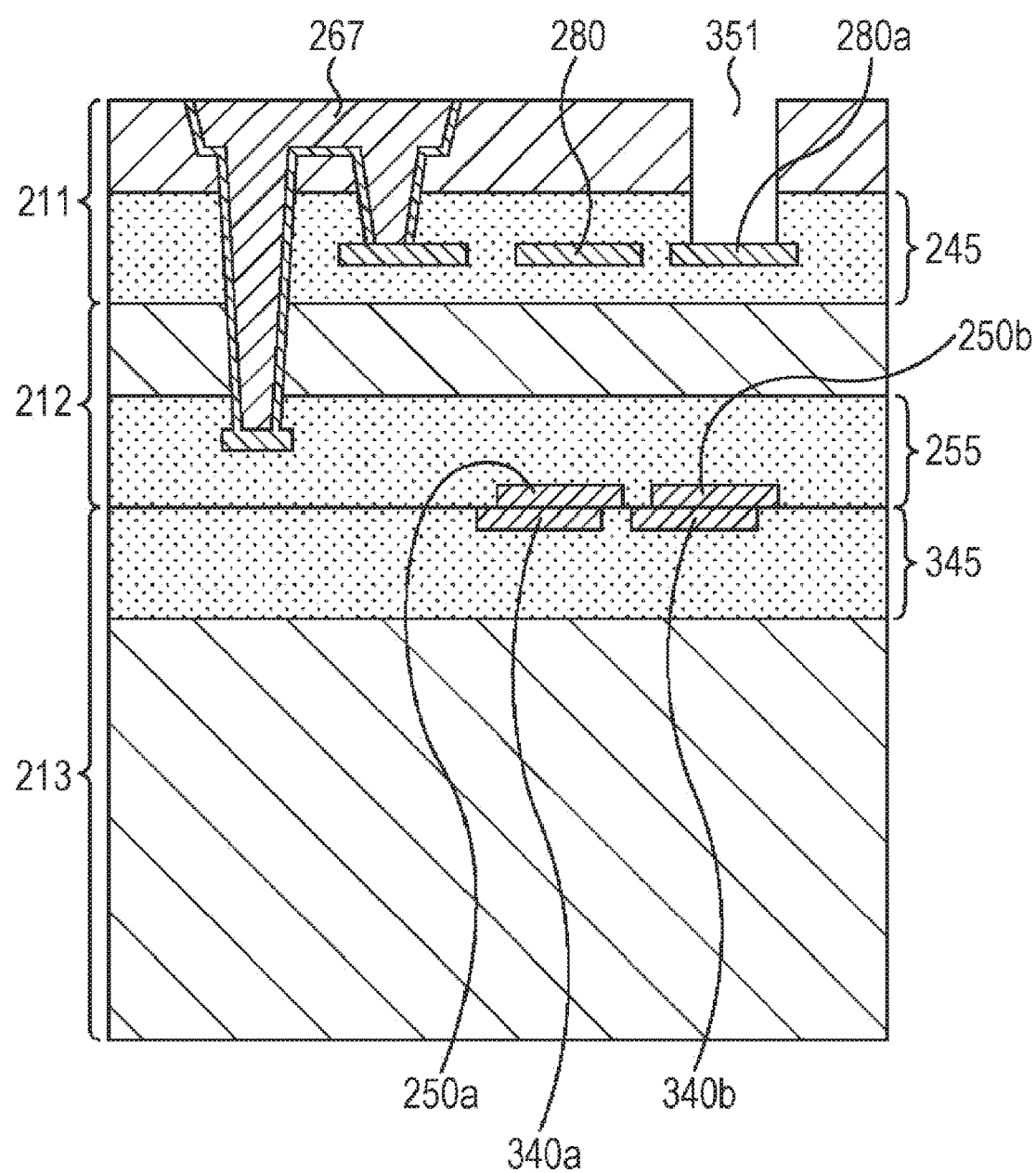
FIG. 34 is a diagram illustrating a manufacturing process of the solid-state imaging device shown in FIG. 29.

In addition, as shown in FIG. 34, the pad hole 351 is formed so as to reach the aluminum pad 280a from the rear surface side (light receiving surface side) of the first semiconductor substrate 211.

In this way, the solid-state imaging device described with reference to FIG. 29 is manufactured. Since not a contact but direction bonding is used for electrical connection between the second semiconductor substrate 212 and the third semiconductor substrate 213, it is possible to simplify manufacturing steps and to reduce the area occupying the substrate.

Although the description has been provided here of a case where the direct bonding is used as an electrical connection between the second semiconductor substrate 212 and the third semiconductor substrate 213, the direct bonding may be used as an electrical connection between the first semiconductor substrate 211 and the second semiconductor substrate 212.

Similarly, in the solid-state imaging device with the configuration described with reference to FIG. 11, 12 or 20, the direct bonding may also be used as an electrical connection between the first semiconductor substrate 211 and the second semiconductor substrate 212, or as an electrical connection between the second semiconductor substrate 212 and the third semiconductor substrate 213.

In other words, in the configuration (FIG. 11) in which the aluminum pad 280 is provided in the multilayer wire layer 245 of the first semiconductor substrate 211, the direct bonding may be used as an electrical connection between the respective semiconductor substrates. In addition, in the configuration (FIG. 12) in which the aluminum pad 280 is provided in the multilayer wire layer 255 of the second semiconductor substrate 212, the direct bonding may be used as an electrical connection between the respective semiconductor substrates. Further, in the configuration (FIG. 20) in which the aluminum pad 280 is provided in the insulating film layer 230, the direct bonding may be used as an electrical connection between the respective semiconductor substrates.

Figure 35:
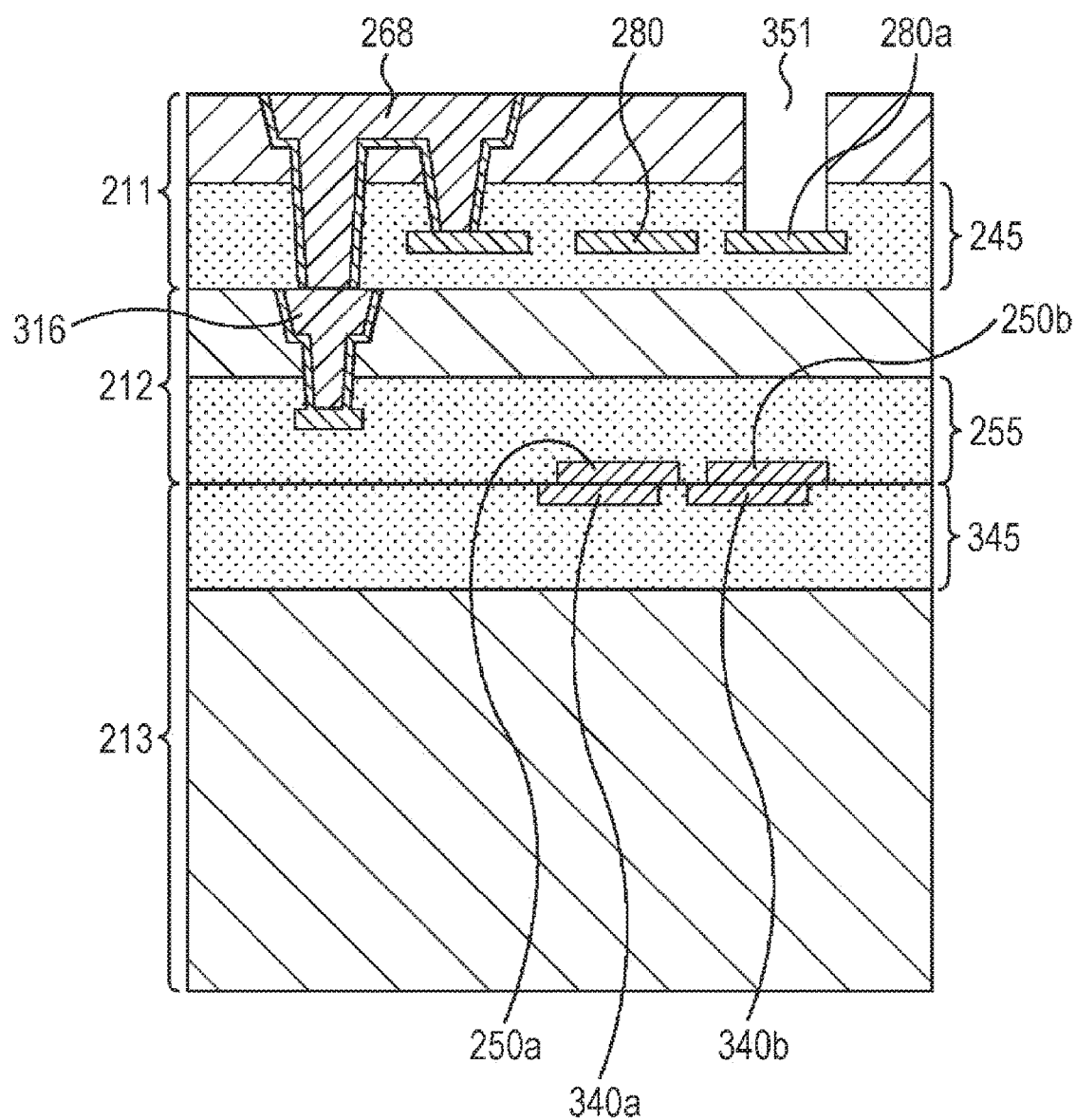
FIG. 35 is a schematic diagram of the cross-sectional view illustrating the configuration according to still another embodiment of the pixel portion of the solid-state imaging device to which the present technology is applied.

FIG. 35 is a schematic diagram of the cross-sectional view illustrating the configuration according to still another embodiment of the pixel portion of the solid-state imaging device to which the present technology is applied.

In the configuration shown in FIG. 35, unlike in the case of FIG. 29, a contact 268 and a contact 316 used as an electrical connection between the first semiconductor substrate 211 and the second semiconductor substrate 212 are provided. In other words, in a case of the configuration shown in FIG. 35, the lower left end of the contact 268 in FIG. 35 is connected to the upper end of the contact 316 in FIG. 35, and thereby the first semiconductor substrate 211 is electrically connected to the second semiconductor substrate 212. In addition, the contact 268 is formed by a twin contact.

In the configuration shown in FIG. 35, it is unnecessary to provide a hole which reaches the multilayer wire layer 255 from the light receiving surface, for example, unlike in forming the contact 267 of FIG. 29. For this reason, it is possible to more simply form a contact.

A configuration of the other elements in FIG. 35 is the same as in the case of FIG. 29, and detailed description thereof will be made.

Next, a manufacturing process of the solid-state imaging device shown in FIG. 35 will be described.

Figure 36:
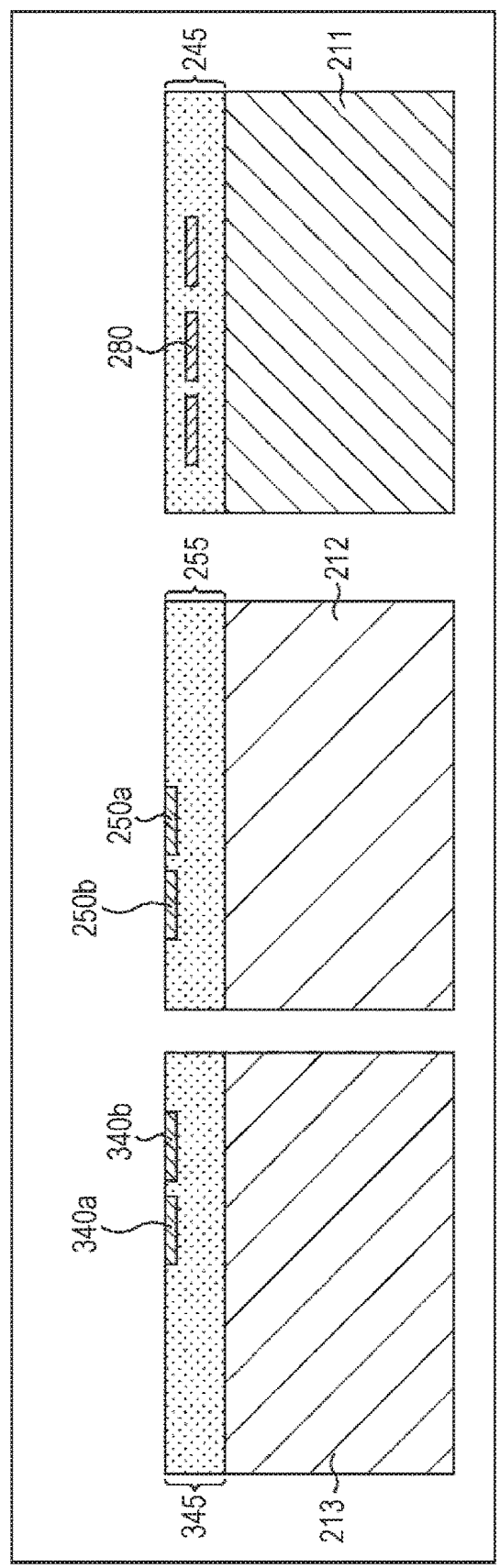
FIG. 36 is a diagram illustrating a manufacturing process of the solid-state imaging device shown in FIG. 35.

First, as shown in FIG. 36, the first semiconductor substrate 211, the second semiconductor substrate 212, and the third semiconductor substrate 213 are prepared which are respectively provided with the multilayer wire layers. As shown in FIG. 36, the first semiconductor substrate 211 is provided with the multilayer wire layer 245, the second semiconductor substrate 212 is provided with the multilayer wire layer 255, and the third semiconductor substrate 213 is provided with the multilayer wire layer 345.

In addition, as shown in FIG. 36, the aluminum pad 280 is formed in the multilayer wire layer 245 of the first semiconductor substrate 211. Further, the metal wire 250a and the metal wire 250b are formed in the multilayer wire layer 255 of the second semiconductor substrate, and the metal wire 340a and the metal wire 340b are formed in the multilayer wire layer 345 of the third semiconductor substrate.

Figure 37:
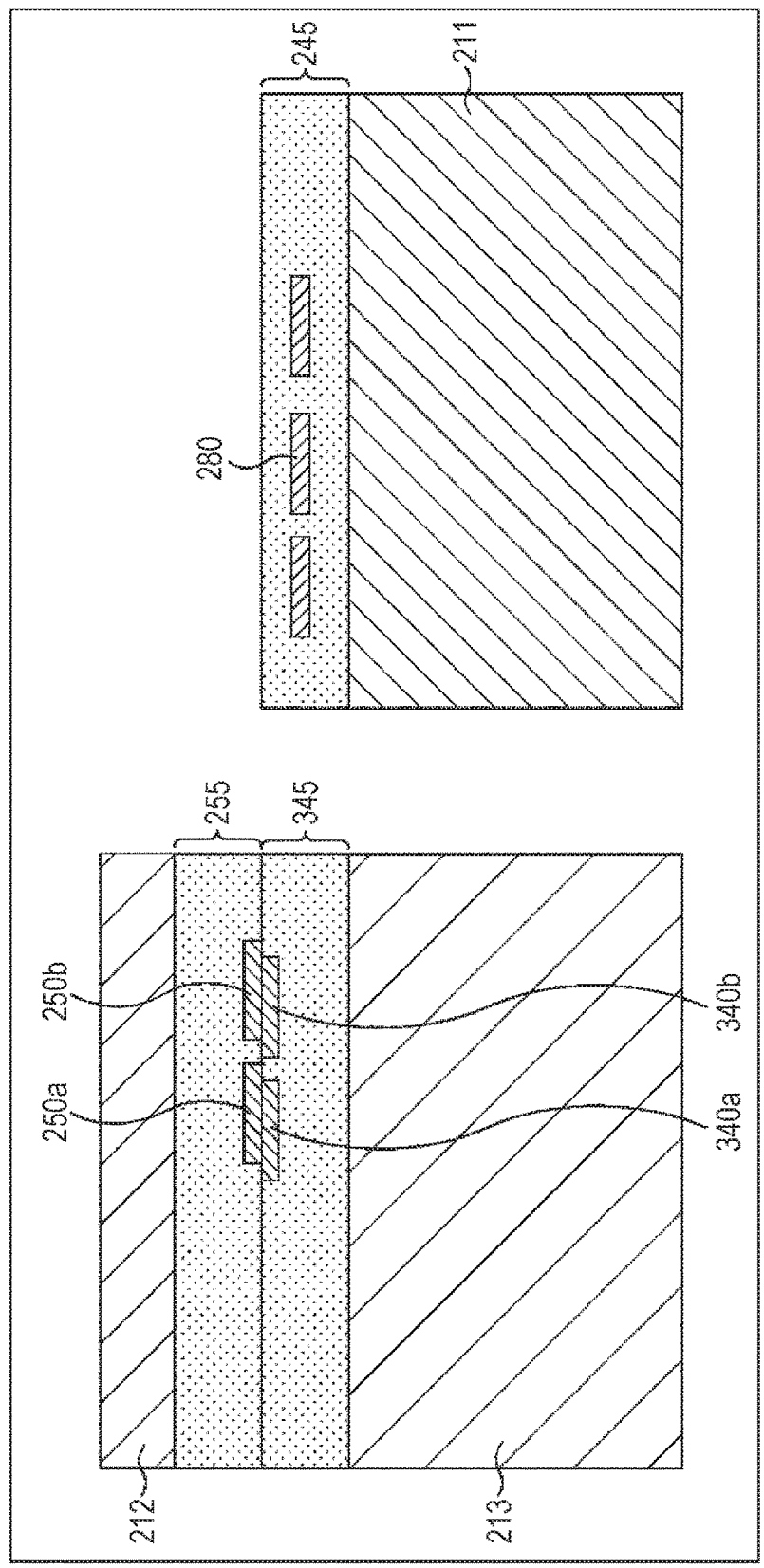
FIG. 37 is a diagram illustrating a manufacturing process of the solid-state imaging device shown in FIG. 35.

Next, as shown in FIG. 37, the second semiconductor substrate 212 is joined to the third semiconductor substrate 213. At this time, the second semiconductor substrate 212 is joined to the third semiconductor substrate 213 such that the multilayer wire layer 255 and the multilayer wire layer 345 face each other. In addition, the metal wire 250a is directly bonded to the metal wire 340a, and the metal wire 250b is directly bonded to the metal wire 340b.

In addition, the second semiconductor substrate 212 is thinned. In FIG. 37, the width of the second semiconductor substrate 212 in the vertical direction of FIG. 31 is reduced.

Figure 38:
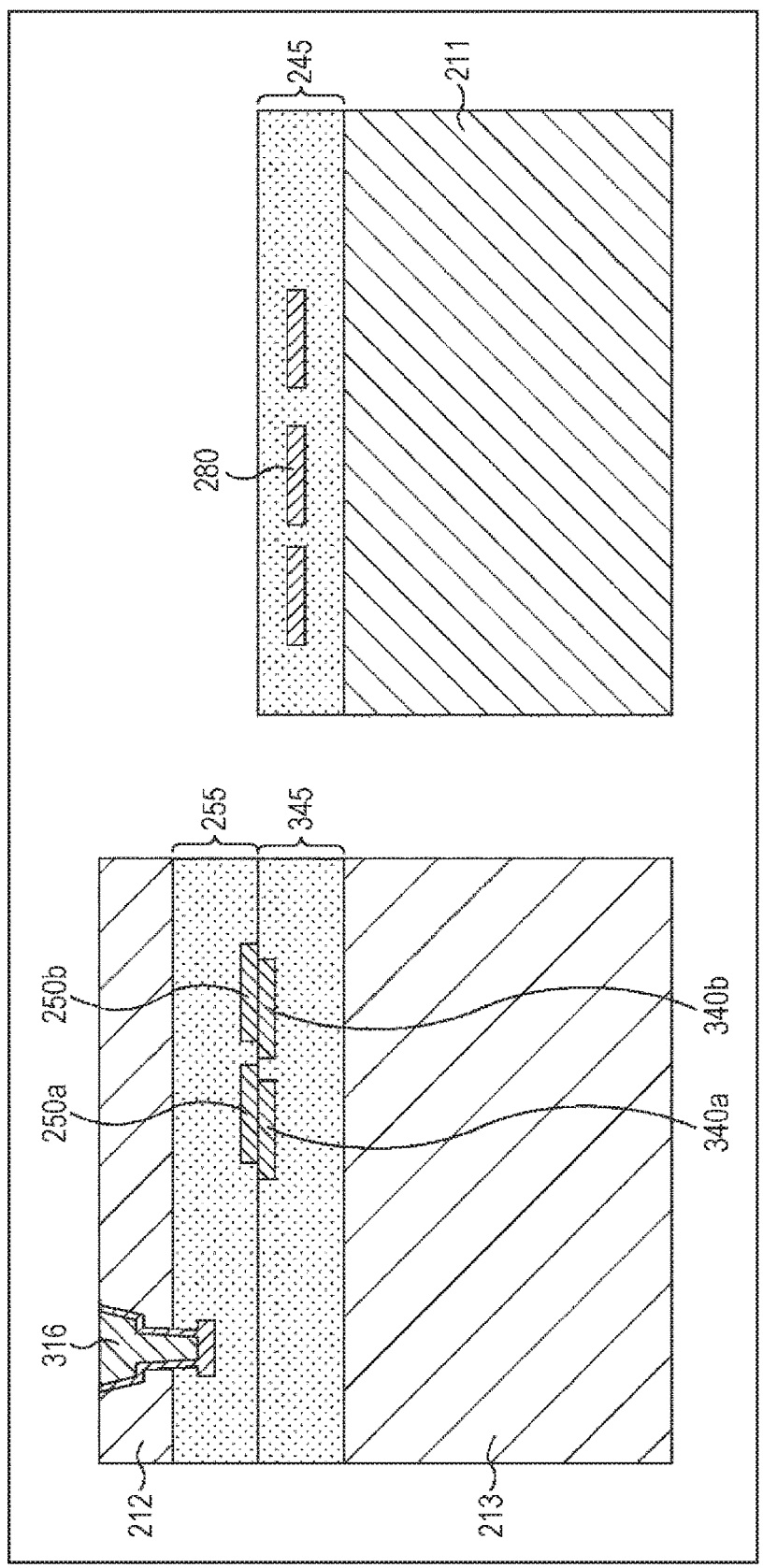
FIG. 38 is a diagram illustrating a manufacturing process of the solid-state imaging device shown in FIG. 35.

In addition, as shown in FIG. 38, the contact 316 is formed. At this time, a hole is provided which reaches the multilayer wire layer 255 from the upper surface of the second semiconductor substrate 212 in FIG. 38 so as to form the contact 316.

Figure 39:
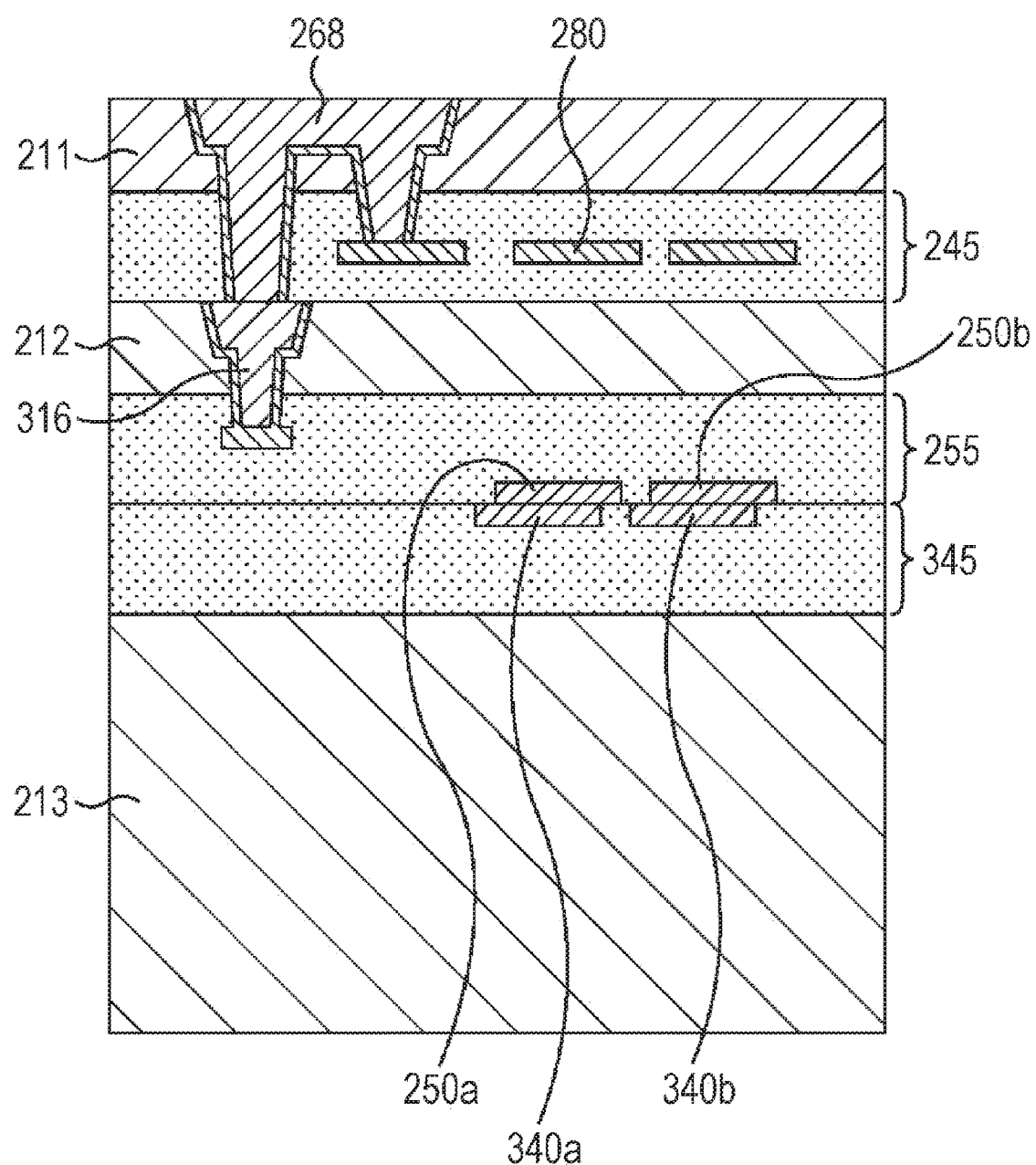
FIG. 39 is a diagram illustrating a manufacturing process of the solid-state imaging device shown in FIG. 35.

Next, as shown in FIG. 39, the first semiconductor substrate 211 is joined to the second semiconductor substrate 212. At this time, the first semiconductor substrate 211 is joined to the second semiconductor substrate 212 such that the rear surface of the first semiconductor substrate 211 becomes a light receiving surface.

In addition, the first semiconductor substrate 211 is thinned. In FIG. 39, the width of the first semiconductor substrate 211 in the vertical direction of FIG. 39 is reduced.

Further, a hole is provided which reaches the upper surface of the second semiconductor substrate in FIG. 39 from the light receiving surface of the first semiconductor substrate 211, and a hole is provided which reaches the aluminum pad 280 of the multilayer wire layer 245 from the light receiving surface, thereby forming the contact 268.

Figure 40:
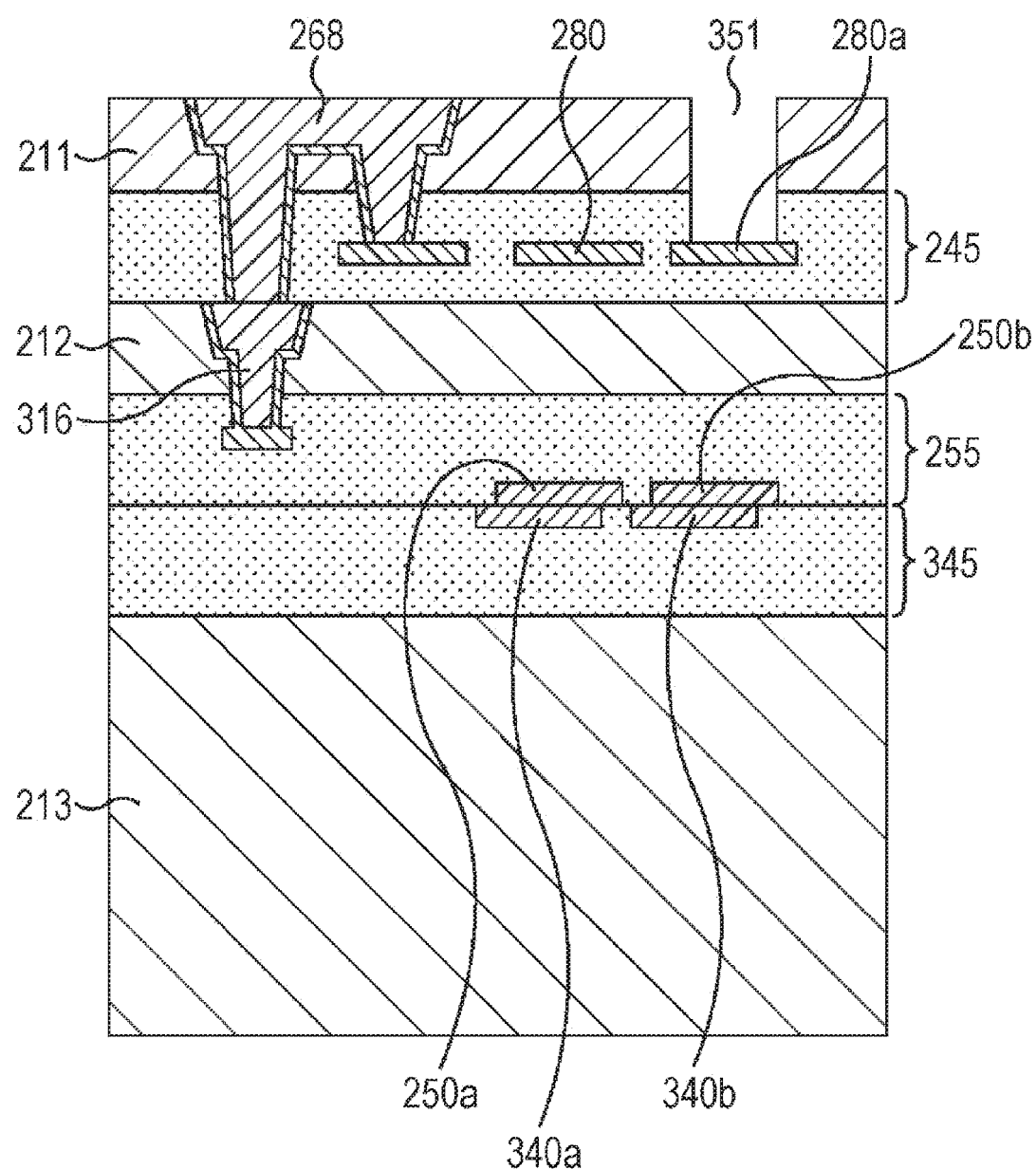
FIG. 40 is a diagram illustrating a manufacturing process of the solid-state imaging device shown in FIG. 35.

In addition, as shown in FIG. 40, the pad hole 351 is formed so as to reach the aluminum pad 280a from the light receiving surface of the first semiconductor substrate 211.

In this way, the solid-state imaging device described with reference to FIG. 35 is manufactured. In the configuration shown in FIG. 35, as described above, the contact 268 and the contact 316 are used as an electrical connection between the first semiconductor substrate 211 and the second semiconductor substrate 212. In other words, a conductor forming the contact 268 is bonded to a conductor forming the contact 316 at the bonding surface between the first semiconductor substrate 211 and the second semiconductor substrate 212. As above, in a case of the configuration shown in FIG. 35, a part of the twin contact for an electrical connection between the first semiconductor substrate 211 and the second semiconductor substrate 212 is formed in two divided steps.

In this way, it is unnecessary to provide a deep hole which reaches the multilayer wire layer 255 from the light receiving surface, for example, unlike in forming the contact 267 of FIG. 29. For this reason, it is possible to more simply form a contact.

Although the description has been provided here of a case where a part of the twin contact used for an electrical connection between the first semiconductor substrate 211 and the second semiconductor substrate 212 is formed in two divided steps, a part of a twin contact used for an electrical connection between the second semiconductor substrate 212 and the third semiconductor substrate 213 may be formed in two divided steps.

In addition, similarly, in the solid-state imaging device with the configuration described with reference to FIG. 11, 12 or 20, a part of a twin contact, used for an electrical connection between the first semiconductor substrate 211 and the second semiconductor substrate 212, or electrical connection between the second semiconductor substrate 212 and the third semiconductor substrate 213, may be formed in two divided steps.

In other words, in the configuration (FIG. 11) in which the aluminum pad 280 is provided in the multilayer wire layer 245 of the first semiconductor substrate 211, a part of a twin contact used for an electrical connected between the respective semiconductor substrates may be formed in two divided steps. In addition, in the configuration (FIG. 12) in which the aluminum pad 280 is provided in the multilayer wire layer 255 of the second semiconductor substrate 212, a part of a twin contact used for an electrical connected between the respective semiconductor substrates may be formed in two divided steps. Further, in the configuration (FIG. 20) in which the aluminum pad 280 is provided in the insulating film layer 230, a part of a twin contact used for an electrical connected between the respective semiconductor substrates may be formed in two divided steps.

As described with reference to FIGS. 11 to 40, in the solid-state imaging device to which the present technology is applied, the aluminum pad 280 may be provided in the multilayer wire layer 245 of the first semiconductor substrate 211, the aluminum pad 280 may be provided in the multilayer wire layer 255 of the second semiconductor substrate 212, and the aluminum pad 280 may be provided in the insulating film layer 230. In addition, as a form of electrical connection between the respective semiconductor substrates, a twin contact, a shared contact, direct bonding, and a configuration in which a part of a twin contact is formed in two divided steps may be employed.

In other words, combinations as shown in FIG. 41 may be employed as embodiments of the solid-state imaging device to which the present technology is applied.

In addition, in the above-described embodiments, the embodiments of the solid-state imaging device to which the present technology is applied have been described based on a three-layer stacked structure. However, the solid-state imaging device to which the present technology is applied may employ, for example, a four-layer structure in which a first semiconductor substrate, a second semiconductor substrate, a third semiconductor substrate, and a fourth semiconductor substrate are stacked.

Figure 42:
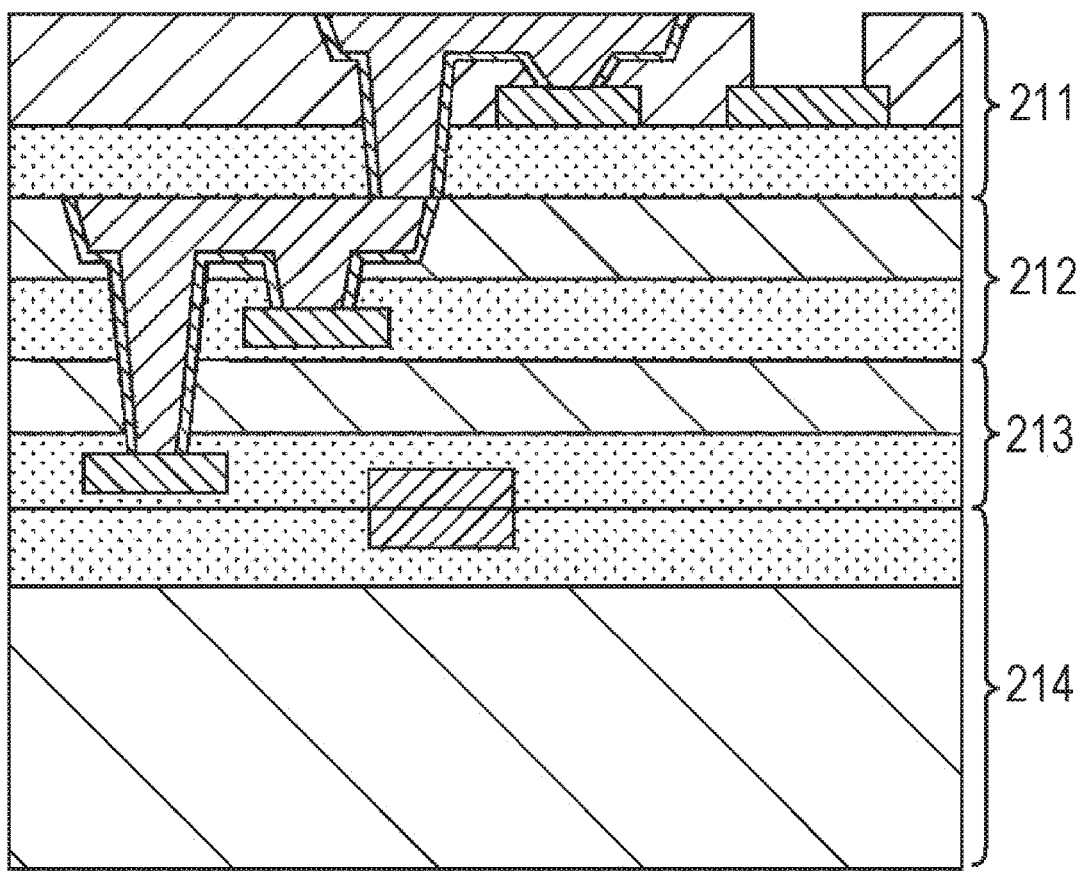
FIG. 42 is a schematic diagram of a cross-sectional view illustrating a configuration of a pixel portion of a solid-state imaging device to which the present technology is applied in a case of employing a four-layer structure.

FIG. 42 shows an example of a case where the solid-state imaging device to which the present technology is applied employs the four-layer structure. FIG. 42 is a schematic diagram of a cross-sectional view illustrating a configuration according to still another embodiment of the pixel portion of the solid-state imaging device to which the present technology is applied.

In the example shown in FIG. 42, a four-layer structure is employed in which a first semiconductor substrate 211, a second semiconductor substrate 212, a third semiconductor substrate 213, and a fourth semiconductor substrate 214 are stacked.

In addition, similarly, the solid-state imaging device to which the present technology is applied may employ a structure of five or more layers.

Figure 43:
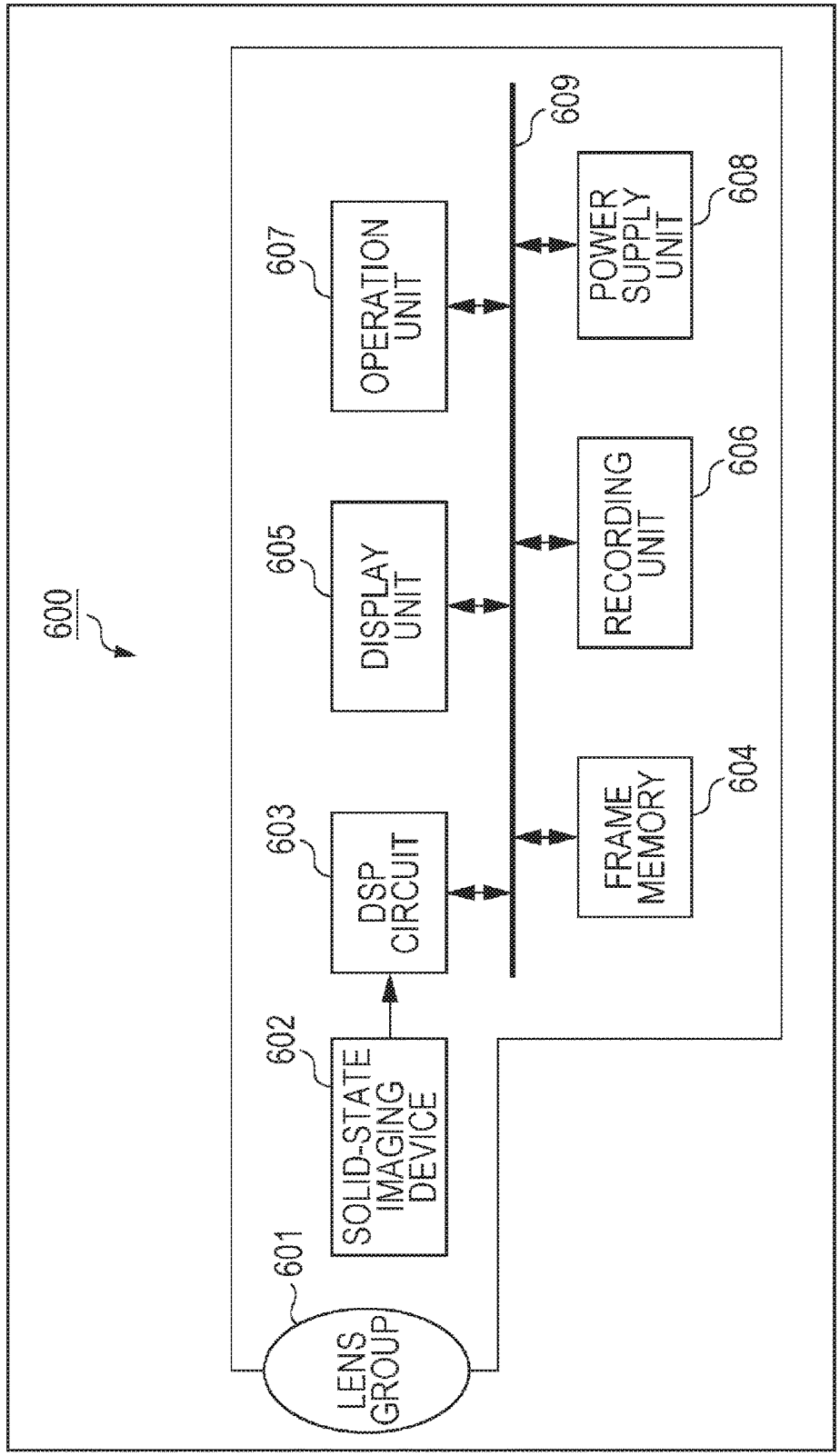
FIG. 43 is a block diagram illustrating a configuration example of an electronic apparatus to which the present technology is applied.

FIG. 43 is a block diagram illustrating a configuration example of a camera apparatus which is an electronic apparatus to which the present technology is applied.

A camera apparatus 600 in FIG. 43 includes an optical unit 601 including a lens group and the like, a solid-state imaging device (imaging device) 602 which employs the above-described respective configurations of the pixels 402, and a DSP circuit 603 which is a camera signal processing circuit. In addition, the camera apparatus 600 includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected to each other via a bus line 609.

The optical unit 601 receives incident light (image light) from a subject so as to be imaged on an imaging surface of the solid-state imaging device 602. The solid-state imaging device 602 converts a light amount of the incident light which is imaged on the imaging surface by the optical unit 601 into an electric signal in the unit of a pixel and outputs the electric signal as a pixel signal. The solid-state imaging device related to the above-described embodiments may be used as the solid-state imaging device 602.

The display unit 605 includes, for example, a panel type display device such as a liquid crystal panel or an organic electroluminescence (EL) panel, and displays moving images or still images captured by the solid-state imaging device 602. The recording unit 606 records moving images or still images captured by the solid-state imaging device 602 on a recording medium such as a video tape or a digital versatile disk (DVD).

The operation unit 607 issues operation commands for various functions of the camera apparatus 600 in response to an operation by a user. The power supply unit 608 appropriately supplies a variety of power which is operation power of the DSP circuit 603, the frame memory 604, the display unit 605, the recording unit 606, and the operation unit 607, to the supply targets.

In addition, the present technology is not limited to being applied to a solid-state imaging device which detects a distribution of an incident light amount of visible light so as to capture an image, and is generally applicable to a solid-state imaging device which detects a distribution of an incidence amount of infrared rays, X rays, particles, or the like so as to capture an image, or a solid-state imaging device (physical quantity distribution detection device) such as a fingerprint detection sensor which detects distributions of the other physical quantities such as a pressure or a capacitance so as to capture an image in a broad sense.

In addition, embodiments of the present technology are not limited to the above-described embodiments and may have various modifications within the scope without departing from the spirit of the present technology.

Further, the present technology may have the following configurations.

(1)

A solid-state imaging device including a first semiconductor substrate that includes a sensor circuit provided with a photoelectric conversion portion; and a second semiconductor substrate and a third semiconductor substrate that respectively include circuits different from the sensor circuit, wherein the first semiconductor substrate is located in the uppermost layer, and the first semiconductor substrate, the second semiconductor substrate, and the third semiconductor substrate are stacked in three layers, and wherein an electrode metal element forming an electrode for external connection is disposed in the first semiconductor substrate.

(2)

The solid-state imaging device according to (1), wherein the sensor circuit of the first semiconductor substrate is of a rear surface irradiation type, and wherein a hole exposing the electrode metal element is opened from a light receiving surface side of the first semiconductor substrate.

(3)

The solid-state imaging device according to (1) or (2), wherein the second semiconductor substrate or the third semiconductor substrate includes a logical circuit or a memory circuit, and wherein the logical circuit or the memory circuit is operated based on input and output of signals to and from an external device.

(4)

The solid-state imaging device according to any one of (1) to (3), wherein a light blocking mechanism which blocks light incident to the photoelectric conversion portion from an opposite side to a light receiving surface of the first semiconductor substrate is provided in at least one of the first semiconductor substrate and the second semiconductor substrate.

(5)

The solid-state imaging device according to (4), wherein the light blocking mechanism is formed by the electrode metal element.

(6)

The solid-state imaging device according to (4), wherein a wire metal element used for a wire of the second semiconductor substrate is disposed in the second semiconductor substrate, and wherein the light blocking mechanism is formed by the electrode metal element and the wire metal element.

(7)

The solid-state imaging device according to (4), wherein the light blocking mechanism is formed by a light blocking body disposed in the second semiconductor substrate.

(8)

The solid-state imaging device according to (1), wherein a wire metal element used for a wire of the first semiconductor substrate is further disposed in the first semiconductor substrate, and wherein the electrode metal element is disposed at a position closer to an adhesive surface with the second semiconductor substrate than the wire metal element.

(9)

The solid-state imaging device according to any one of (1) to (8), wherein a contact, which penetrates through the first semiconductor substrate or the second semiconductor substrate and reaches a metal wire layer of the second semiconductor substrate or the third semiconductor substrate, a part of which reaches a wire of a wire metal layer of the first semiconductor substrate or the second semiconductor substrate, is used for electrical connection between the first semiconductor substrate and the second semiconductor substrate or electrical connection between the second semiconductor substrate and the third semiconductor substrate.

(10)

The solid-state imaging device according to any one of (1) to (8), wherein a part of a contact used for electrical connection between the first semiconductor substrate and the second semiconductor substrate or electrical connection between the second semiconductor substrate and the third semiconductor substrate is formed by connecting conductors to each other at a bonding surface between the first semiconductor substrate and the second semiconductor substrate or a bonding surface between the second semiconductor substrate and the third semiconductor substrate.

(11)

The solid-state imaging device according to any one of (1) to (8), wherein wires exposed to a bonding surface between the first semiconductor substrate or the second semiconductor substrate and the second semiconductor substrate or the third semiconductor substrate are bonded to each other such that the first semiconductor substrate is electrically connected to the second semiconductor substrate.

(12)

The solid-state imaging device according to (1), wherein the first semiconductor substrate and the second semiconductor substrate are stacked such that a metal wire layer of the second semiconductor substrate comes into contact with the first semiconductor substrate, and wherein an electrode metal element forming an electrode for external connection is disposed inside a metal wire layer of the second semiconductor substrate.

(13)

The solid-state imaging device according to (1), wherein an insulating film layer is formed between the first semiconductor substrate and the second semiconductor substrate, wherein the first semiconductor substrate and the second semiconductor substrate are stacked such that a metal wire layer of the second semiconductor substrate comes into contact with the insulating film layer, and wherein an electrode metal element forming an electrode for external connection is disposed inside the insulating film layer.

(14)

An electronic apparatus including a solid-state imaging device having a first semiconductor substrate that includes a sensor circuit provided with a photoelectric conversion portion; and a second semiconductor substrate and a third semiconductor substrate that respectively include circuits different from the sensor circuit, wherein the first semiconductor substrate is located in the uppermost layer, and the first semiconductor substrate, the second semiconductor substrate, and the third semiconductor substrate are stacked in three layers, and wherein an electrode metal element forming an electrode for external connection is disposed in the first semiconductor substrate.

<1>

A semiconductor device comprising:

a first semiconductor section including a first wiring layer at one side thereof, the first semiconductor section further including a photodiode;

a second semiconductor section including a second wiring layer at one side thereof, the first and second semiconductor sections being secured together;

a third semiconductor section including a third wiring layer at one side thereof, the second and the third semiconductor sections being secured together such the first semiconductor section, second semiconductor section, and the third semiconductor section are stacked together; and a first conductive material electrically connecting at least two of (i) the first wiring layer, (ii) the second wiring layer, and (iii) the third wiring layer such that the electrically connected wiring layers are in electrical communication.

<2>

The semiconductor device of <1>, wherein the first semiconductor section, the second semiconductor section, and the third semiconductor section are stacked together in a manner such that the first wiring layer faces the second wiring layer or the second wiring layer faces the third wiring layer.

<3>

The semiconductor device of <2>, further comprising: a second conductive material electrically connecting at least two of (i) the first wiring layer, (ii) the second wiring layer, and (iii) the third wiring layer such that the electrically connected wiring layers are in electrical communication.

<4>

The semiconductor device of <3>, wherein at least one wiring layer electrically connected by the second conductive material is different than the wiring layers electrically connected by the first conductive material.

<5>

The semiconductor device of <3> or <4>, wherein at least one of the first conductive material and the second conductive material comprises two through holes which penetrate through at least one of the first semiconductor section and the second semiconductor section in a vertical direction; and wherein a first through hole of the first conductive material electrically connects to a wiring layer that is different than a wiring layer electrically connected by a second of the two through holes.

<6>

The semiconductor device of <3> or <4> wherein at least one of the first conductive material and the second conductive material comprises a single through hole which penetrates through at least one of the first semiconductor section and the second semiconductor section in a vertical direction such that the at least one of the first conductive material and the second conductive material electrically contact at least two wiring layers.

<7>

The semiconductor device of any one of <1> to <6>, wherein a metal wire of at least one of (i) the first wiring layer, (ii) the second wiring layer, and (ii) the third wiring layer is directly bonded to a metal wire in another wiring layer.

<8>

The semiconductor device of <7>, wherein at least one of the wiring layers having a metal wire directly bonded is different than the wiring layers electrically connected by the first conductive material.

<9>

The semiconductor device of any one of <1> to <8>, further comprising a pad electrode for external connection.

<10>

The semiconductor device of <9>, wherein the pad is disposed such that light is blocked from one or more transistors residing in the second semiconductor section.

<11>

The semiconductor device of any one of <1> to <10>, wherein the first semiconductor section comprises a sensor circuit, at least one of the second semiconductor section and the third semiconductor section comprises a logical circuit, and at least one of the second semiconductor section and the third semiconductor section comprises a memory circuit.

<12>

A backside illumination type solid-state imaging device comprising:

a first semiconductor section including a first wiring layer at one side thereof, the first semiconductor section further including a circuit region and a pixel region;

a second semiconductor section including a second wiring layer at one side thereof, the first and second semiconductor sections being secured together;

a third semiconductor section including a third wiring layer at one side thereof, the second and the third semiconductor sections being secured together such the first semiconductor section, second semiconductor section, and the third semiconductor section are stacked together; and a first conductive material electrically connecting at least two of (i) the first wiring layer, (ii) the second wiring layer, and (iii) the third wiring layer such that the electrically connected wiring layers are in electrical communication.

<13>

The solid-state imaging device of <12>, wherein the first semiconductor section, the second semiconductor section, and the third semiconductor section are stacked together in a manner such that the first wiring layer faces the second wiring layer or the second wiring layer faces the third wiring layer.

<14>

The solid-state imaging device of <13>, further comprising: a second conductive material electrically connecting at least two of (i) the first wiring layer, (ii) the second wiring layer, and (iii) the third wiring layer such that the electrically connected wiring layers are in electrical communication.

<15>

The solid-state imaging device of <14>, wherein at least one of the first conductive material and the second conductive material comprises a single through hole which penetrates through at least one of the first semiconductor section and the second semiconductor section in a vertical direction such that the at least one of the first conductive material and the second conductive material electrically contact at least two wiring layers.

<16>

The solid-state imaging device of any one of <12> to <15>, wherein a metal wire of at least one of (i) the first wiring layer, (ii) the second wiring layer, and (ii) the third wiring layer is directly bonded to a metal wire in another wiring layer.

<17>

The solid-state imaging device of any one of <12> to <16>, wherein at least one of the wiring layers having a metal wire directly bonded is different than the wiring layers electrically connected by the first conductive material.

<18>

The solid-state imaging device of any one of <12> to <17>, further comprising a pad electrode for external connection, wherein the pad is disposed below the pixel region such that light is blocked from one or more transistors residing in the second semiconductor section.

<19>

The solid-state imaging device of any one of <12> to <18>, further comprising an interlayer insulating film disposed between at least two of the semiconductor sections.

<20>

The solid-state imaging device of any one of <12> to <19>, wherein the first semiconductor section comprises a sensor circuit, at least one of the second semiconductor section and the third semiconductor section comprises a logical circuit, and at least one of the second semiconductor section and the third semiconductor section comprises a memory circuit.

<21>

An electronic apparatus including:

an optical unit; and (a) a solid-state imaging device including: a first semiconductor section including a first wiring layer at one side thereof, the first semiconductor section further including a circuit region and a pixel region;

a second semiconductor section including a second wiring layer at one side thereof, the first and second semiconductor sections being secured together;

(b) a third semiconductor section including a third wiring layer at one side thereof, the second and the third semiconductor sections being secured together such the first semiconductor section, second semiconductor section, and the third semiconductor section are stacked together; and (c) a first conductive material electrically connecting at least two of (i) the first wiring layer, (ii) the second wiring layer, and (iii) the third wiring layer such that the electrically connected wiring layers are in electrical communication.

<22>

The electronic apparatus of <21>, wherein the first semiconductor section, the second semiconductor section, and the third semiconductor section are stacked together in a manner such that the first wiring layer faces the second wiring layer or the second wiring layer faces the third wiring layer.

<23>

The electronic apparatus of <22>, further comprising: a second conductive material electrically connecting at least two of (i) the first wiring layer, (ii) the second wiring layer, and (iii) the third wiring layer such that the electrically connected wiring layers are in electrical communication, wherein at least one wiring layer electrically connected by the second conductive material is different than the wiring layers electrically connected by the first conductive material.

<24>

The electronic apparatus of <23>, wherein at least one of the first conductive material and the second conductive material comprises two through holes which penetrate through at least one of the first semiconductor section and the second semiconductor section in a vertical direction; and wherein a first through hole of the first conductive material electrically connects to a wiring layer that is different than a wiring layer electrically connected by a second of the two through holes.

<25>

The electronic apparatus of <23>, wherein at least one of the first conductive material and the second conductive material comprises a single through hole which penetrates through at least one of the first semiconductor section and the second semiconductor section in a vertical direction such that the at least one of the first conductive material and the second conductive material electrically contact at least two wiring layers.

<26>

The electronic apparatus of <23>, wherein a metal wire of at least one of (i) the first wiring layer, (ii) the second wiring layer, and (ii) the third wiring layer is directly bonded to a metal wire in another wiring layer, and wherein at least one of the wiring layers having a metal wire directly bonded is different than the wiring layers electrically connected by the first conductive material.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

211 First semiconductor substrate
212 Second semiconductor substrate
213 Third semiconductor substrate
230 Insulating film layer
234 Photodiode
240 Copper wire
245 Multilayer wire layer
250 Copper wire
255 Multilayer wire layer
265 Contact
266 Contact
267 Contact
280 Aluminum pad
311 Contact
312 Contact
313 Contact
320 Aluminum pad
330 Aluminum pad
340 Copper wire
345 Multilayer wire layer
351 Pad hole
360 Light blocking body
370 Copper wire
401 Solid-state imaging device
402 Pixel
600 Camera apparatus
602 Solid-state imaging device

What is claimed:

1. An imaging device comprising:
a first semiconductor section including a first wiring layer at a first side thereof, the first semiconductor section including a photodiode at a second side opposite to the first side of the first semiconductor section, at least a transfer transistor, a reset transistor, and an amplification transistor;
a second semiconductor section including a second wiring layer at a first side thereof and a plurality of transistors, the first and second semiconductor sections being secured together;
a third semiconductor section including a third wiring layer at one side thereof, the second and the third semiconductor sections being secured together; and
a first conductor electrically coupled to the first wiring layer in the first semiconductor section and a second conductor in the second semiconductor section, wherein a portion of the second conductor extends in a direction parallel to the first side of the second semiconductor section,
wherein,
the second conductor is electrically coupled to the second wiring layer in the second semiconductor section and the third wiring layer in the third semiconductor section,
the portion of the second conductor is disposed at a second side of the second semiconductor section opposite to the first side of the second semiconductor section, and
the plurality of transistors is disposed between the portion of the second conductor and a wiring of the second wiring layer in the second semiconductor section in a vertical direction.

2. The imaging device according to claim 1, wherein the first conductor is embedded in two through-holes, each through-hole of the two through-holes being disposed in the first semiconductor section.

3. The imaging device according to claim 2, wherein the first conductor in both through-holes is connected to each other at a light-receiving surface side of the first semiconductor section.

4. The imaging device according to claim 3, wherein at least one of the two through-holes penetrates through the first semiconductor section and an adhesive layer between the first wiring layer and the second semiconductor section.

5. The imaging device according to claim 4, further comprising:
a pad hole formed in the first semiconductor section and reaching a pad from the light-receiving surface side of the first semiconductor section.

6. The imaging device according to claim 5, wherein the pad is formed in the first wiring layer of the first semiconductor section.

7. The imaging device according to claim 4, further comprising:
an insulating film layer between the first semiconductor section and the second semiconductor section.

8. The imaging device according to claim 7, wherein a pad is disposed in the insulating film layer.

9. The imaging device according to claim 4, wherein the second wiring layer and the third wiring layer face each other.

10. The imaging device according to claim 9, wherein two through-holes are disposed in the second semiconductor section in the vertical direction, and wherein the second conductor in both through-holes is connected to each other at an interlayer film of the second semiconductor section.

11. The imaging device according to claim 10, wherein the interlayer film is an uppermost layer of the second semiconductor section.

12. The imaging device according to claim 11, wherein one of the two through-holes disposed in the second semiconductor section reaches the third wiring layer of the third semiconductor section from an upper surface of the second semiconductor section.

13. The imaging device according to claim 12, wherein the one of the two through-holes disposed in the second semiconductor section penetrates the second semiconductor section and the second wiring layer.

14. The imaging device according to claim 1, further comprising:
a light-blocking film formed on a surface of the first semiconductor section.

15. The imaging device according to claim 1, further comprising:
on-chip color filters corresponding to photodiodes of a plurality of photodiodes.

16. The imaging device according to claim 15 comprising:
a plurality of on-chip micro lenses formed above the plurality of respective on-chip color filters.

17. The imaging device according to claim 1, wherein two through-holes are disposed in the second semiconductor section in the vertical direction, and wherein the second conductor in both through-holes is connected at an interlayer film of the second semiconductor section.

18. The imaging device according to claim 17, wherein the interlayer film is an uppermost layer of the second semiconductor section.

19. The imaging device according to claim 17, wherein one of the two through-holes reaches the third wiring layer of the third semiconductor section from an upper surface of the second semiconductor section.

20. The imaging device according to claim 19, wherein the one of the two through-holes penetrates the second semiconductor section and the second wiring layer and reaches a pad of the third semiconductor section.

21. The imaging device according to claim 1, wherein the third wiring layer and the second wiring layer face each other.

22. The imaging device according to claim 1, further comprising a pad electrode for external connection.

23. The imaging device according to claim 22, wherein the pad electrode is disposed such that light is blocked from one or more transistors residing in the second semiconductor section.

24. The imaging device according to claim 1, wherein the first semiconductor section includes a sensor circuit, at least one of the second semiconductor section or the third semiconductor section includes a logical circuit, and at least one of the second semiconductor section or the third semiconductor section includes a memory circuit.

25. The imaging device according to claim 1, further comprising:
a plurality of transistors in the third semiconductor section.

26. An electronic apparatus comprising:
an optical unit including at least one lens configured to receive incident light; and
an imaging device configured to receive the incident light, the imaging device including:
a first semiconductor section including a first wiring layer at a first side thereof, the first semiconductor section including a photodiode at a second side opposite to the first side of the first semiconductor section, at least a transfer transistor, a reset transistor, and an amplification transistor,
a second semiconductor section including a second wiring layer at a first side thereof and a plurality of transistors, the first and second semiconductor sections being secured together,
a third semiconductor section including a third wiring layer at one side thereof, the second and the third semiconductor sections being secured together, and
a first conductor electrically coupled to the first wiring layer in the first semiconductor section and a second conductor in the second semiconductor section, wherein a portion of the second conductor extends in a direction parallel to the first side of the second semiconductor section,
wherein,
the second conductor is electrically coupled to the second wiring layer in the second semiconductor section and the third wiring layer in the third semiconductor section,
the portion of the second conductor is disposed at a second side of the second semiconductor section opposite to the first side of the second semiconductor section, and
the plurality of transistors is disposed between the portion of the second conductor and a wiring of the second wiring layer in the second semiconductor section in a vertical direction.

* * * * *